United States Patent
Kim et al.

(10) Patent No.: US 12,520,724 B2
(45) Date of Patent: Jan. 6, 2026

(54) LIGHT EMITTING ELEMENT AND POLYCYCLIC COMPOUND FOR LIGHT EMITTING ELEMENT

(71) Applicants: Samsung Display Co., Ltd., Yongin-si (KR); Solus Advanced Materials co., Ltd., Iksan-si (KR)

(72) Inventors: Seulong Kim, Cheonan-si (KR); Jinwoong Kim, Yongin-si (KR); Hojun Son, Yongin-si (KR); Hajin Song, Hwaseong-si (KR); Hyobum Song, Yongin-si (KR); Jihwan Yoon, Yongin-si (KR); Jaehoon Hwang, Seoul (KR); Taehyung Kim, Yongin-si (KR); Hocheol Park, Yongin-si (KR); Minsik Eum, Yongin-si (KR); Jaehoon Lee, Yongin-si (KR)

(73) Assignees: SAMSUNG DISPLAY CO., LTD., Gyeonggi-Do (KR); SOLUS ADVANCED MATERIALS CO., LTD., Iksan-si (KR)

(*) Notice: Subject to any disclaimer, the term of this patent is extended or adjusted under 35 U.S.C. 154(b) by 890 days.

(21) Appl. No.: 17/691,267

(22) Filed: Mar. 10, 2022

(65) Prior Publication Data

US 2022/0328767 A1   Oct. 13, 2022

(30) Foreign Application Priority Data

Mar. 30, 2021  (KR) ........................ 10-2021-0041174

(51) Int. Cl.
*H01L 51/00*  (2006.01)
*C07D 471/04*  (2006.01)
(Continued)

(52) U.S. Cl.
CPC ....... *H10K 85/6572* (2023.02); *C07D 471/04* (2013.01); *C07F 9/6561* (2013.01);
(Continued)

(58) Field of Classification Search
None
See application file for complete search history.

(56) References Cited

U.S. PATENT DOCUMENTS 5,827,653 A   10/1998   Sammes et al.
9,871,206 B2   1/2018   Mizutani et al.
(Continued)

FOREIGN PATENT DOCUMENTS

EP   2896621   7/2015
EP   3831831   6/2021
(Continued)

OTHER PUBLICATIONS

Machine English translation of Matsuura et al. (JP 2004-071380 A). Apr. 29, 2025.*

(Continued)

*Primary Examiner* — Jay Yang
(74) *Attorney, Agent, or Firm* — CANTOR COLBURN LLP

(57) ABSTRACT

Provided is a polycyclic compound and a light emitting element including the polycyclic compound. The light emitting element includes a first electrode, a second electrode facing the first electrode, light emitting structures disposed between the first electrode and the second electrode, and a charge generation layer disposed between adjacent ones of the light emitting structures and including a polycyclic compound represented by Formula 1, thereby exhibiting high luminous efficiency.

(Continued)

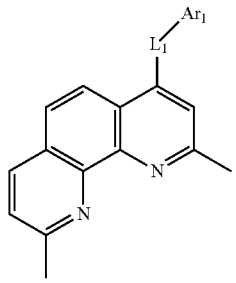

[Formula 1]

19 Claims, 5 Drawing Sheets

(51) Int. Cl.
*C07F 9/6561* (2006.01)
*C09K 11/06* (2006.01)
*H10K 85/60* (2023.01)
*H10K 50/19* (2023.01)

(52) U.S. Cl.
CPC ............ *C09K 11/06* (2013.01); *H10K 85/615* (2023.02); *H10K 85/622* (2023.02); *H10K 85/623* (2023.02); *H10K 85/624* (2023.02); *C09K 2211/1018* (2013.01); *H10K 50/19* (2023.02)

(56) References Cited

U.S. PATENT DOCUMENTS

| | | | |
|---|---|---|---|
| 2008/0111473 A1 | | 5/2008 | Kawamura et al. |
| 2016/0197289 A1 | | 7/2016 | Sado et al. |
| 2019/0181354 A1 | | 6/2019 | Shin et al. |
| 2021/0273192 A1 | | 9/2021 | Kim et al. |
| 2024/0116919 A1 | | 4/2024 | Son et al. |
| 2024/0315132 A1 | | 9/2024 | Son et al. |

FOREIGN PATENT DOCUMENTS

| | | | |
|---|---|---|---|
| EP | 3848991 | | 7/2021 |
| EP | 3866216 | | 8/2021 |
| JP | H09503660 A | | 4/1997 |
| JP | 2004-71380 | | 3/2004 |
| JP | 2004071380 A | * | 3/2004 |
| KR | 20140055968 A | | 5/2014 |
| KR | 20190053606 A | | 5/2019 |
| KR | 10-2052332 | | 12/2019 |
| KR | 10-2193824 | | 12/2020 |
| KR | 10-2206995 | | 1/2021 |
| KR | 10-2021-0069785 | | 6/2021 |
| KR | 10-2021-0103631 | | 8/2021 |
| KR | 20220003857 A | | 1/2022 |
| KR | 20220004251 A | | 1/2022 |
| KR | 10-2423258 | | 7/2022 |
| WO | 9508642 | | 3/1995 |
| WO | 2006067931 A1 | | 6/2006 |
| WO | 2014042163 A1 | | 3/2014 |
| WO | 2022005247 | | 1/2022 |
| WO | 2022005249 | | 1/2022 |
| WO | 2022005251 | | 1/2022 |

OTHER PUBLICATIONS

Mitsunobu Matsuura et al., "Organic electroluminescent device and display".
Peter George Sammes et al., "Nucleic acid detection using detection of target sequence duplex with oligonucleotide probe via sensitizing ligand energy transfer to lanthanide ion and delayed luminescence".
Stephen T. Mullins et al., "Preparation of some new intercalating europium(III) sensitizers", J. Chem. Soc., Jan. 1, 1996, pp. 75-81, No. 1.
John Coates et al., "Enhancement of luminescence of europium(III) ions in water by use of synergistic chelation. Par 1. 1:1 and 2:1 complexes", J. Chem. Soc., Jan. 1, 1996, pp. 1275-1282.
Kelley A. Meadows et al., "A Monophenyl Phenanthroline complex of Copper(I) That Binds to DNA but Not by Intercalation", Apr. 1, 1993, pp. 4663-4666, vol. 32, No. 21.
Seulong Kim et al., "Nitrogen-containing heterocyclic organic compounds having low LUMO properties for use in an OLED as an electron transport layer".
Seulong Kim et al., "Organic light-emitting device comprising quantum dots, and apparatus including the same".
Dongchan Kim et al., "LED with electron transport compound, metals and alloys, manufacture and use".
Hojun Son et al., "Preparation of phenanthroline derivative for organic electroluminescent device".
Hojun Son et al., "Preparation of 1, 10-phenanthroline derivatives as organic electroluminescent device materials".
Extended European Search Report corresponding to European Application No./Patent No. 22165181.3 dated Sep. 9, 2022.
Perrin, David M., et al. "Inhibitors of *Escherichia coli* RNA polymerase specific for the single-stranded DNA of transcription intermediates. Tetrahedral cuprous chelates of 1, 10-phenanthrolines." Biochemistry 35.16 (1996): 5318-5326.

* cited by examiner

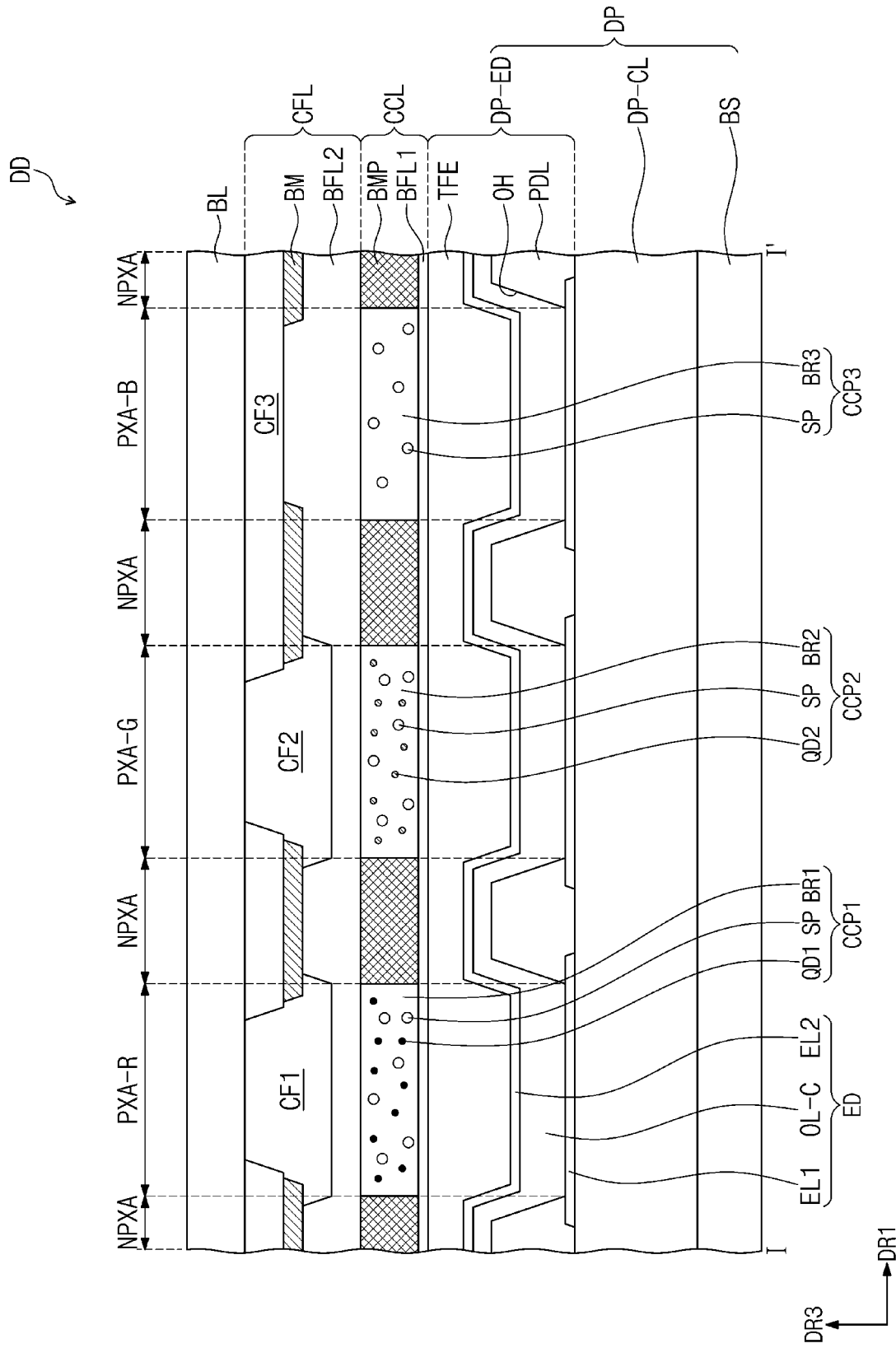

LIGHT EMITTING ELEMENT AND POLYCYCLIC COMPOUND FOR LIGHT EMITTING ELEMENT

CROSS-REFERENCE TO RELATED APPLICATION(S)

This application claims priority to and benefits of Korean Patent Application No. 10-2021-0041174 under 35 U.S.C. § 119, filed on Mar. 30, 2021 in the Korean Intellectual Property Office, the entire contents of which are incorporated herein by reference.

BACKGROUND

1. Technical Field

The disclosure relates to a light emitting element including a polycyclic compound in a charge generation layer, and a polycyclic compound used in the charge generation layer.

2. Description of the Related Art

Active development continues for organic electroluminescence displays as image display devices. In comparison to liquid crystal displays, organic electroluminescence displays are so-called self-luminescent display devices in which holes and electrons injected from a first electrode and a second electrode recombine in an emission layer, whereby a luminescent material including an organic compound in the emission layer emits light to implement display.

In the application of light emitting elements to display devices, there is a demand for light emitting elements to have a low driving voltage, high luminous efficiency, and a long life, and continuous development is needed for materials for light emitting elements which are capable of stably attaining such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element having high luminous efficiency, and a polycyclic compound used therein.

An embodiment provides a light emitting element, which may include a first electrode, a second electrode facing the first electrode, light emitting structures disposed between the first electrode and the second electrode, and a charge generation layer disposed between adjacent ones of the light emitting structures and including a polycyclic compound represented by Formula 1.

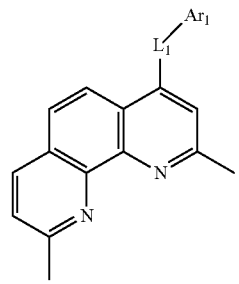

[Formula 1]

In Formula 1, $L_1$ may be a direct linkage, a substituted or unsubstituted arylene group having 6 to 60 ring-forming carbon atoms, or a substituted or unsubstituted heteroarylene group having 5 to 60 ring-forming carbon atoms, and $Ar_1$ may be a substituted or unsubstituted aryl group having 6 to 60 ring-forming carbon atoms, excluding anthracene.

In an embodiment, in Formula 1, $L_1$ may be a substituted or unsubstituted divalent phenyl group, or a substituted or unsubstituted divalent biphenyl group.

In an embodiment, in Formula 1, $L_1$ may be a group represented by Formula 2.

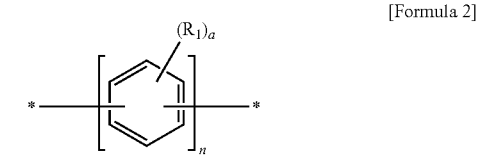

[Formula 2]

In Formula 2, n may be 1 or 2, a may be an integer from 0 to 4, and $R_1$ may be a substituted or unsubstituted aryl group having 6 to 60 ring-forming carbon atoms.

In an embodiment, the group represented by Formula 2 may be represented by any one of Formulas 2A-1 to 2A-4.

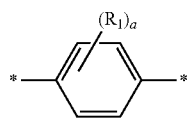

[Formula 2A-1]

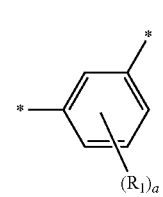

[Formula 2A-2]

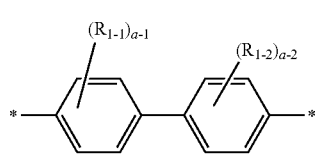

[Formula 2A-3]

[Formula 2A-4]

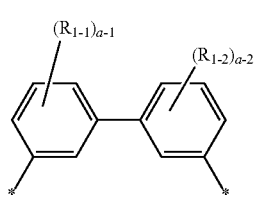

In Formulas 2A-3 and 2A-4, a-1 and a-2 may each independently be an integer from 0 to 4, and $R_{1-1}$ and $R_{1-2}$ may each independently be a substituted or unsubstituted aryl group having 6 to 60 ring-forming carbon atoms, and wherein in Formulas 2A-1 and 2A-2, $R_1$ and a may each be the same as defined in connection with Formula 2.

In an embodiment, in Formula 1, $Ar_1$ may be a substituted or unsubstituted phenyl group, a substituted or unsubstituted naphthyl group, a substituted or unsubstituted perylene group, a substituted or unsubstituted triphenylene group, a substituted or unsubstituted fluoranthene group, a substituted or unsubstituted benzo[C]fluorene group, or a substituted or unsubstituted pyrene group.

In an embodiment, in Formula 1, $Ar_1$ may be a group represented by Formula 3.

[Formula 3]

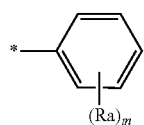

In Formula 3, m may be an integer from 0 to 5, Ra may be a substituted or unsubstituted alkyl group having 1 to 20 carbon atoms, a substituted or unsubstituted alkenyl group having 2 to 20 carbon atoms, a substituted or unsubstituted phosphine oxide group, a substituted or unsubstituted aryl group having 6 to 16 carbon atoms, or may be bonded to an adjacent group to form a ring, and the group represented by Formula 3 may not be anthracene.

In an embodiment, in Formula 1, $Ar_1$ may be a group represented by any one selected from Formulas S1 to S19.

S1

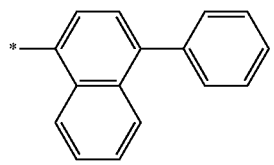

S2

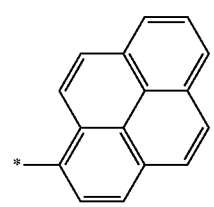

S3

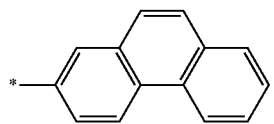

S4

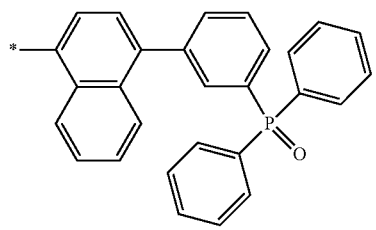

S5

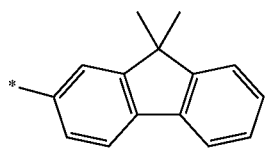

S6

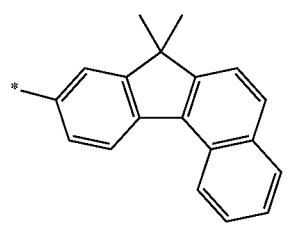

S7

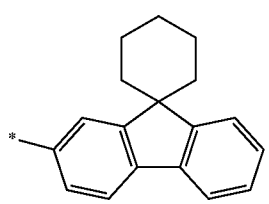

S8

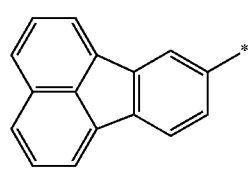

S9

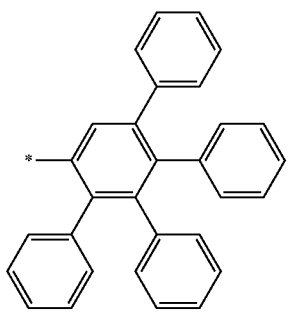

S10

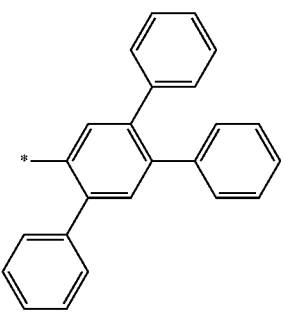

S11

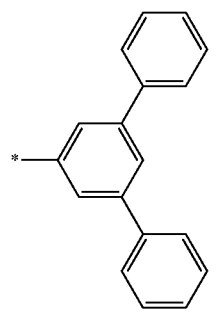

S12

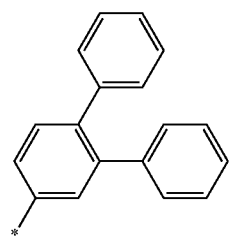

S13

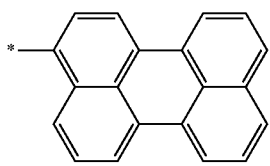

S14

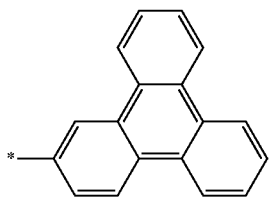

S15

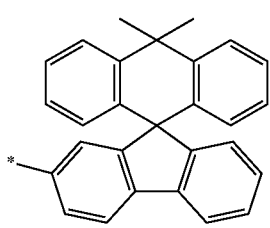

S16

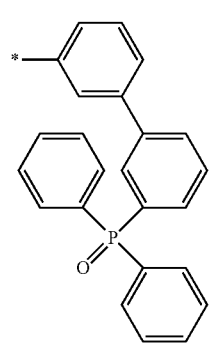

S17

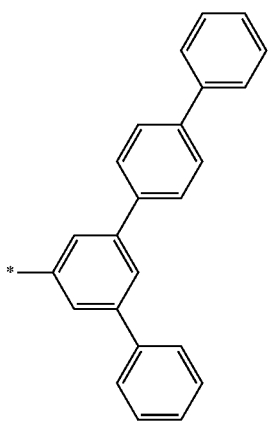

S18

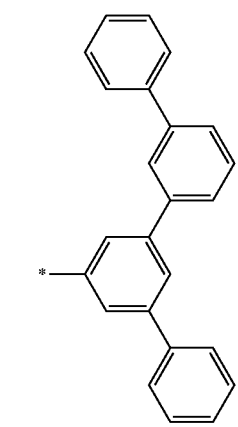

S19

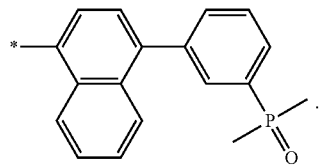

In an embodiment, the charge generation layer may include an n-type charge generation layer, and a p-type charge generation layer disposed on the n-type charge generation layer, and the n-type charge generation layer may include the polycyclic compound.

In an embodiment, the n-type charge generation layer may include a dopant and a host, and the host may include the polycyclic compound.

In an embodiment, each of the light emitting structures may include a hole transport region, an emission layer disposed on the hole transport region, and an electron transport region disposed on the emission layer.

In an embodiment, at least one of the light emitting structures may include an emission layer emitting blue light.

In an embodiment, the emission layer emitting blue light may include 4,4'-bis(N-carbazolyl)-1,1-biphenyl.

Another embodiment provides a polycyclic compound represented by Formula 1.

[Formula 1]

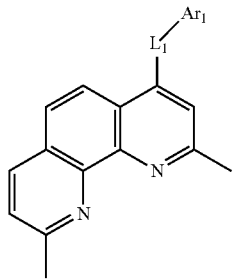

In Formula 1, $L_1$ may be a direct linkage, a substituted or unsubstituted arylene group having 6 to 60 ring-forming carbon atoms, or a substituted or unsubstituted heteroarylene group having 5 to 60 ring-forming carbon atoms, and $Ar_1$ may be a substituted or unsubstituted aryl group having 6 to 60 ring-forming carbon atoms, excluding anthracene.

In an embodiment, in Formula 1, $L_1$ may be a substituted or unsubstituted divalent phenyl group, or a substituted or unsubstituted divalent biphenyl group.

In an embodiment, in Formula 1, $L_1$ may be a group represented by Formula 2.

[Formula 2]

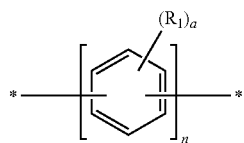

In Formula 2, n may be 1 or 2, a may be an integer from 0 to 4, and $R_1$ may be a substituted or unsubstituted aryl group having 6 to 60 ring-forming carbon atoms.

In an embodiment, the group represented by Formula 2 may be represented by any one of Formulas 2A-1 to 2A-4.

[Formula 2A-1]

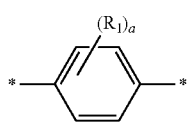

[Formula 2A-2]

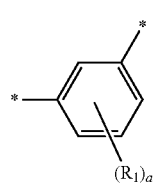

[Formula 2A-3]

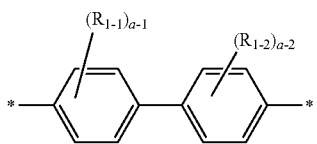

[Formula 2A-4]

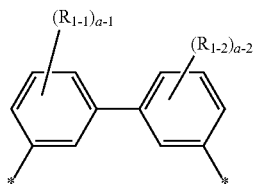

In Formulas 2A-3 and 2A-4, a-1 and a-2 may each independently be an integer from 0 to 4, and $R_{1-1}$ and $R_{1-2}$ may each independently be a substituted or unsubstituted aryl group having 6 to 60 ring-forming carbon atoms, and in Formulas 2A-1 and 2A-2, $R_1$ and a may each be the same as defined in connection with Formula 2.

In an embodiment, in Formula 1, $Ar_1$ may be a substituted or unsubstituted phenyl group, a substituted or unsubstituted naphthyl group, a substituted or unsubstituted perylene group, a substituted or unsubstituted triphenylene group, a substituted or unsubstituted fluoranthene group, a substituted or unsubstituted benzo[C]fluorene group, or a substituted or unsubstituted pyrene group.

In an embodiment, in Formula 1, $Ar_1$ may be a group represented by Formula 3.

[Formula 3]

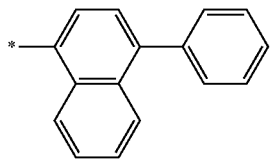

In Formula 3, m may be an integer from 0 to 5, Ra is a substituted or unsubstituted alkyl group having 1 to 20 carbon atoms, an alkylene group having 2 to 20 carbon atoms, a substituted or unsubstituted phosphine oxide group, a substituted or unsubstituted aryl group having 6 to 16 carbon atoms, or may be bonded to an adjacent group to form a ring, and the group represented by Formula 3 may not be anthracene.

In an embodiment, in Formula 1, $Ar_1$ may be a group represented by any one selected from Formulas S1 to S19.

S1

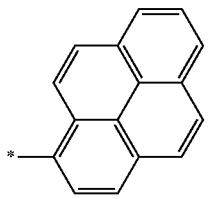

S2

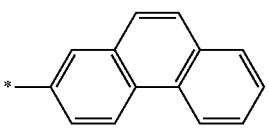

S3

S4
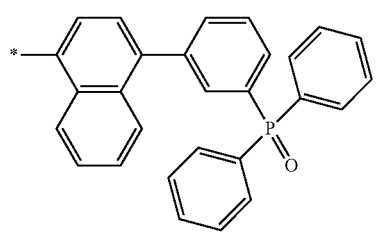
S5
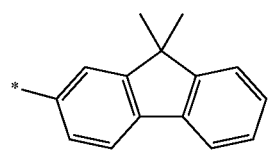
S6
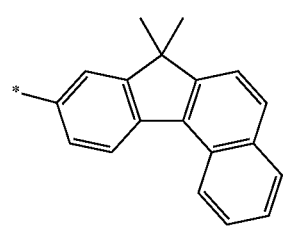
S7
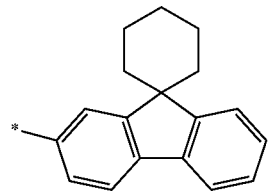
S8
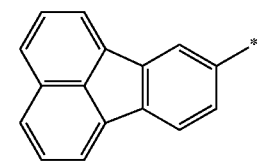
S9
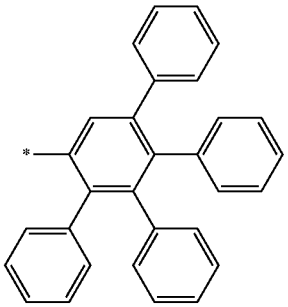
S10
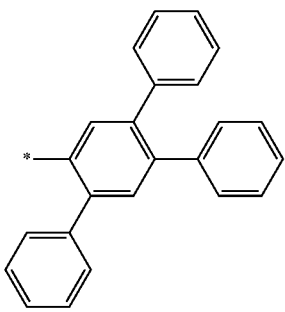
S11
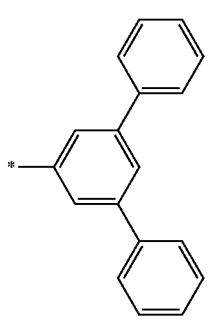
S12
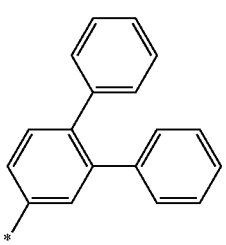
S13
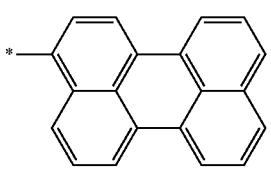
S14
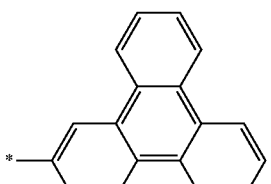
S15
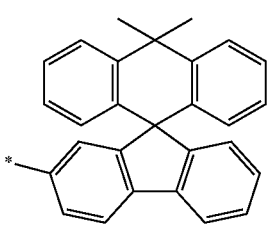
S16
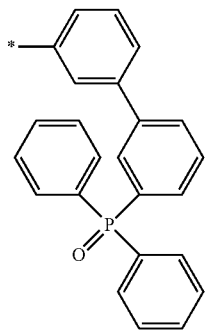

-continued

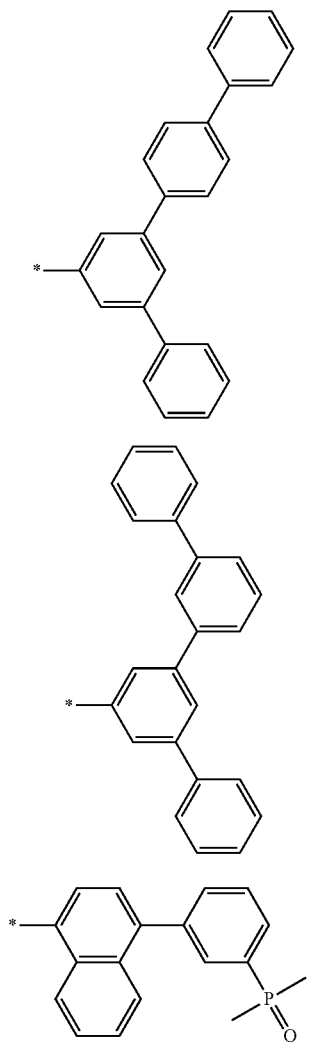

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which:

FIG. 5 is a schematic cross-sectional view of a display device according to an embodiment.

DETAILED DESCRIPTION OF THE EMBODIMENTS

Figure 1:
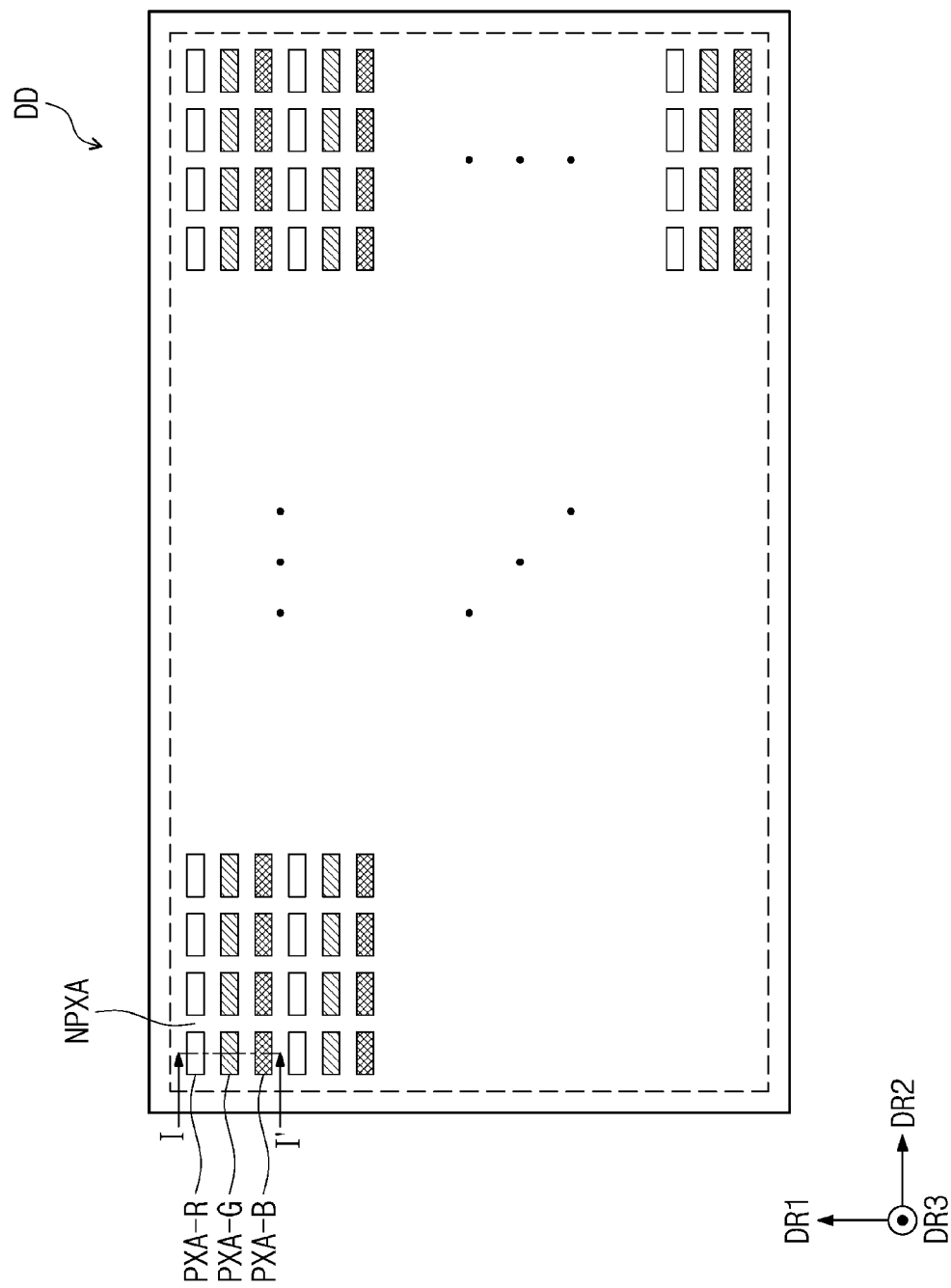
FIG. 1 is a plan view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group or as a phenyl group substituted with a phenyl group.

In the description, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each be monocyclic or polycyclic. Rings which are formed by groups being bonded to each other may be connected to another ring to form a spiro structure.

In the description, the term "adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". For example, two methyl groups in 4,5-dimethylphenanthrene may be interpreted as mutually "adjacent groups".

In the description, examples of a halogen atom may include a fluorine atom, a chlorine atom, a bromine atom, and an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, a hydrocarbon ring group may be any functional group or substituent derived from an aliphatic hydrocarbon ring. The hydrocarbon ring group may be a saturated hydrocarbon ring group having 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the description, a fluorenyl group may be substituted, and two substituents may be bonded to each other to form a spiro structure. Examples of substituted fluorenyl groups are as follows. However, embodiments are not limited thereto.

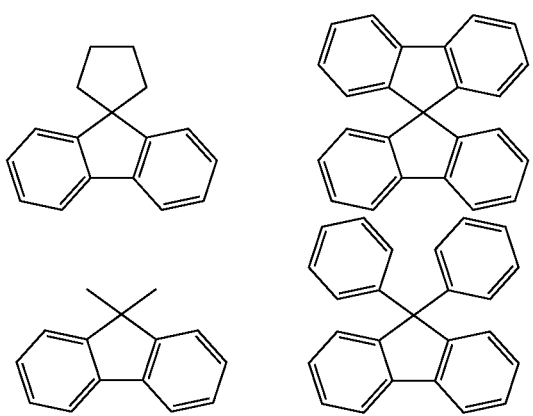

In the description, a heterocyclic group may be any functional group or substituent derived from a ring containing at least one of B, O, N, P, Si, or S as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may each be monocyclic or polycyclic.

In the description, a heterocyclic group may contain at least one of B, O, N, P, Si, or S as a heteroatom. When the heterocyclic group contains two or more heteroatoms, the two or more heteroatoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 30, 2 to 20, or 2 to 10.

In the description, an aliphatic heterocyclic group may contain at least one of B, O, N, P, Si, or S as a hetero atom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the description, a heteroaryl group may include at least one of B, O, N, P, Si, or S as a hetero atom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the above description of the aryl group may be applied to an arylene group, except that the arylene group is a divalent group. The above description of the heteroaryl group may be applied to a heteroarylene group, except that the heteroarylene group is a divalent group.

In the description, a silyl group may include an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the description, the number of carbon atoms in an amino group is not particularly limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

In the description, the number of carbon atoms in a carbonyl group is not particularly limited, but may be 1 to 40, 1 to 30, or 1 to 20. For example, the carbonyl group may have structure selected from one of the following groups, but is not limited thereto.

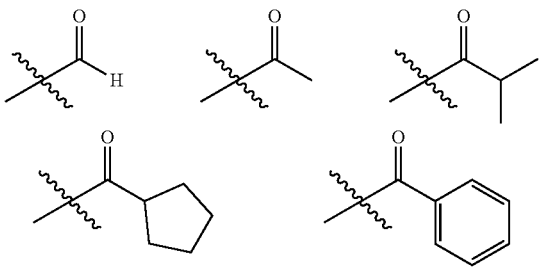

In the description, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the description, a thio group may include an alkyl thio group and an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the description, an oxy group may be an oxygen atom that is bonded to an alkyl group or aryl group as defined above. The oxy group may include an alkoxy group and an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the description, a boron group may be a boron atom that is bonded to an alkyl group or aryl group as defined above. The boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., but are not limited thereto.

In the description, an alkenyl group may be linear or branched. The number of carbon atoms is not particularly limited, but may be 2 to 30, 2 to 20, or 2 to 10 Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the description, the number of carbon atoms in an amine group is not particularly limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but are not limited thereto.

In the description, examples of the alkyl group may include an alkylthio group, an alkyl sulfoxy group, an alkylaryl group, an alkylamino group, an alkyl boron group, an alkyl silyl group, and an alkyl amine group.

In the description, examples of the aryl group may include an aryloxy group, an arylthio group, an aryl sulfoxy group, an arylamino group, an aryl boron group, an aryl silyl group, and an aryl amine group.

In the description, a direct linkage may be a single bond.

In the description,

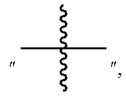

"—*", and "*—" each represent a binding site in a corresponding formula.

Hereinafter, embodiments will be described with reference to the accompanying drawings.

Figure 2:
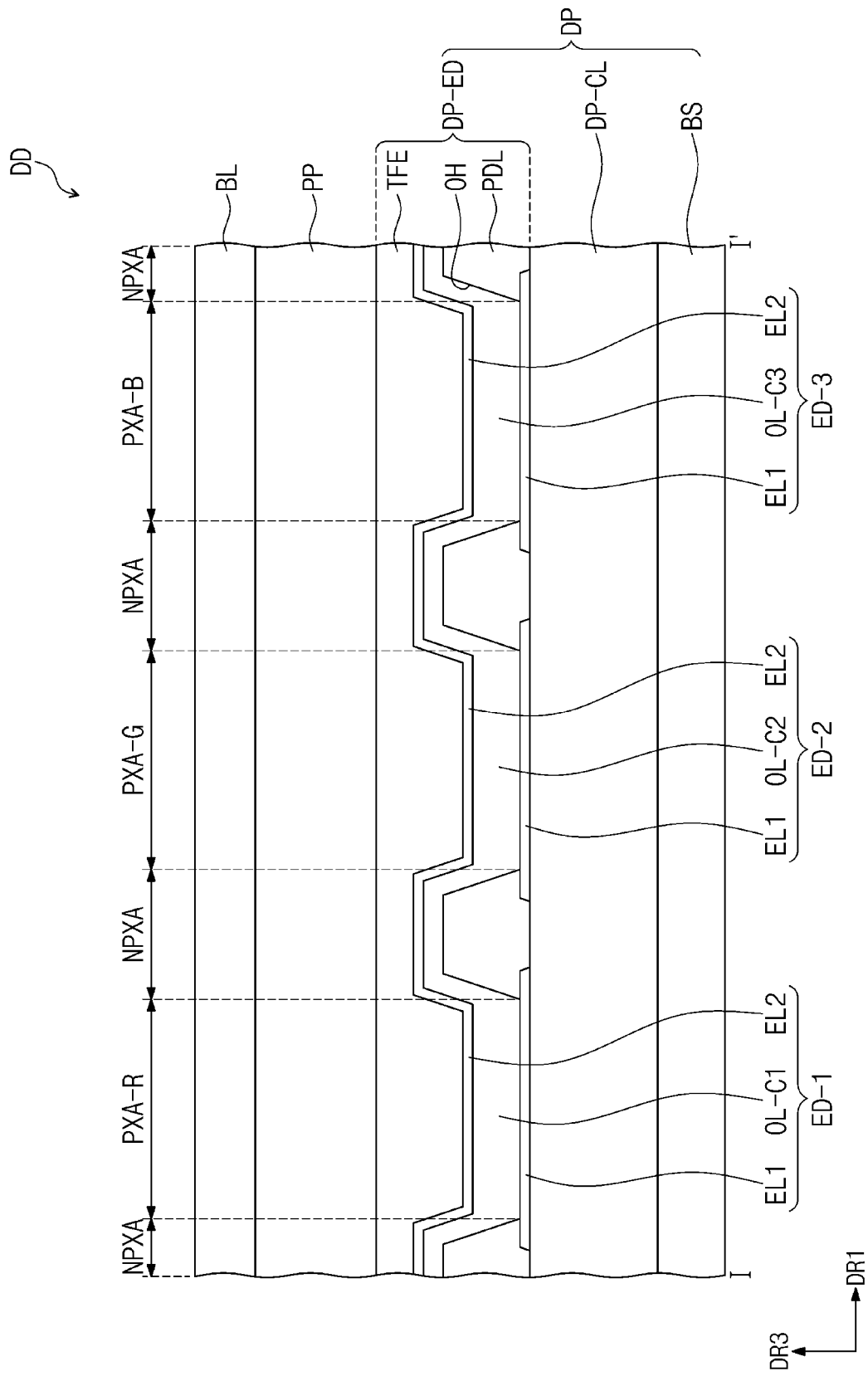
FIG. 2 is a schematic cross-sectional view of a display device according to an embodiment.

FIG. 1 is a plan view of an embodiment of a display device DD. FIG. 2 is a schematic cross-sectional view of a display device DD of an embodiment. FIG. 2 is a schematic cross-sectional view showing a portion corresponding to line I-I' of FIG. 1.

The display device DD may include a display panel DP and an optical layer PP disposed on the display panel DP. The display panel DP includes light emitting elements ED-1, ED-2, and ED-3. The display device DD may include multiples of each of the light emitting elements ED-1, ED-2, and ED-3. The optical layer PP may be disposed on the display panel DP and may control reflected light at the display panel DP from an external light. The optical layer PP may include, for example, a polarizing layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, and an epoxy-based resin.

The display panel DP may include a base layer BS, a circuit layer DP-CL provided on the base layer BS, and a display element layer DP-ED. The display element layer DP-ED may include a pixel defining film PDL, light emitting elements ED-1, ED-2, and ED-3 disposed in the pixel defining film PDL, and an encapsulation layer TFE disposed on the light emitting elements ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving light emitting elements ED-1, ED-2, and ED-3 of the display element layer DP-ED.

The light emitting elements ED-1, ED-2, and ED-3 may each have a structure of a light emitting element ED of an embodiment according to FIG. 3, which will be described later. The light emitting elements ED-1, ED-2, and ED-3 may each include a first electrode EL1, a light emitting unit OL-C1, OL-C2, and OL-C3, and a second electrode EL2.

An encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a stack of multiple layers. The encapsulation layer TFE may include at least one insulating layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film may protect the display element layer DP-ED from moisture and/or oxygen, and the encapsulation organic film may protect the display element layer DP-ED from foreign substances such as dust particles. The encapsulation inorganic film may include silicon nitride, silicon oxy nitride, silicon oxide, titanium oxide, aluminum oxide, etc., but embodiments are not limited thereto. The encapsulation organic layer may include an acrylic compound, an epoxy-based compound, etc. The encapsulation organic layer may include a photopolymerizable organic material, but embodiments are not limited thereto.

The encapsulation layer TFE may be disposed on the second electrode EL2, and may be disposed to fill openings OH.

Referring to FIGS. 1 and 2, the display device DD may include non-light emitting areas NPXA and light emitting areas PXA-R, PXA-G, and PXA-B. The light emitting areas PXA-R, PXA-G, and PXA-B may each be an area emitting light generated from each of the light emitting elements ED-1, ED-2, and ED-3, respectively. The light emitting areas PXA-R, PXA-G, and PXA-B may be spaced apart from each other on a plane.

Each of the light emitting areas PXA-R, PXA-G, and PXA-B may be an area separated by the pixel defining film PDL. The non-light emitting areas NPXA may be an area between neighboring light emitting areas PXA-R, PXA-G, and PXA-B, and may correspond to the pixel defining film PDL. Each of the light emitting areas PXA-R, PXA-G, and PXA-B may correspond to a pixel. The pixel defining film PDL may separate the light emitting elements ED-1, ED-2, and ED-3. The emission layers EML-R, EML-G, and EML-B of the light emitting elements ED-1, ED-2, and ED-3 may be disposed in the openings OH defined in the pixel defining film PDL and separated from each another.

The light emitting areas PXA-R, PXA-G, and PXA-B may be divided into groups according to the color of light generated from each of the light emitting elements ED-1, ED-2, and ED-3. In the display device DD of an embodiment shown in FIGS. 1 and 2, three light emitting areas PXA-R, PXA-G, and PXA-B which respectively emit red light, green light, and blue light, are shown as an example. For example, the display device DD of an embodiment may include a red light emitting area PXA-R, a green light emitting area PXA-G, and a blue light emitting area PXA-B, which are distinct from one another.

In the display device DD according to an embodiment, the light emitting elements ED-1, ED-2, and ED-3 may emit light having different wavelength ranges from one another. For example, in an embodiment, the display device DD may include a first light emitting element ED-1 emitting red light, a second light emitting element ED-2 emitting green light, and a third light emitting element ED-3 emitting blue light. For example, the red light emitting area PXA-R, the green light emitting area PXA-G, and the blue light emitting area PXA-B of the display device DD may correspond to the first light emitting element ED-1, the second light emitting element ED-2, and the third light emitting element ED-3, respectively.

However, embodiments are not limited thereto, and the first to third light emitting elements ED-1, ED-2 and ED-3 may emit light in a same wavelength range or emit light in at least one different wavelength range. For example, the first to third light emitting elements ED-1, ED-2, and ED-3 may all emit blue light.

The light emitting areas PXA-R, PXA-G, and PXA-B in the display device DD according to an embodiment may be arranged in the form of a stripe. Referring to FIG. 1, red light emitting areas PXA-R, green light emitting areas PXA-G, and blue light emitting areas PXA-B may each be arranged along a second directional axis DR2. In another embodiment, the red light emitting area PXA-R, the green light emitting area PXA-G, and the blue light emitting area PXA-B may be alternately arranged in turn along a first directional axis DR1.

FIGS. 1 and 2 show that the light emitting areas PXA-R, PXA-G, and PXA-B have a similar size, but embodiments are not limited thereto, and the light emitting areas PXA-R, PXA-G and PXA-B may be different in size from each other according to a wavelength range of emitted light. The areas of the light emitting areas PXA-R, PXA-G, and PXA-B may be areas in a plan view that are defined by the first directional axis DR1 and the second directional axis DR2.

The arrangement of the light emitting areas PXA-R, PXA-G, and PXA-B is not limited to the one shown in FIG. 1, and the order in which the red light emitting area PXA-R, the green light emitting area PXA-G, and the blue light emitting area PXA-B may be arranged in various combinations according to display quality characteristics required for the display device DD. For example, the light emitting areas PXA-R, PXA-G, and PXA-B may be in the form of a PENTILE™ arrangement or a diamond arrangement.

In an embodiment, an area of each of the light emitting areas PXA-R, PXA-G, and PXA-B may be different in size from one another. For example, in an embodiment, the green light emitting area PXA-G may be smaller than the blue light emitting area PXA-B in size, but embodiments are not limited thereto.

Figure 3:
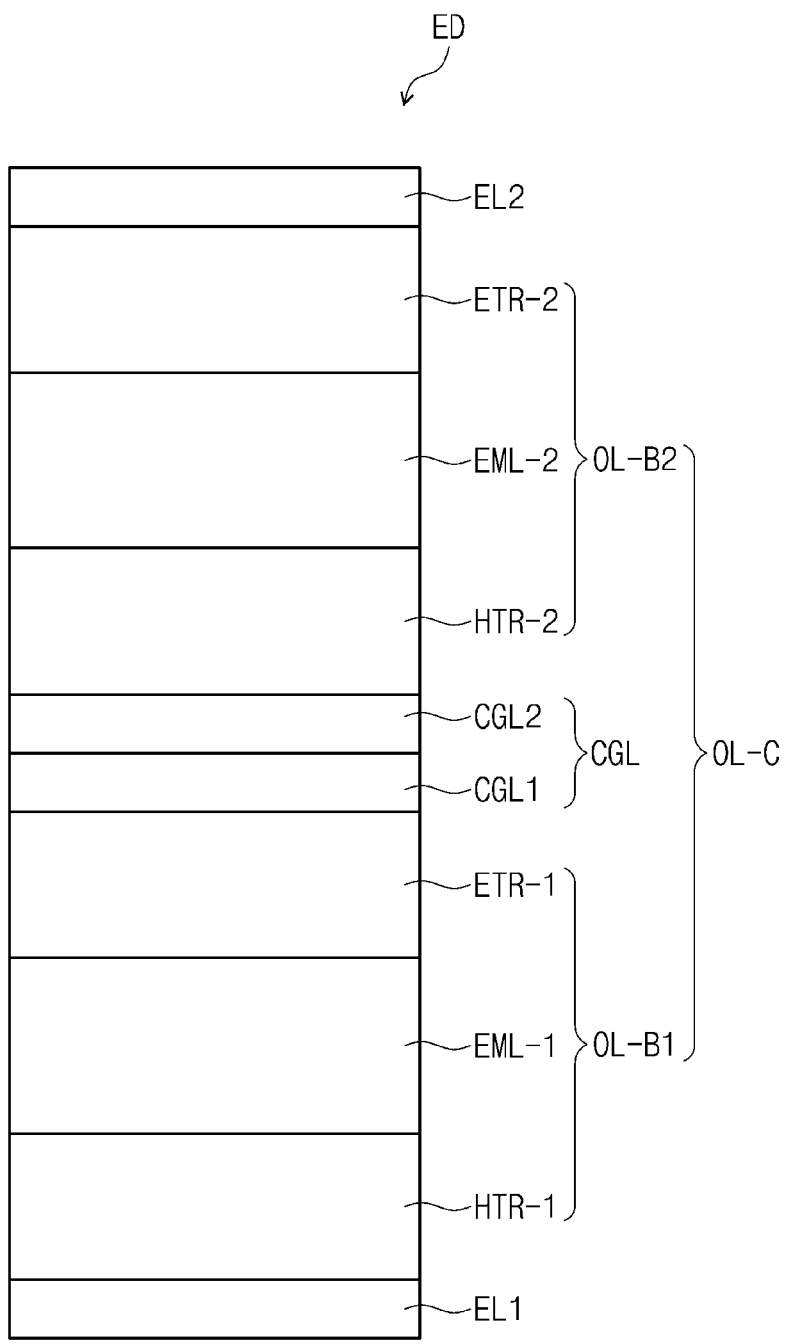
FIG. 3 is a schematic cross-sectional view showing a light emitting element according to an embodiment.

FIG. 3 is a schematic cross-sectional view showing a light emitting element according to an embodiment. Referring to FIG. 3, the light emitting element ED according to an embodiment may include a first electrode EL1, a first light emitting structure OL-B1, a charge generation layer CGL, a second light emitting structure OL-B2, and a second electrode EL2, which are sequentially stacked.

The first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In an embodiment, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The first electrode EL1 may include the above-described metal materials, a combination of two or more metal materials selected from the above-described metal materials, or oxides of the above-described metal materials. The first electrode EL1 may have a thickness in a range of about 700 Å to about 10,000 Å. For example, the first electrode EL1 may have a thickness in a range of 1,000 Å to about 3,000 Å.

The first light emitting structure OL-B1 may include a first hole transport region HTR-1, a first emission layer EML-1 disposed on the first hole transport region HTR-1, and a first electron transport region ETR-1 disposed on the first emission layer EML-1.

The first hole transport region HTR-1 is provided on the first electrode EL1. The first hole transport region HTR-1 may include at least one of a hole injection layer (not shown), a hole transport layer (not shown), a buffer layer (not shown), a light emitting auxiliary layer (not shown), and an electron blocking layer (not shown). The first hole transport region HTR-1 may have, for example, a thickness in a range of about 50 Å to about 15,000 Å.

The first hole transport region HTR-1 may be a layer formed of a single material, a layer formed of different materials, or a multilayer structure having layers formed of different materials.

For example, the first hole transport region HTR-1 may have a single-layer structure formed of the hole injection layer (not shown) or the hole transport layer (not shown), or a single-layer structure formed of a hole injection material or a hole transport material. For example, the first hole transport region HTR-1 may have a single-layer structure formed of different materials, or a structure in which a hole injection layer (not shown)/hole transport layer (not shown), a hole injection layer (not shown)/hole transport layer (not shown)/buffer layer (not shown), a hole injection layer (not shown)/buffer layer (not shown), a hole transport layer (not shown)/buffer layer (not shown), or a hole injection layer (not shown)/hole transport layer (not shown)/electron blocking layer (not shown) are stacked in its respective stated order from the first electrode EL1, but embodiments are not limited thereto.

The first hole transport region HTR-1 may be formed using various methods such as a vacuum deposition method, a spin coating method, a cast method, a Langmuir-Blodgett (LB) method, an inkjet printing method, a laser printing method, and a laser induced thermal imaging (LITI) method.

The first hole transport region HTR-1 may include a compound represented by Formula H-1 below.

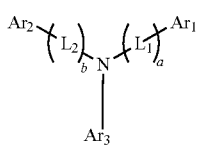

[Formula H-1]

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

A compound represented by Formula H-1 above may be a monoamine compound. In another embodiment, the compound represented by Formula H-1 may be a diamine compound in which at least one of $Ar_1$ to $Ar_3$ may include an amine group as a substituent. For example, a compound represented by Formula H-1 may be a carbazole-based compound including a substituted or unsubstituted carbazole group in at least one of $Ar_1$ or $Ar_2$ or a substituted or unsubstituted fluorene-based group in at least one of $Ar_1$ or $Ar_2$.

The compound represented by Formula H-1 may be any one selected from Compound Group H below. However, the compounds listed in Compound Group H are presented as examples, and the compound represented by Formula H-1 is not limited to those in Compound Group H below.

[Compound Group H]

H-1-1

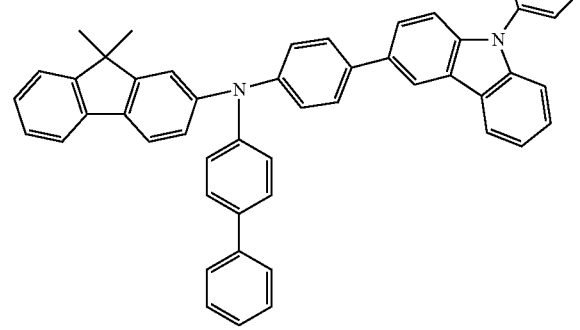

H-1-2

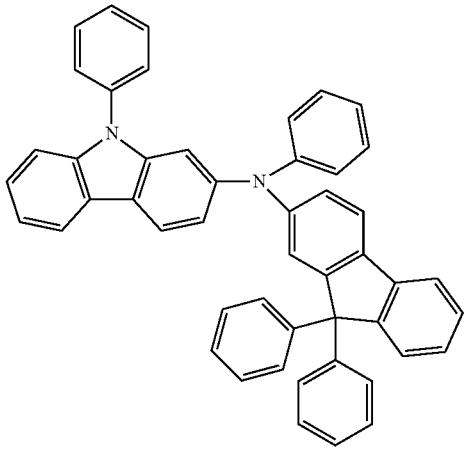

H-1-3

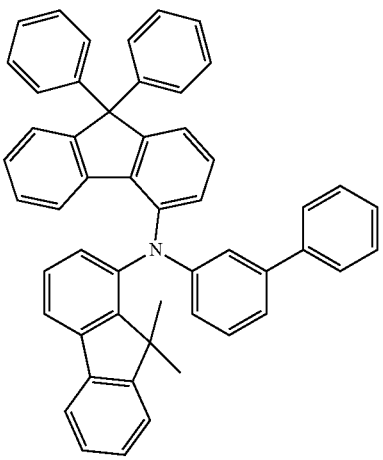

H-1-4

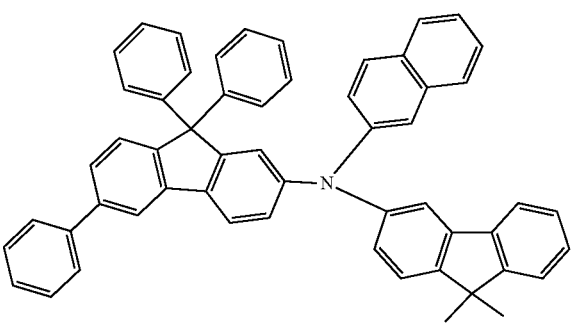

H-1-5

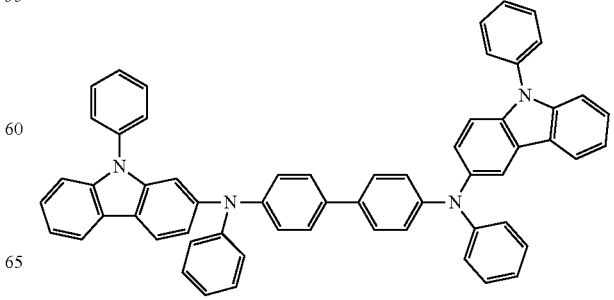

H-1-6
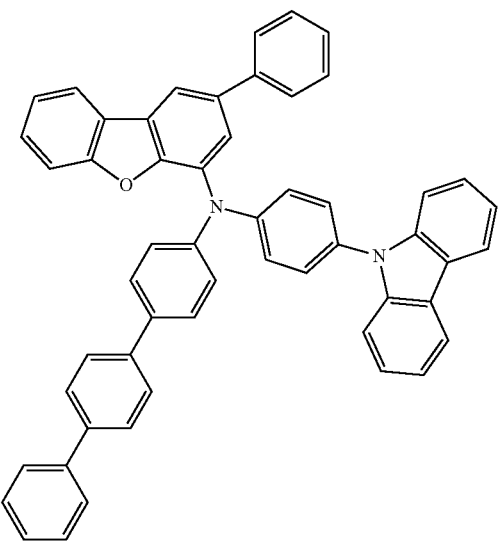
H-1-7
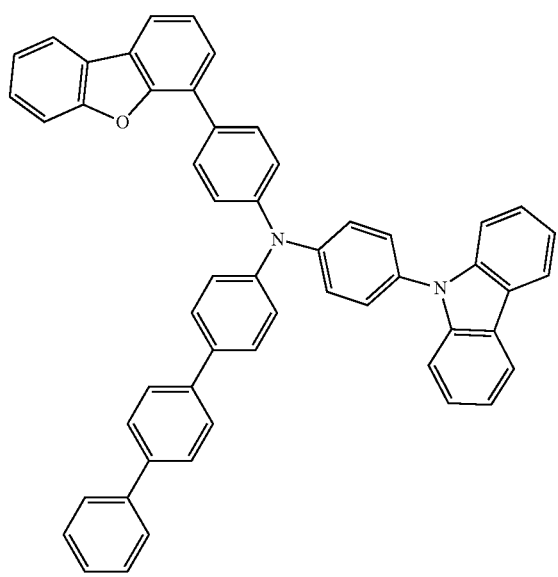
H-1-8
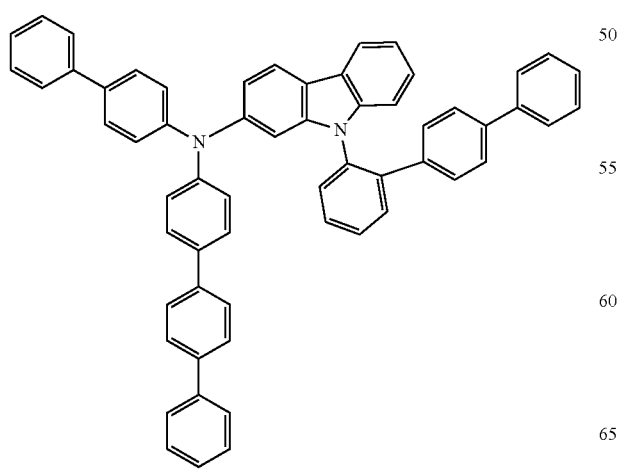
H-1-9
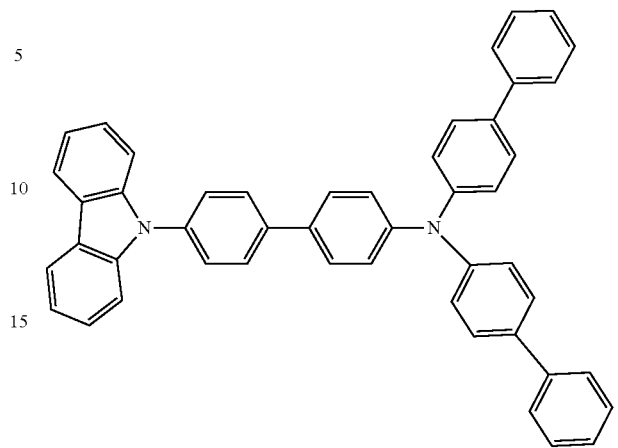
H-1-10
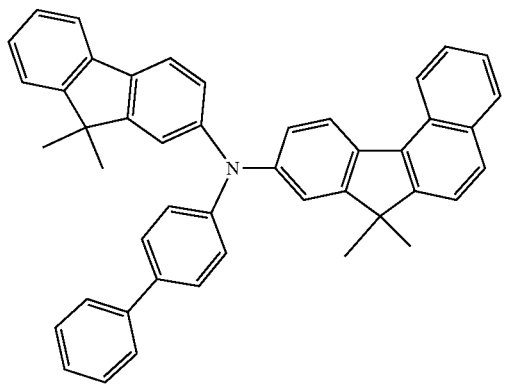
H-1-11
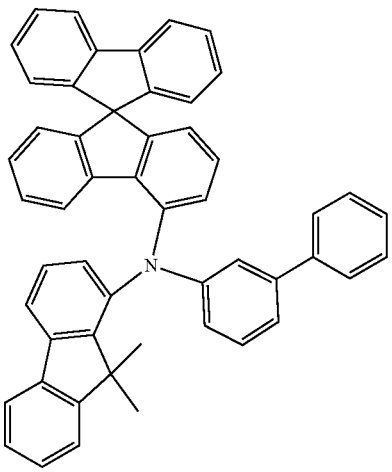

H-1-12
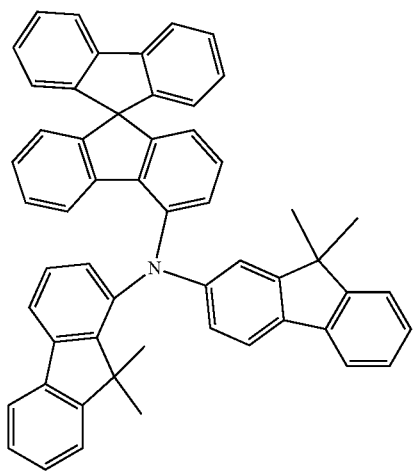
H-1-13
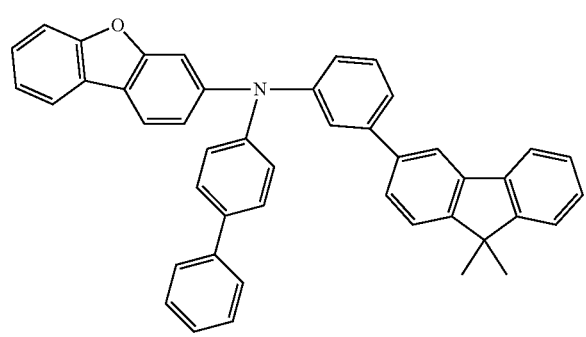
H-1-14
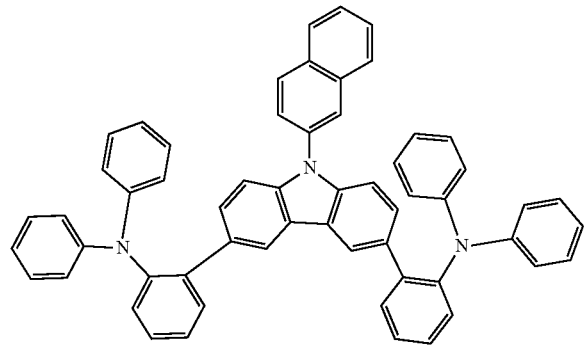
H-1-15
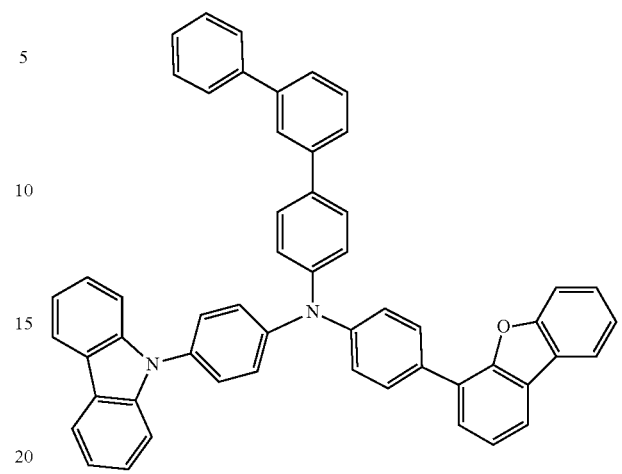
H-1-16
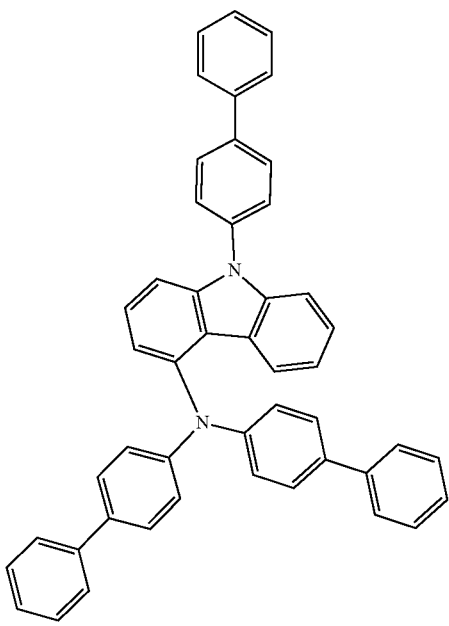
H-1-17
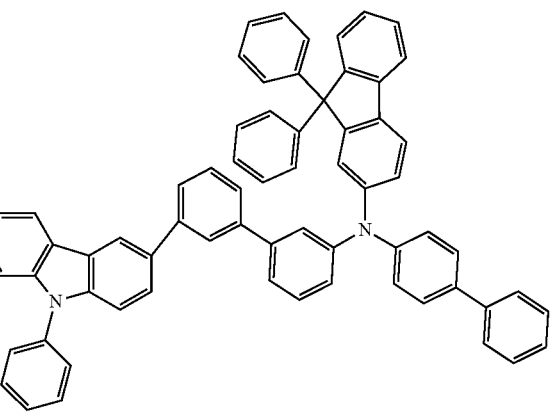

H-1-18

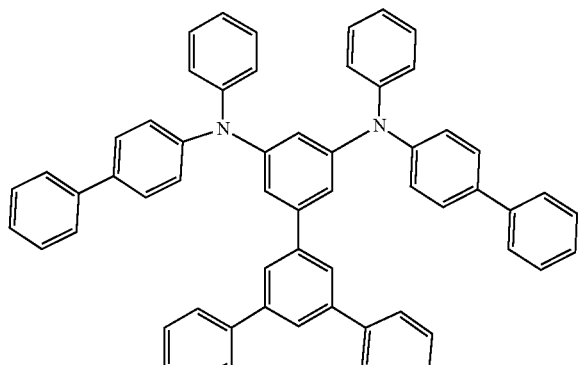

H-1-19

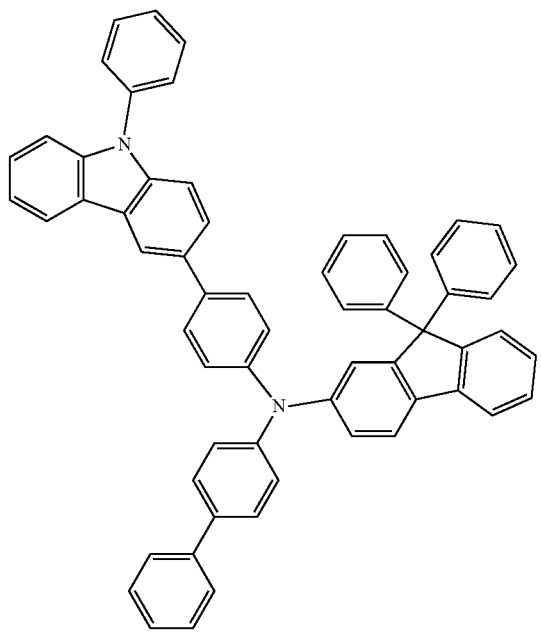

The first hole transport region HTR-1 may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl) borate, dipyrazino[2,3-f: 2',3'-h]quinoxaline-2,3,6,7,10,11-hexacarbonitrile (HAT-CN), etc.

The first hole transport region HTR-1 may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4''-tris (N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4-bis[N,N'-(3-tolyl)amino]-3,3'-dimethylbiphenyl (HMTPD), 1,3-bis(N-carbazolyl)benzene (mCP), etc.

The first hole transport region HTR-1 may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The first hole transport region HTR-1 may include the compounds of the hole transport region described above in at least one of the hole injection layer (not shown), the hole transport layer (not shown), and the electron blocking layer (not shown).

The first hole transport region HTR-1 may have a thickness in a range of about 100 Å to about 10,000 Å. For example, the first hole transport region HTR-1 may have a thickness in a range of about 100 Å to about 5,000 Å. When the first hole transport region HTR-1 includes a hole injection layer (not shown), the hole injection layer (not shown) may have a thickness, for example, in a range of about 30 Å to about 1,000 Å. When the first hole transport region HTR-1 includes a hole transport layer (not shown), the hole transport layer (not shown) may have a thickness in a range of about 30 Å to about 1,000 Å. When the first hole transport region HTR-1 includes an electron blocking layer (not shown), the electron blocking layer (not shown)/may have a thickness, for example, in a range of about 10 Å to about 1,000 Å. When the thicknesses of the first hole transport region HTR-1, the hole injection layer (not shown), the hole transport layer (not shown), and the electron blocking layer (not shown) satisfy the above-described ranges, satisfactory hole transport properties may be obtained without a substantial increase in driving voltage.

The first hole transport region HTR-1 may further include, in addition to the above-described materials, a charge generation material to increase conductivity. The charge generation material may be uniformly or non-uniformly dispersed in the first hole transport region HTR-1. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f:2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but is not limited thereto.

As described above, the first hole transport region HTR-1 may further include at least one of a buffer layer (not shown) or an electron blocking layer (not shown) in addition to the hole injection layer (not shown) and the hole transport layer (not shown). The buffer layer (not shown) may compensate a resonance distance according to wavelengths of light emitted from the first emission layer EML-1, and may thus increase luminous efficiency. Materials which may be included in the first hole transport region HTR-1 may be used as materials included in the buffer layer (not shown). The electron blocking layer (not shown) is a layer that may prevent electrons from being injected from the first electron transport region ETR-1 to the first hole transport region HTR-1.

The first emission layer EML-1 is provided on the first hole transport region HTR-1. The first emission layer EML-1 may have, for example, a thickness in a range of about 100 Å to about 1,000 Å. For example, the first emission layer EML-1 may have a thickness in a range of about 100 Å to about 300 Å. The first emission layer EML-1 may be a layer formed of a single material, a layer formed of different materials, or a multilayer structure having layers formed of different materials.

In the light emitting element ED of an embodiment, the first emission layer EML-1 may include an anthracene derivative, a pyrene derivative, a fluoranthene derivative, a chrysene derivative, a dihydrobenzanthracene derivative, or a triphenylene derivative. For example, the first emission layer EML-1 may include an anthracene derivative or a pyrene derivative.

In the light emitting element ED of the embodiment shown in FIG. 3, the first emission layer EML-1 may include a host and a dopant, and the first emission layer EML-1 may include a compound represented by Formula E-1 below. The compound represented by Formula E-1 below may be used as a fluorescent host material.

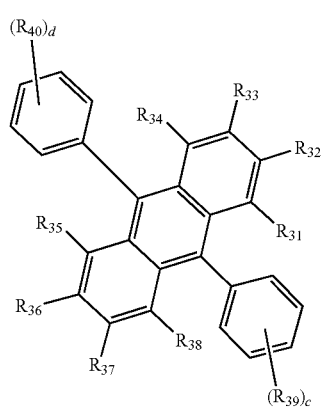

[Formula E-1]

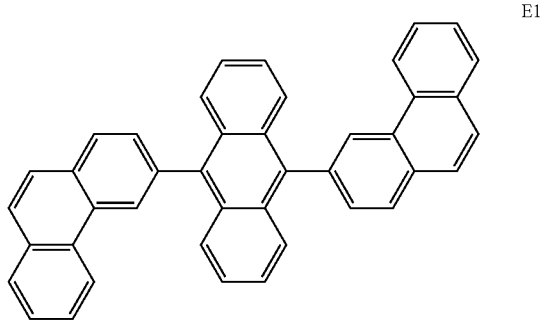

E1

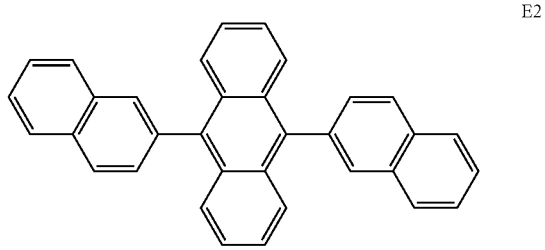

E2

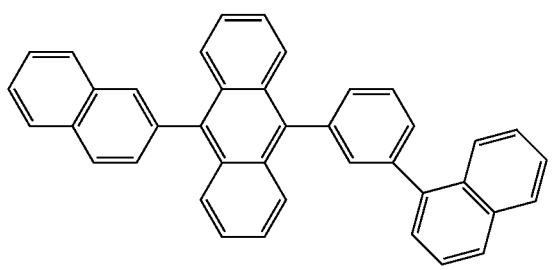

E3

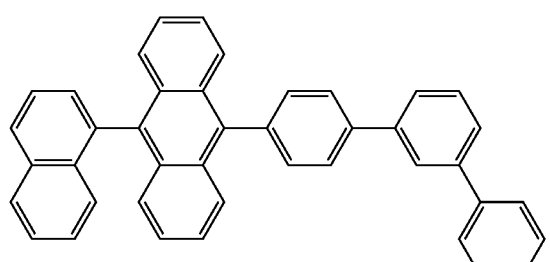

E4

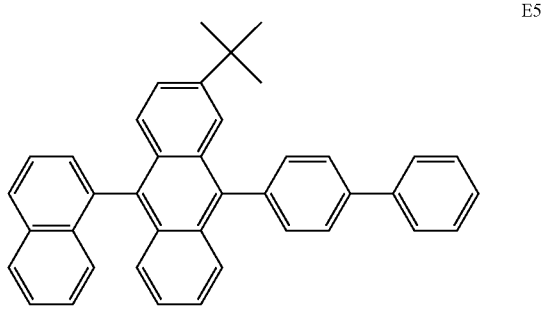

E5

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compounds E1 to E19 below.

E6
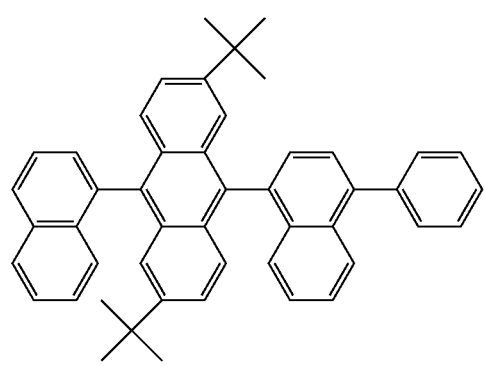
E7
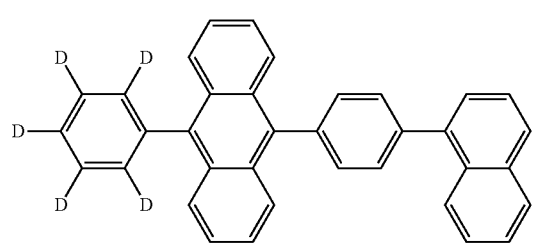
E8
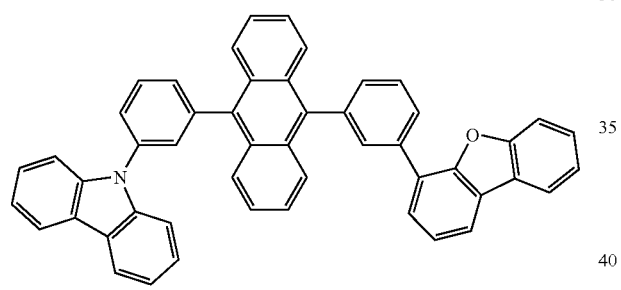
E9
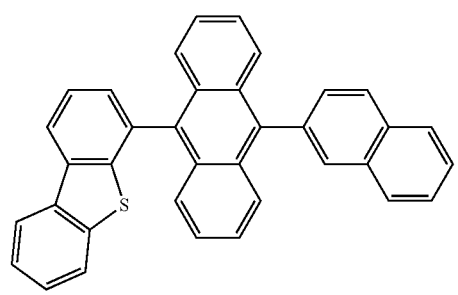
E10
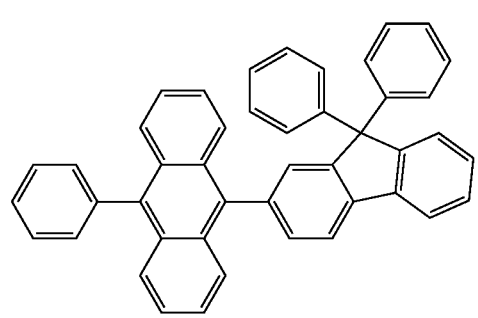
E11
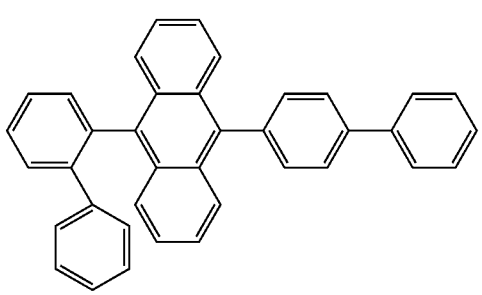
E12
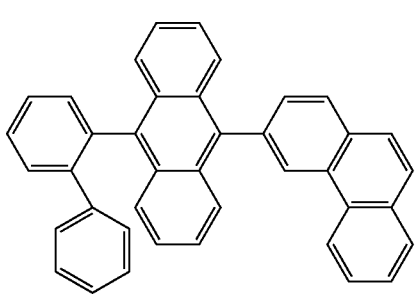
E13
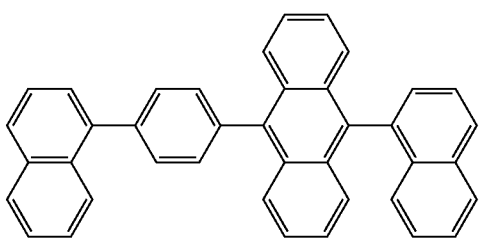
E14
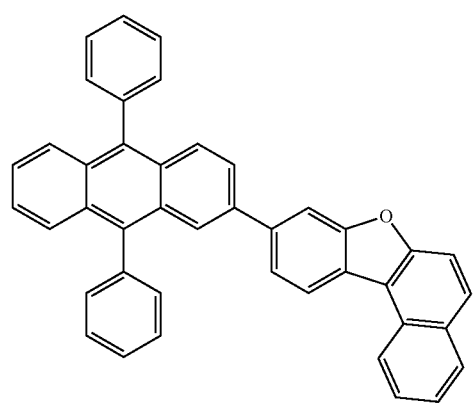

-continued

E15

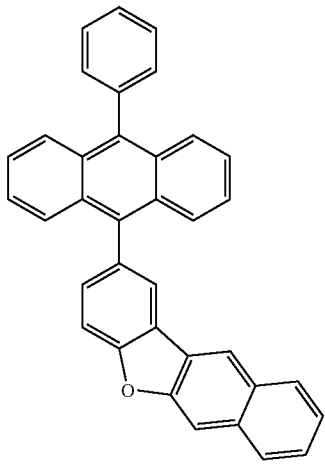

E16

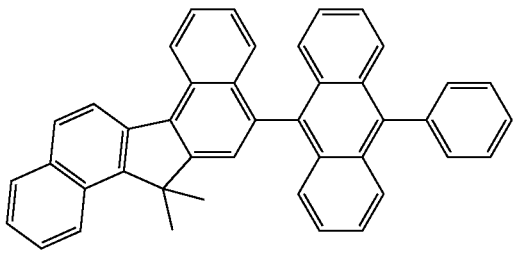

E17

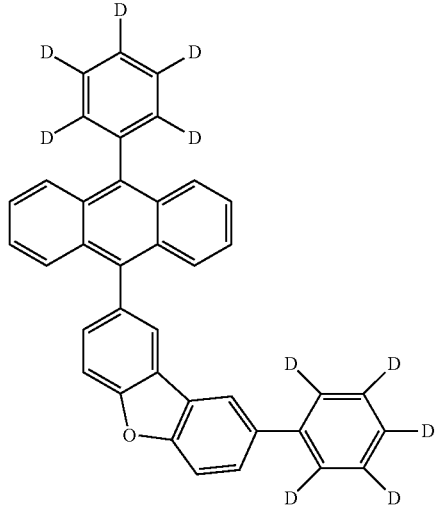

E18

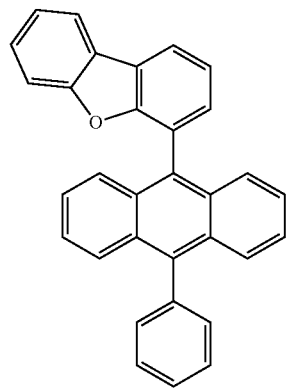

-continued

E19

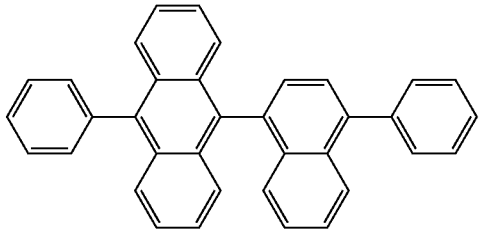

In an embodiment, the first emission layer EML-1 may include a compound represented by Formula E-2a or E-2b below. The compound represented by Formula E-2a or Formula E-2b may be used as a phosphorescent host material.

[Formula E-2a]

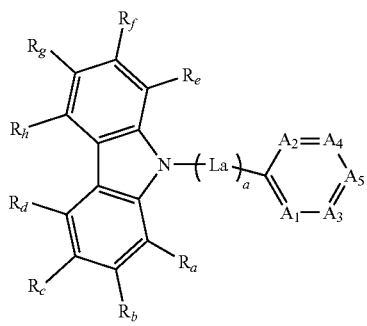

In Formula E-2a, a may be an integer from 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple La groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

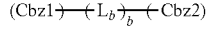

In Formula E-2b, Cbz1 and Cbz2 may each independently be an unsubstituted carbazole group or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2 below. However, the compounds listed in Compound Group E-2 below are presented as example, and the compound represented by Formula E-2a or Formula E-2b is not limited to those listed in Compound Group E-2 below.

[Compound Group E-2]

E-2-1

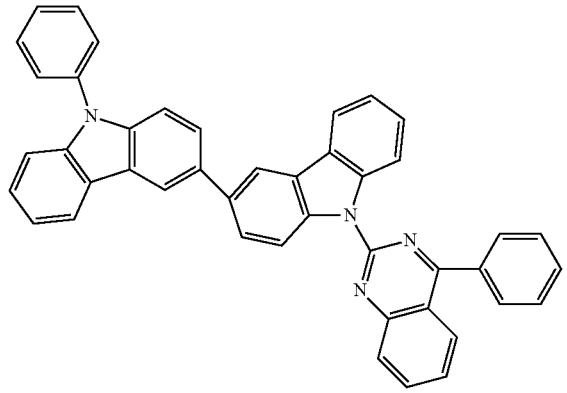

E-2-2

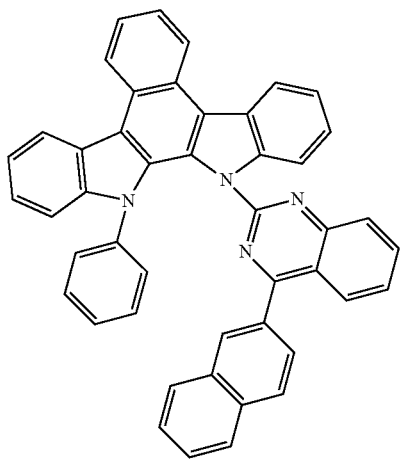

E-2-3

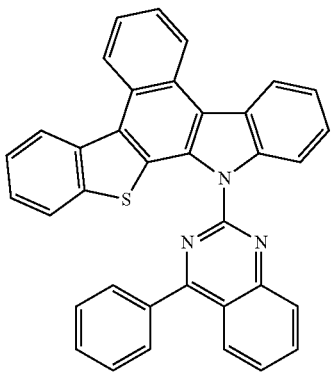

E-2-4

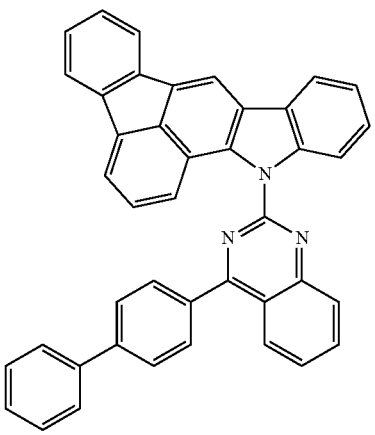

E-2-5

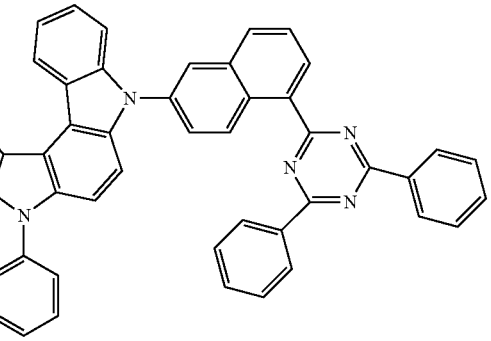

E-2-6

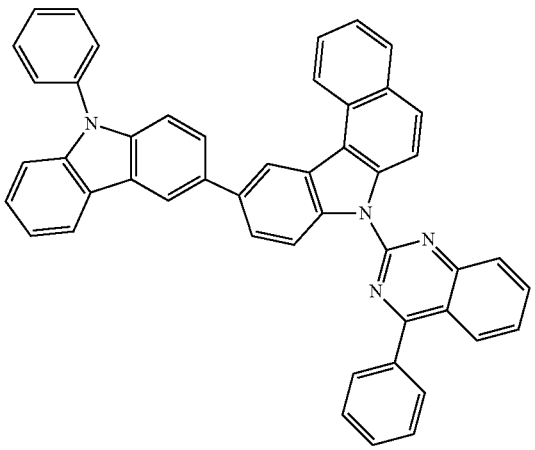

E-2-7
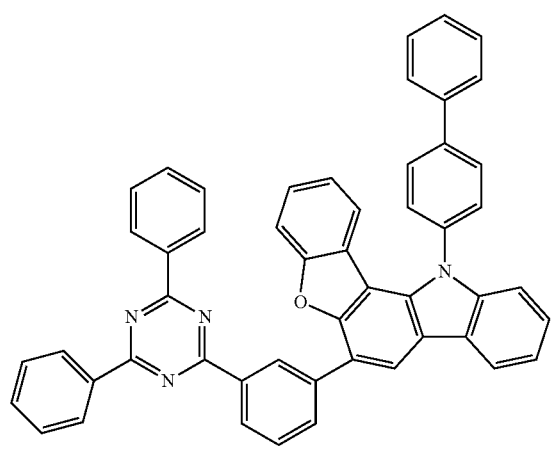
E-2-8
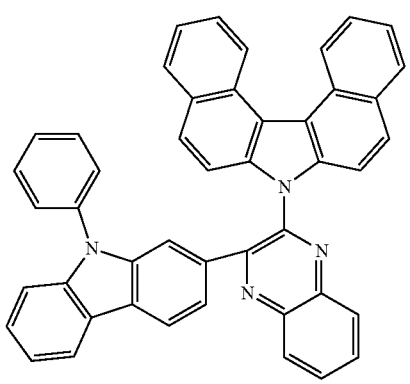
E-2-9
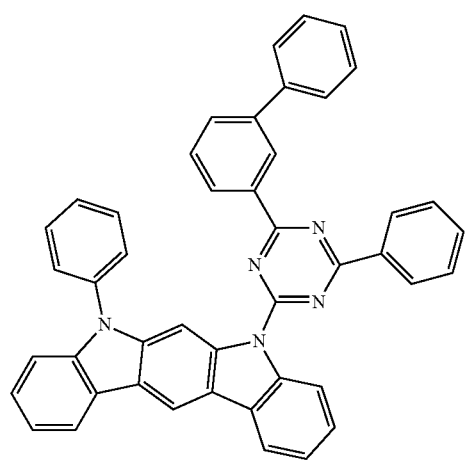
E-2-10
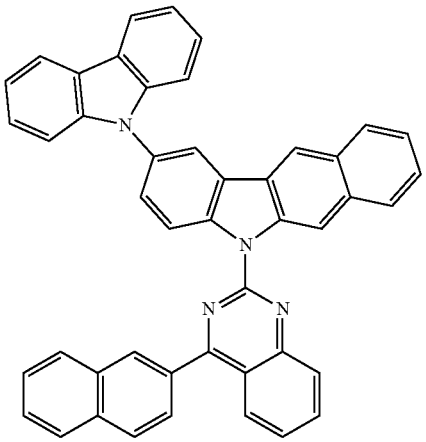
E-2-11
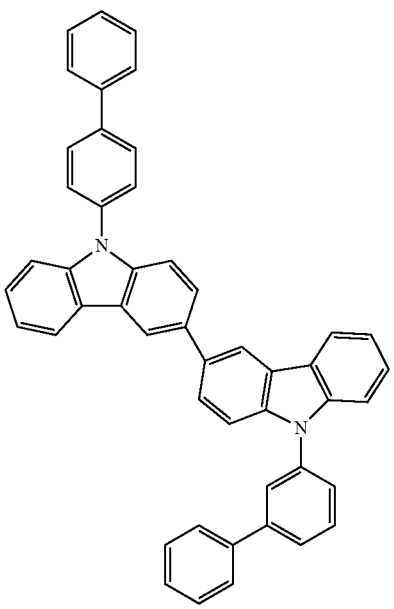
E-2-12
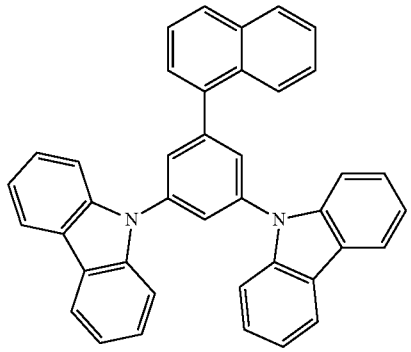

E-2-13
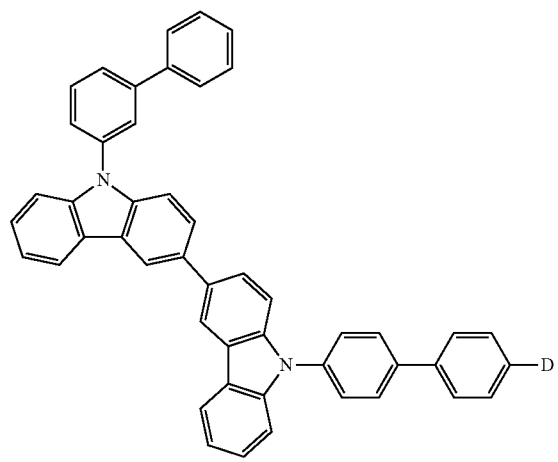
E-2-14
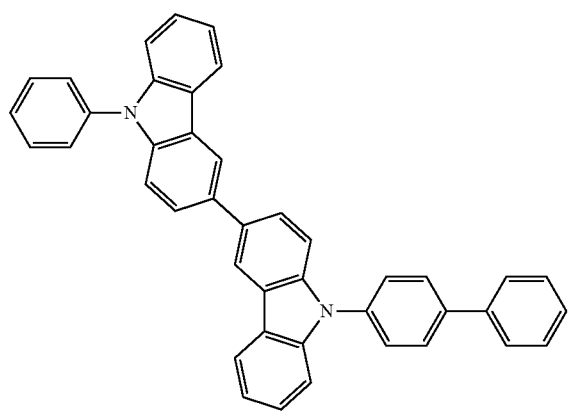
E-2-15
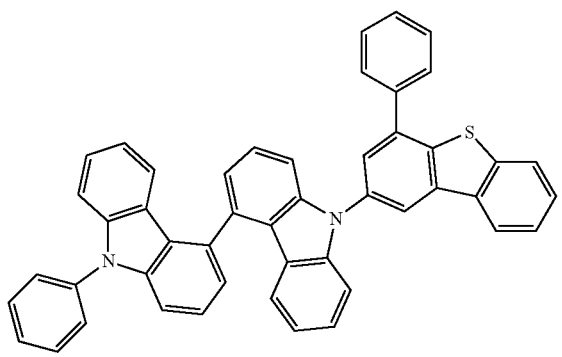
E-2-16
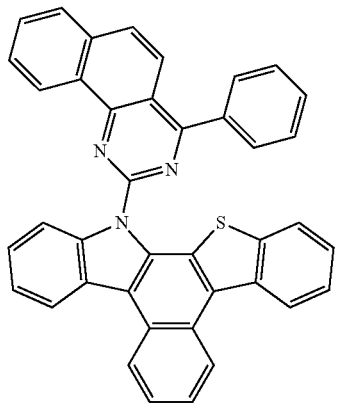
E-2-17
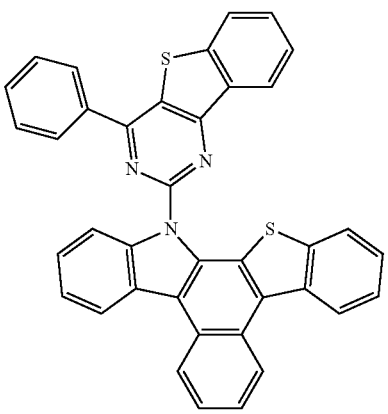
E-2-18
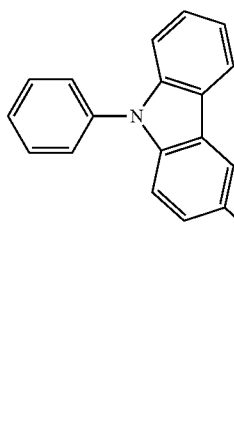
E-2-19

E-2-20

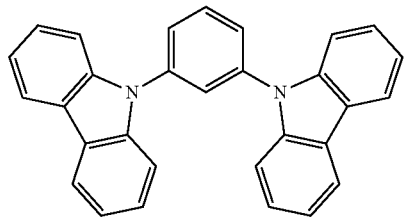

E-2-21

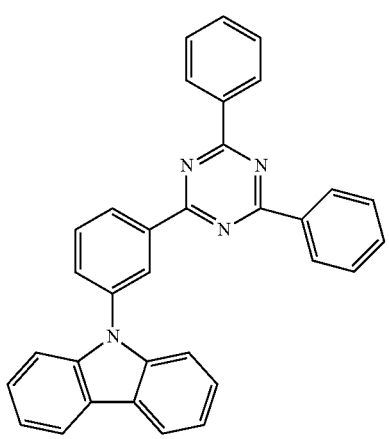

E-2-22

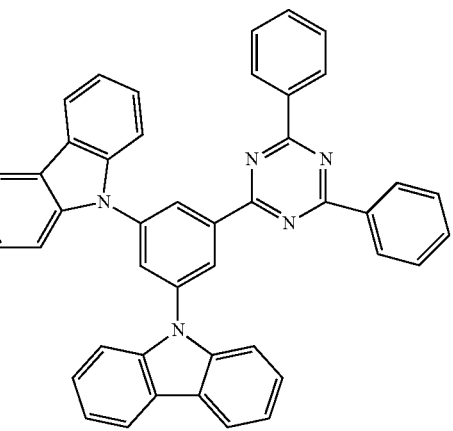

E-2-23

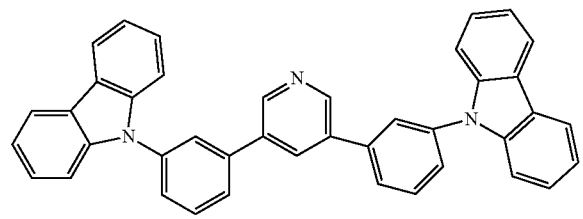

E-2-24

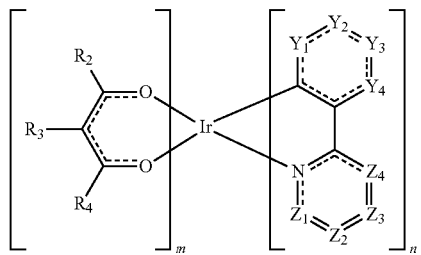

The first emission layer EML-1 may further include a general material used in the art as a host material. For example, the first emission layer EML-1 may include, as a host material, at least one among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl)benzene (TPBi). However, embodiments are not limited thereto, and for example, tris(8-hydroxyquinolino)aluminum ($Alq_3$), 9,10-di(naphthalene-2-yl) anthracene (ADN), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The first emission layer EML-1 may include a compound represented by Formula M-a or Formula M-b below. The compound represented by Formula M-a or Formula M-b below may be used as a phosphorescent dopant material.

[Formula M-a]

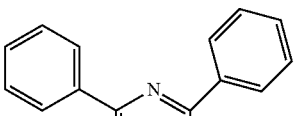
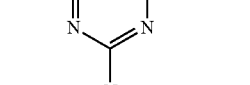
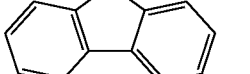

In Formula M-a above, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any one selected from Compounds M-a1 to M-a25 below. However, Compounds M-a1 to M-a25 below are presented as examples, and the compound represented by Formula M-a is not limited to Compounds M-a1 to M-a25 below.

M-a1
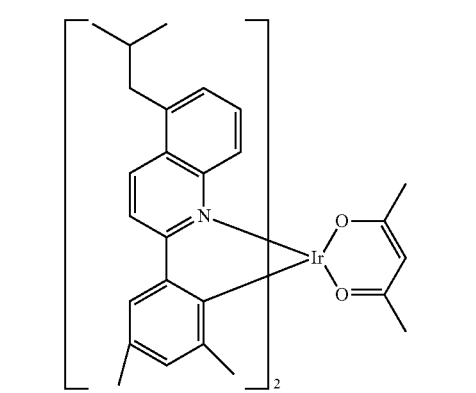

M-a2
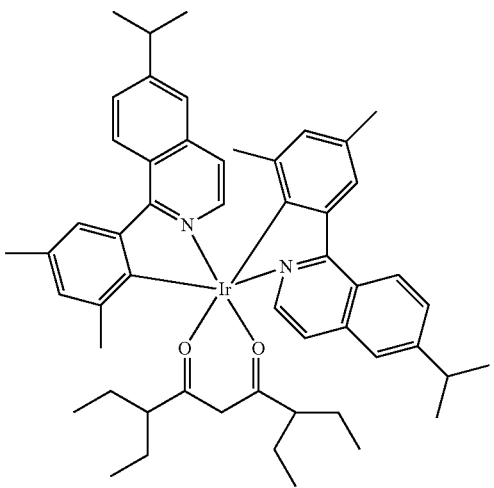

M-a3
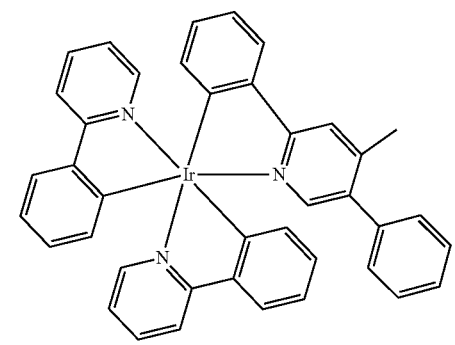

-continued

M-a4
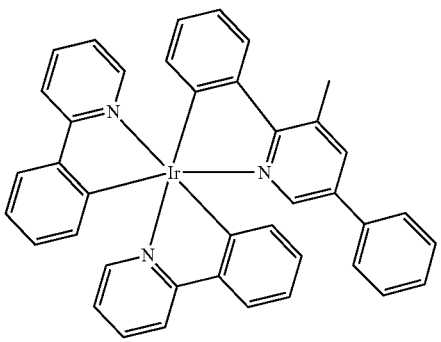

M-a5
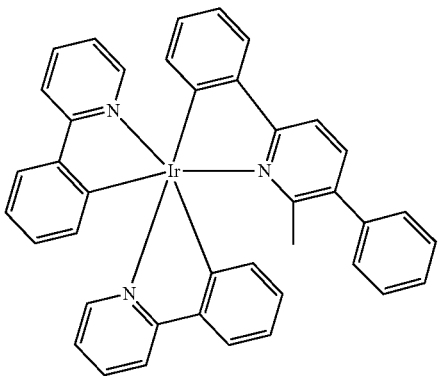

M-a6
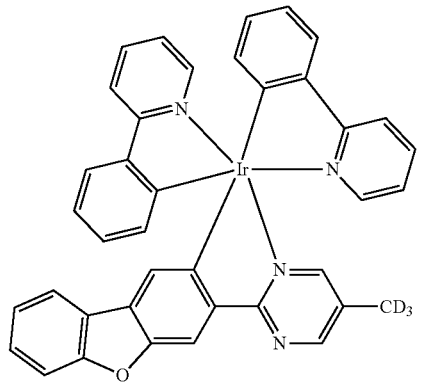

M-a7
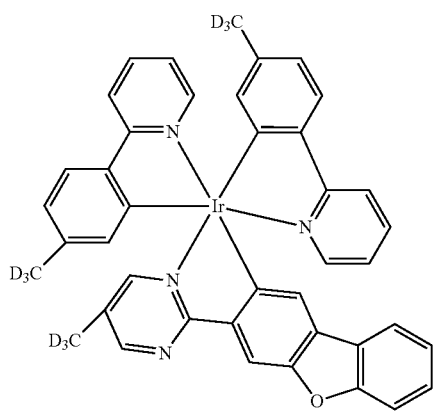

M-a8
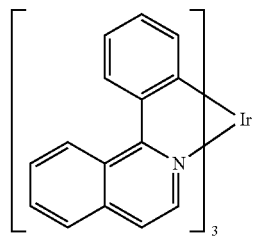
M-a9
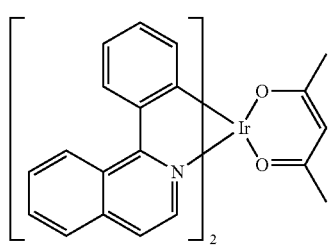
M-a10
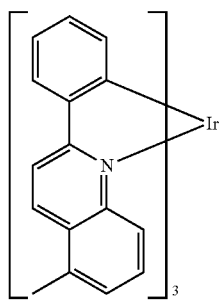
M-a11
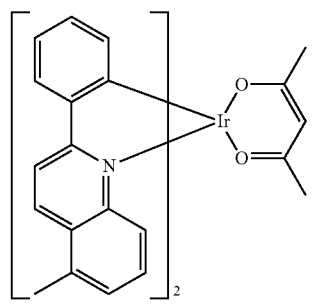
M-a12
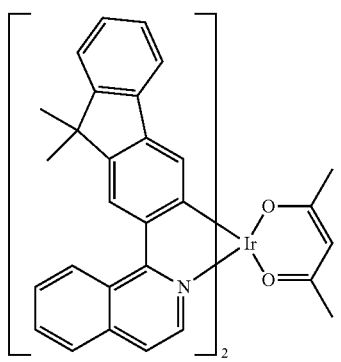
M-a13
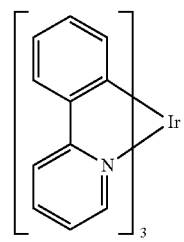
M-a14
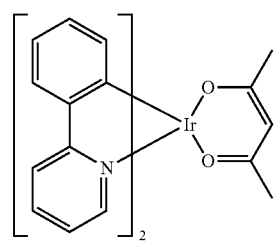
M-a15
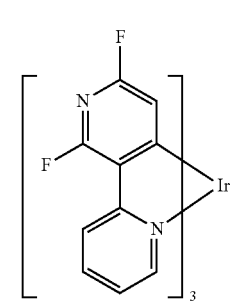
M-a16
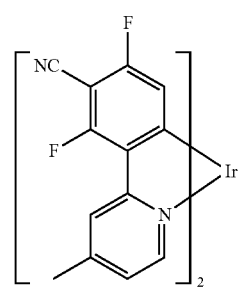
M-a17
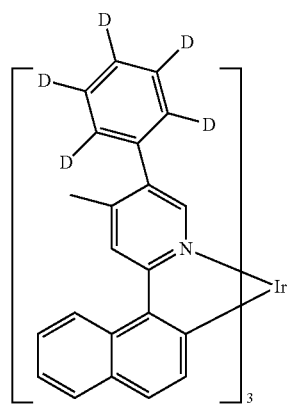

M-a18
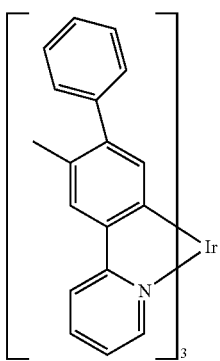
M-a19
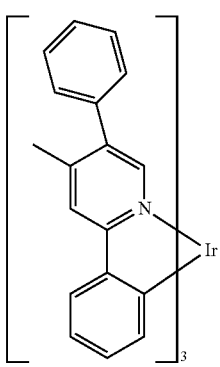
M-a20
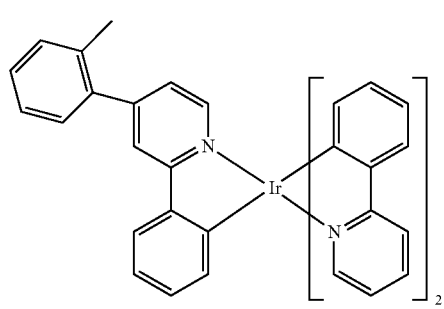
M-a21
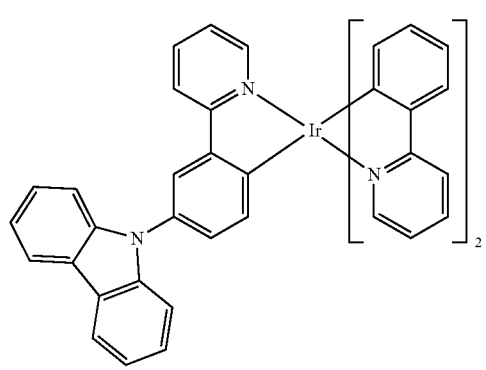
M-a22
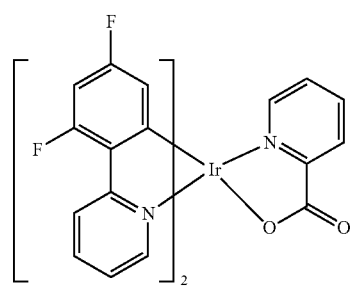
M-a23
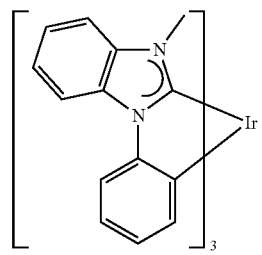
M-a24
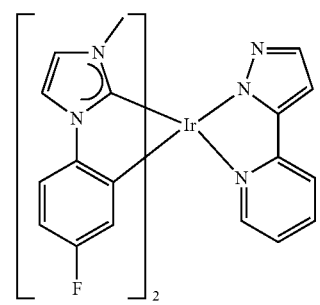
M-a25
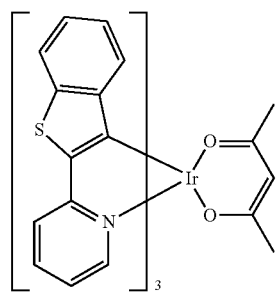
Compound M-a1 and Compound M-a2 may be used as a red dopant material, and Compounds M-a3 to M-a25 may be used as a green dopant material.

[Formula M-b]

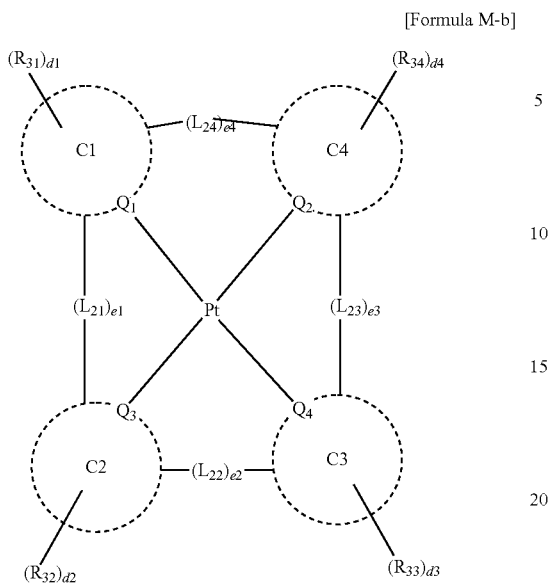

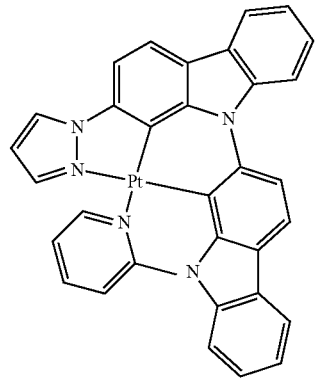
M-b-1

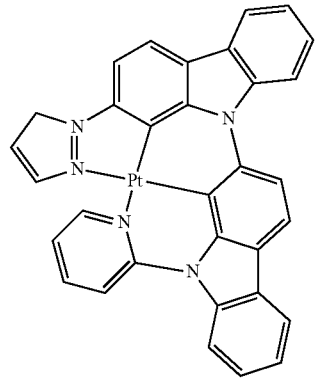
M-b-2

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage, *—O—*, *—S—*,

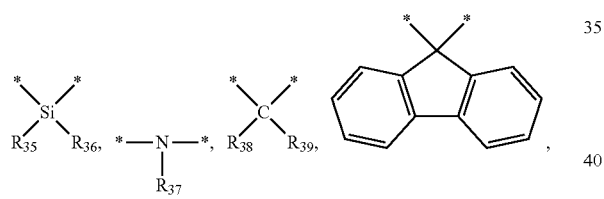

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or as a green phosphorescent dopant.

The compound represented by Formula M-b may be any one selected from Compounds M-b-1 to M-b-12. However, the compounds below are presented as examples, and the compound represented by Formula M-b is not limited to Compounds M-b-1 to M-b-12.

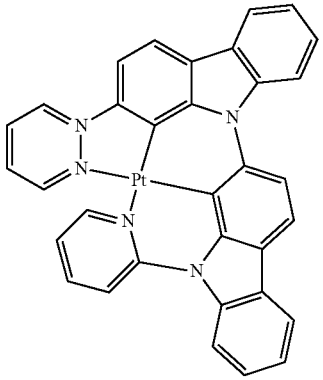
M-b-3

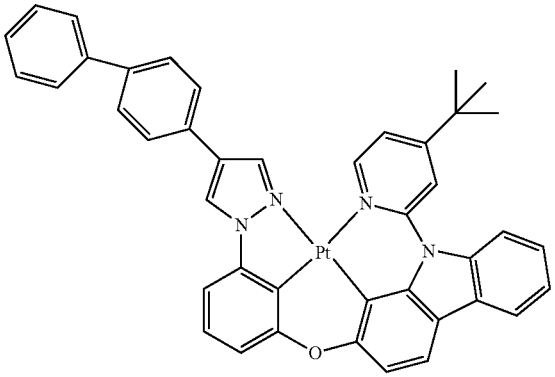
M-b-4

M-b-5
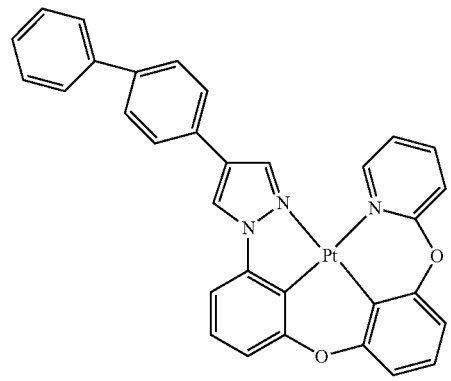

M-b-6
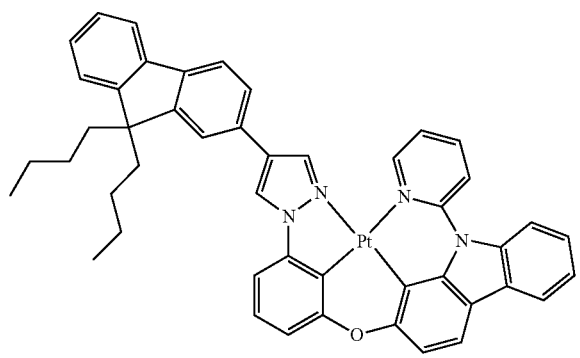

M-b-7
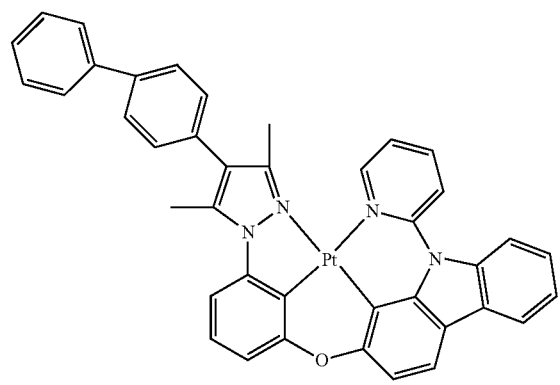

M-b-8
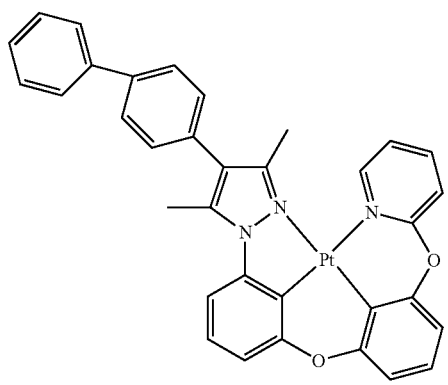

M-b-9
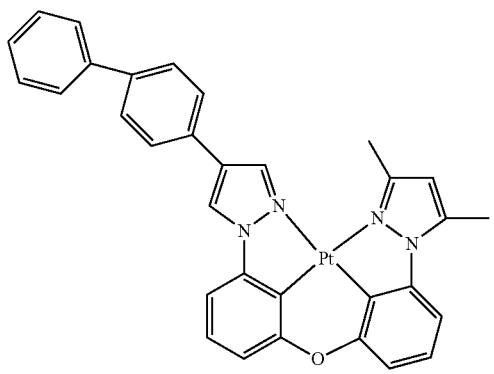

M-b-10
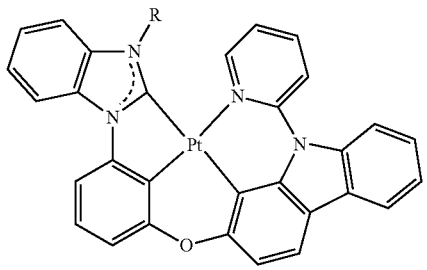

M-b-11
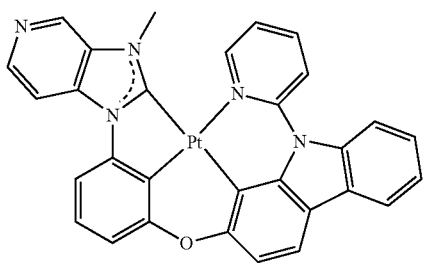

M-b-12
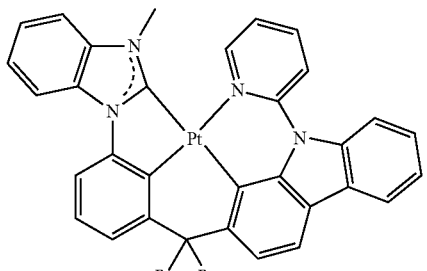

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The first emission layer EML-1 may include a compound represented by any one of Formulas F-a to F-c below. The compounds represented by Formulas F-a to F-c below may be used as a fluorescent dopant material.

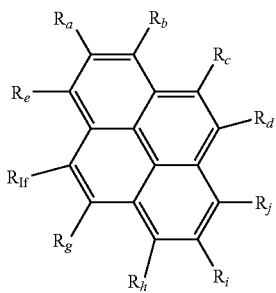
[Formula F-a]

In Formula F-a above, two selected from $R_a$ to $R_j$ may each independently be substituted with *—$NAr_1Ar_2$. The remainder of $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

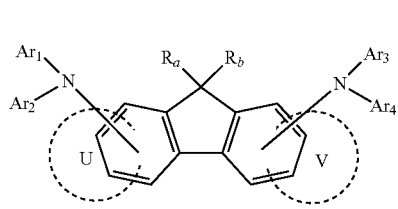
[Formula F-b]

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at the position indicated by U or V, and when the number of U or V is 0, a ring may not be present at the position indicated by U or V. When the number of U is 0 and the number of V is 1, or when the number of U is 1 and the number of V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

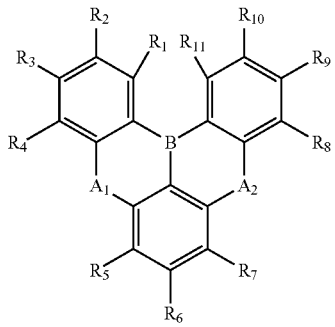
[Formula F-c]

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of neighboring rings to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the first emission layer EML-1 may include, as a dopant material, styryl derivatives (e.g., 1,4-bis[2-(3-N-ethylcarbazoryl)vinyl]benzene (BCzVB), 4-(di-p-tolylamino)-4"-[(di-p-tolylamino) styryl]stilbene (DPAVB), and N-(4-((E)-2-(6-((E)-4-(diphenylamino)styryl) naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino) pyrene), etc.

The first emission layer EML-1 may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. For example, iridium (III) bis(4,6-difluorophenylpyridinato-N,C2') picolinate (FIrpic), bis(2,4-difluorophenylpyridinato)-tetrakis(1-pyrazolyl) borate iridium (III) (Fir6), platinum octaethyl porphyrin (PtOEP), etc. may be used as a phosphorescent dopant. However, embodiments are not limited thereto.

The first emission layer EML-1 may include a quantum dot material. The quantum dot may be a Group II-VI compound, a Group III-VI compound, a Group I-III-VI compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; or any combination thereof.

The Group III-VI compound may be a binary compound such as $In_2S_3$ and $In_2Se_3$, a ternary compound such as $InGaS_3$ and $InGaSe_3$, or any combination thereof.

The Group I-III-VI compound may be a ternary compound selected from the group consisting of $AgInS$, $AgInS_2$, $CuInS$, $CuInS_2$, $AgGaS_2$, $CuGaS_2$, $CuGaO_2$, $AgGaO_2$, $AgAlO_2$, or any mixture thereof; a quaternary compound such as $AgInGaS_2$ and $CuInGaS_2$; or a combination thereof.

The Group III-V compound may be a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSc, SnPbTe, and a mixture thereof; a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in the particle at a partially different concentration distribution. In an embodiment, the quantum dot may have a core/shell structure in which one quantum dot surrounds another quantum dot. The core/shell structure may have a concentration gradient in which the concentration of an element present in the shell gradually decreases towards the core.

In embodiments, a quantum dot may have the core/shell structure including a core having nano-crystals, and a shell surrounding the core, which are described above. The shell of the quantum dot may be a protection layer that prevents chemical deformation of the core so as to keep semiconductor properties, and/or may be a charging layer that imparts electrophoresis properties to the quantum dot. The shell may be a single layer or may include multiple layers.

Examples of the shell of the quantum dot may be a metal oxide, a non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, or a ternary compound such as $MgAl_2O_4$, $CoFe_2O_4$, $NiFe_2O_4$, and $CoMn_2O_4$, but embodiments are not limited thereto.

Examples of the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

A quantum dot may have a full width of half maximum (FWHM) of a light emitting wavelength spectrum equal to or less than about 45 nm. For example, the quantum dot may have a FWHM of a light emitting wavelength spectrum equal to or less than about 40 nm. For example, the quantum dot may have a FWHM of a light emitting wavelength spectrum equal to or less than about 30 nm. Color purity or color reproducibility may be enhanced in the above ranges. Light emitted through the quantum dot may be emitted in all directions, and thus, a wide viewing angle may be improved.

The form of a quantum dot is not particularly limited as long as it is a form commonly used in the art. For example, a quantum dot may have a spherical shape, a pyramidal shape, a multi-arm shape, or a cubic shape, or the quantum dot may be in the form of nanoparticles, nanotubes, nanowires, nanofibers, nanoplatelets, etc.

The quantum dot may control the color of emitted light according to a particle size thereof, and thus the quantum dot may have various colors of emitted light such as blue, red, green, etc.

In the light emitting element ED of an embodiment illustrated in FIG. 3, the first electron transport region ETR-1 is provided on the first emission layer EML-1. The first electron transport region ETR-1 may include at least one of a hole blocking layer (not shown), an electron transport layer (not shown), and an electron injection layer (not shown), but embodiments are not limited thereto.

The first electron transport region ETR-1 may be a layer formed of a single material, a layer formed of different materials, or a multilayer structure having layers formed of different materials.

For example, the first electron transport region ETR-1 may have a single layer structure of an electron injection layer (not shown) or an electron transport layer (not shown), and may have a single layer structure formed of an electron injection material and an electron transport material. The first electron transport region ETR-1 may have a single layer structure formed of different materials, or may have a structure in which an electron transport layer (not shown)/electron injection layer (not shown), or a hole blocking layer (not shown)/electron transport layer (not shown)/electron injection layer (not shown) are stacked in its respective stated order from the first emission layer EML-1, but embodiments are not limited thereto. The first electron transport region ETR-1 may have, for example, a thickness in a range of about 1,000 Å to about 1,500 Å.

The first electron transport region ETR-1 may be formed using various methods such as a vacuum deposition method, a spin coating method, a cast method, a Langmuir-Blodgett (LB) method, an inkjet printing method, a laser printing method, and a laser induced thermal imaging (LITI) method.

The first electron transport region ETR-1 may include a compound represented by Formula ET-1 below.

[Formula ET-1]

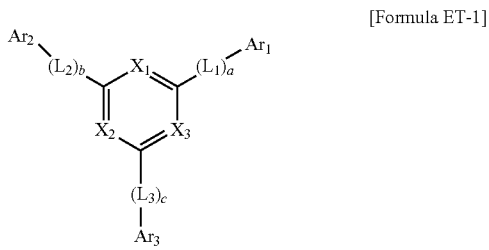

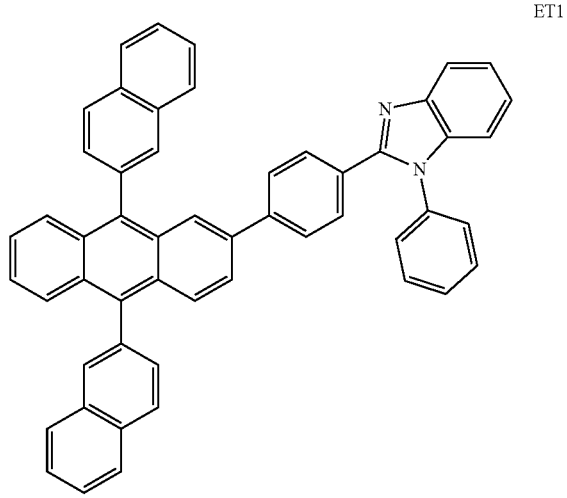

ET1

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The first electron transport region ETR-1 may include an anthracene-based compound. However, embodiments are not limited thereto, and the first electron transport region ETR-1 may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl) anthracene (ADN), 1,3-bis[3,5-di(pyridin-3-yl)phenyl]benzene (BmPyPhB), or a mixture thereof.

The first electron transport region ETR-1 may include at least one selected from Compounds ET1 to ET36 below.

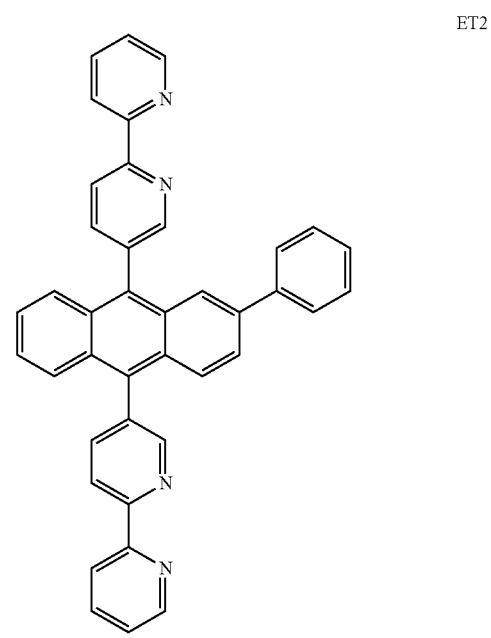

ET2

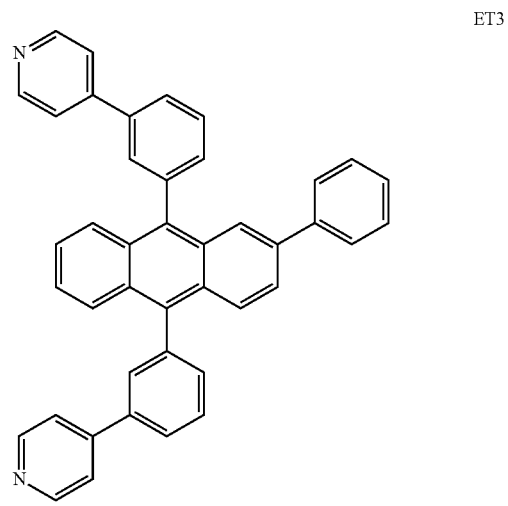

ET3

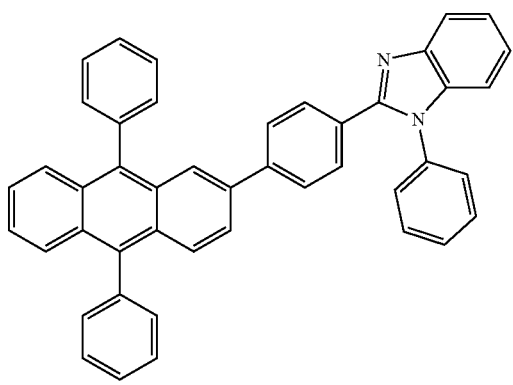
ET4
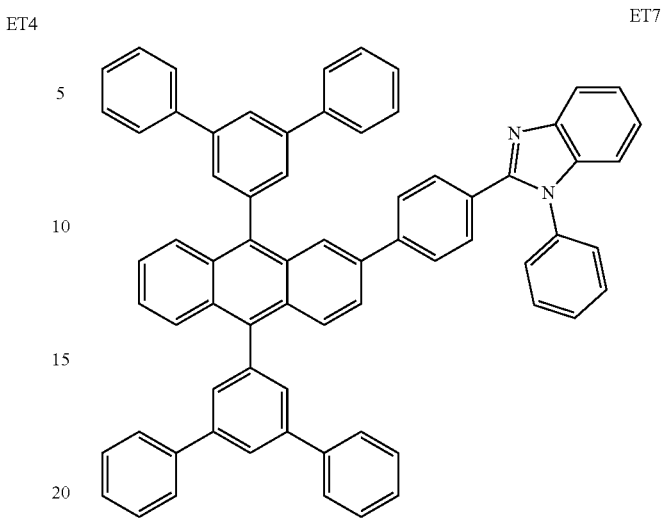
ET5
ET6
ET7
ET8
ET9

ET10
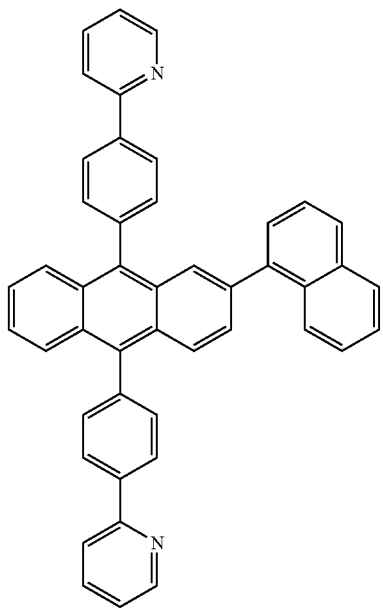
ET11
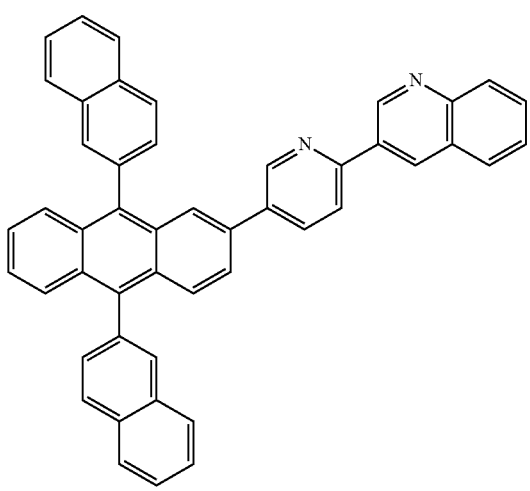
ET12
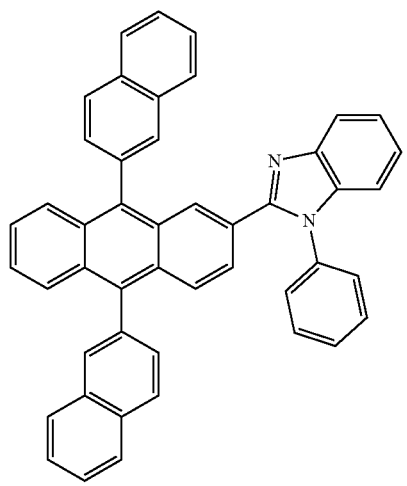
ET13
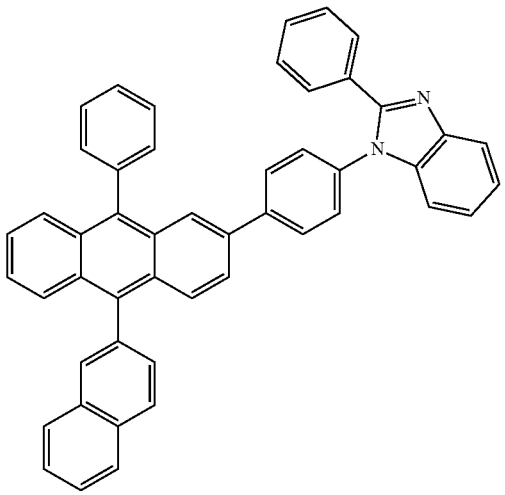
ET14
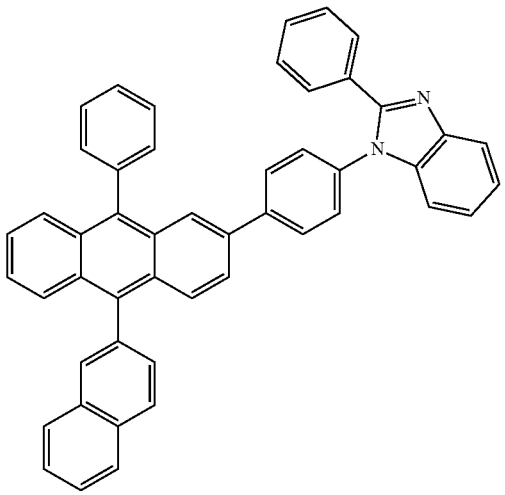
ET15
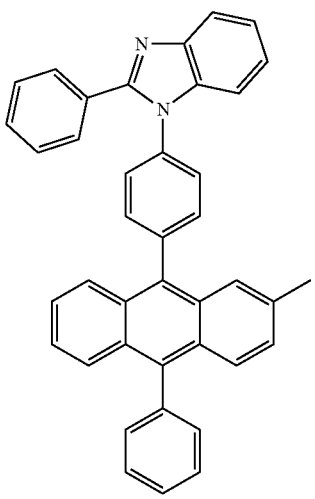

ET16
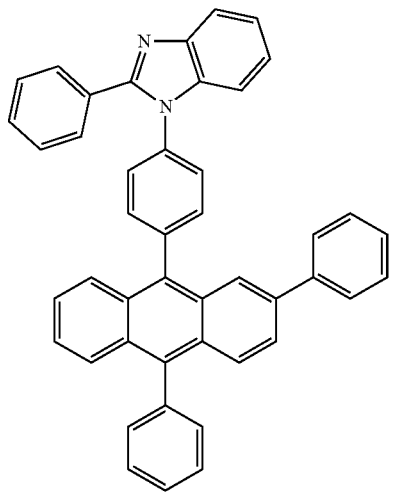
ET17
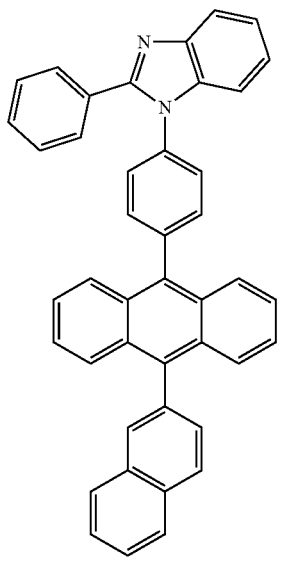
ET18
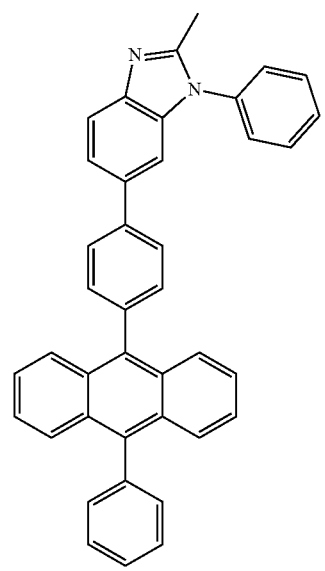
ET19
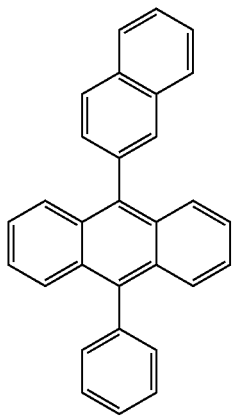
ET20
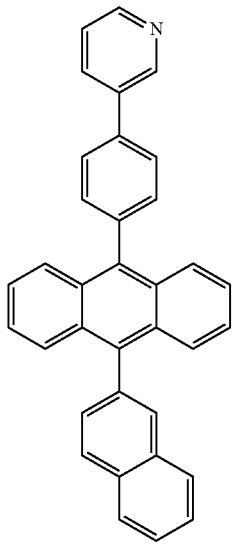
ET21
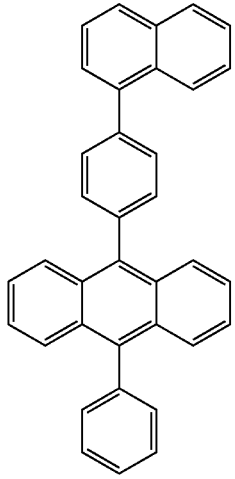

ET22
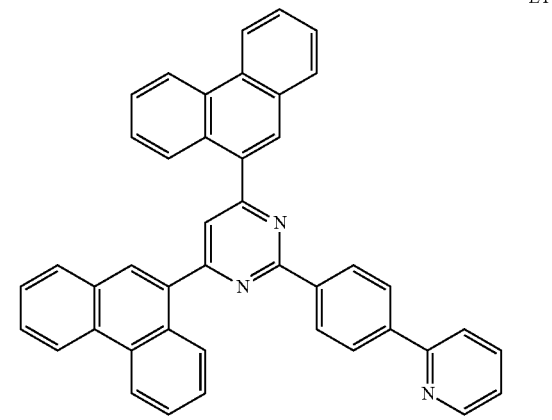
ET23
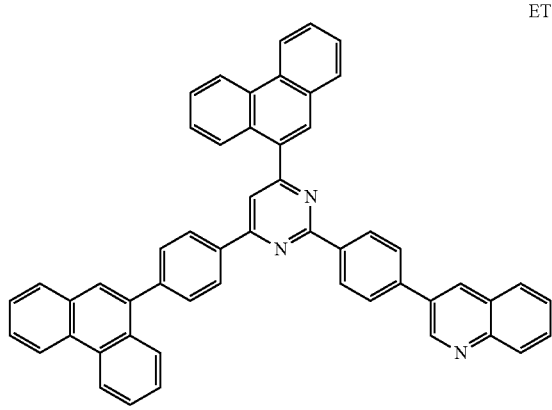
ET24
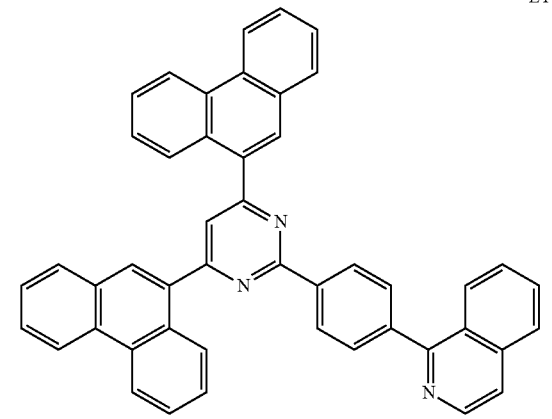
ET25
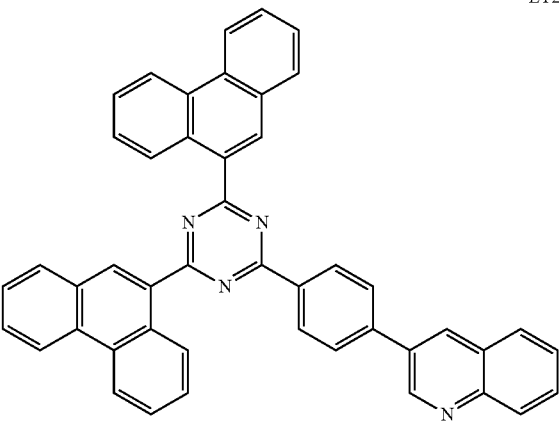
ET26
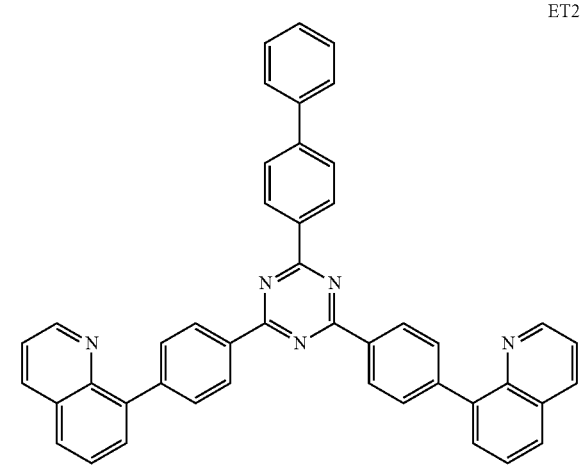
ET27
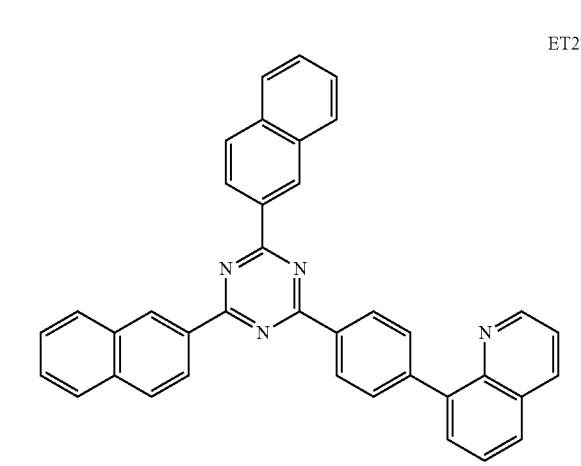
ET28
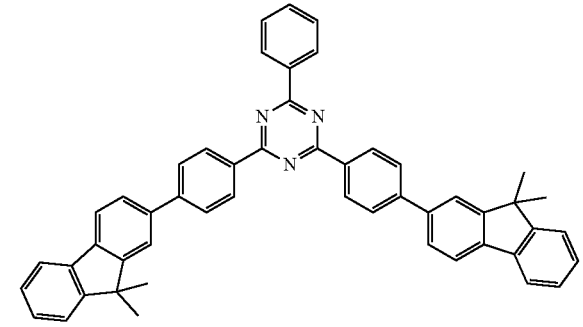

ET29
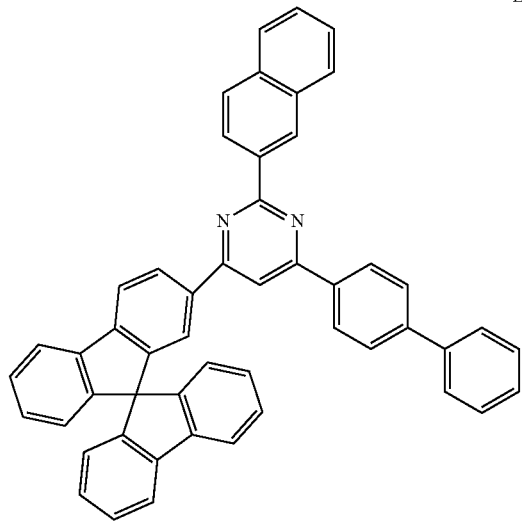
ET30
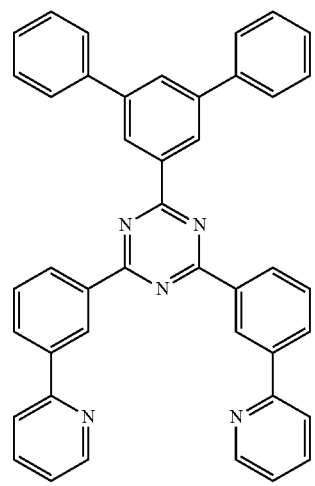
ET31
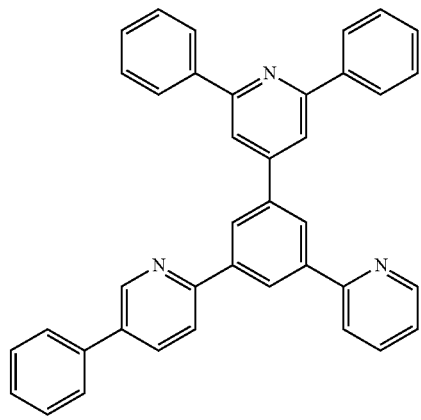
ET32
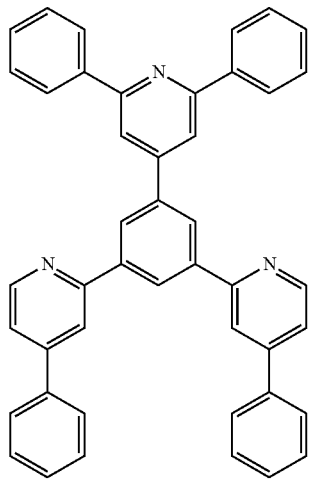
ET33
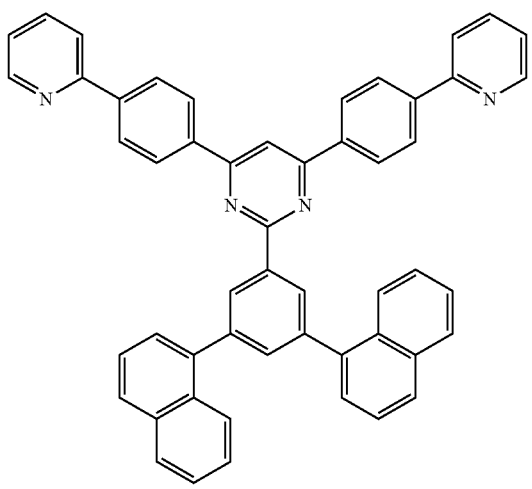
ET34

ET35

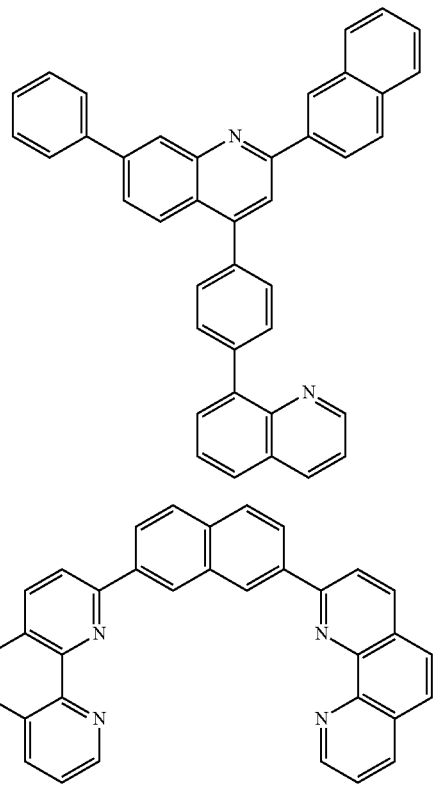

ET36

The first electron transport region ETR-1 may include a halogenated metal such as LiF, NaCl, CsF, RbCl, RbI, CuI, and KI, a lanthanide metal such as Yb, or a co-deposition material of a halogenated metal and a lanthanide metal. For example, the first electron transport region ETR-1 may include KI:Yb, RbI:Yb, etc. as a co-deposition material. The first electron transport region ETR-1 may be formed using a metal oxide such as $Li_2O$ and BaO, or 8-hydroxyl-lithium quinolate (Liq), etc., but embodiments are not limited thereto. The first electron transport region ETR-1 may also be formed of a mixture material of an electron transport material and an insulating organo-metal salt. The organo-metal salt may be a material having an energy band gap equal to or greater than about 4 eV. For example, the organo-metal salt may include metal acetates, metal benzoates, metal acetoacetates, metal acetylacetonates, or metal stearates.

The first electron transport region ETR-1 may further include, for example, at least one of 2,9-dimethyl-4,7-diphenyl-1,10-phenanthroline (BCP) or 4,7-diphenyl-1,10-phenanthroline (Bphen) in addition to the materials described above, but embodiments are not limited thereto.

The first electron transport region ETR-1 may include the compounds of the electron transport region described above in at least one of the electron injection layer (not shown), the electron transport layer (not shown), and the hole blocking layer (not shown).

When the first electron transport region ETR-1 includes an electron transport layer (not shown), the electron transport layer (not shown) may have a thickness in a range of about 100 Å to about 1,000 Å. For example, the electron transport layer (not shown) may have a thickness in a range of about 150 Å to about 500 Å. When the thickness of the electron transport layer (not shown) satisfies the above-described ranges, satisfactory electron transport properties may be obtained without a substantial increase in driving voltage. When the first electron transport region ETR-1 includes an electron injection layer (not shown), the electron injection layer (not shown) may have a thickness in a range of about 1 Å to about 100 Å. For example, the electron injection layer (not shown) may have a thickness in a range of about 3 Å to about 90 Å. When the thickness of the electron injection layer (not shown) satisfies the above-described ranges, satisfactory electron injection properties may be obtained without a substantial increase in driving voltage.

A charge generation layer CGL may be disposed between the first light emitting structure OL-B1 and the second light emitting structure OL-B2, which are adjacent. The charge generation layer CGL may include an N-type charge generation layer CGL1 and a P-type charge generation layer CGL2 disposed on the N-type charge generation layer CGL1.

In an embodiment, the charge generation layer CGL may include a polycyclic compound represented by Formula 1. In an embodiment, the N-type charge generation layer CGL1 of the charge generation layer CGL may include a polycyclic compound represented by Formula 1. The charge generation layer CGL may include a host and a dopant. In an embodiment, the host of the charge generation layer CGL may include a polycyclic compound represented by Formula 1.

[Formula 1]

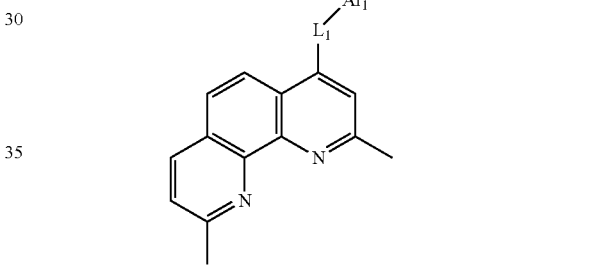

In the polycyclic compound represented by Formula 1, two nitrogen atoms are arranged adjacent to each other to interact with other electrophiles. For example, the two nitrogen atoms of the polycyclic compound represented by Formula 1 may be hydrogen bonded to hydrogen, or coordinately bonded to an alkali metal or an alkaline earth metal. The two nitrogen atoms of the polycyclic compound represented by Formula 1 may be coordinately bonded to an alkali metal or an alkaline earth metal to form a gap state, and as a result, even when the polycyclic compound represented by Formula 1 is used alone as a host material, the polycyclic compound may readily transfer electrons from the N-type charge generation layer CGL1 to the electron transport layer.

The polycyclic compound represented by Formula 1 may include a phenanthroline group represented by Compound P as a core.

[Compound P]

The polycyclic compound represented by Formula 1 has a structure in which a methyl group is substituted at position 2 and at position 9 indicated in compound P. The methyl group serves as an electron donating group (EDG), and may thus increase electron density of the phenanthroline group. When an electron donating group having a large molecular weight is substituted instead of the methyl group, the sublimation temperature rises with an increase in the molecular weight of the compound, which may cause deterioration of an element including the polycyclic compound of an embodiment. The methyl group, which is an electron donating group having a small molecular weight, is substituted in the phenanthroline group, and thus increases the electron density of the phenanthroline group without deterioration of an element, and accordingly, the light emitting element ED including the N-type charge generation layer CGL1 including the same may have improved electron mobility and a low driving voltage. In comparison to when a substituent having large steric hindrance is substituted in the phenanthroline group, the methyl group has small steric hindrance, and thus, is suitable for metal trap by the nitrogen atoms of the phenanthroline group during metal doping.

In the polycyclic compound represented by Formula 1, a group represented by

may be substituted at position 4 indicated in compound P. For example, in Formula 1, a group represented by

may be substituted at position 4 indicated in compound P, and may thus block the phenanthroline group from reacting with other organic compounds. As a result, reduction in stability of the compound, which may be caused when the phenanthroline group reacts with other organic compounds, and accordingly, another substituent is substituted at position 4 may be prevented.

In Formula 1, $L_1$ may be a direct linkage, a substituted or unsubstituted arylene group having 6 to 60 ring-forming carbon atoms, or a substituted or unsubstituted heteroarylene group having 5 to 60 ring-forming carbon atoms. In an embodiment, $L_1$ may be a substituted or unsubstituted divalent phenyl group, or a substituted or unsubstituted divalent biphenyl group.

In Formula 1, $Ar_1$ may be a substituted or unsubstituted aryl group having 6 to 60 ring-forming carbon atoms, excluding anthracene. Anthracene has low triplet energy, and may thus weaken electron transport properties of the charge generation layer.

In an embodiment, in Formula 1, $Ar_1$ may be a substituted or unsubstituted phenyl group, a substituted or unsubstituted naphthyl group, a substituted or unsubstituted perylene group, a substituted or unsubstituted triphenylene group, a substituted or unsubstituted fluoranthene group, a substituted or unsubstituted benzo[C]fluorene group, or a substituted or unsubstituted pyrene group. However, embodiments are not limited thereto, and any group may be used as long as the material is capable of enhancing the electron transport characteristics of the charge generation layer.

In an embodiment, in Formula 1, $Ar_1$ may be a group represented by Formula 3 below.

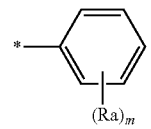

[Formula 3]

In Formula 3, m may be an integer from 0 to 5. For example, when m is 0, Ra may not be substituted, when m is 1, one Ra group may be substituted, and when m is 2, two Ra groups may be substituted.

In Formula 3, Ra may be a substituted or unsubstituted alkyl group having 1 to 20 carbon atoms, a substituted or unsubstituted alkylene group having 2 to 20 carbon atoms, a substituted or unsubstituted phosphine oxide group, a substituted or unsubstituted aryl group having 6 to 16 ring-forming carbon atoms, or may be bonded to an adjacent group to form a ring. When m is 2 or greater, multiple Ra groups may be substituted, multiple Ra groups may be the same, or at least one Ra group may be different from the others.

In Formula 1, $Ar_1$ may be bonded to a phenanthroline group with $L_1$ therebetween. For example, $Ar_1$ may be directly bonded to the phenanthroline group, or may be bonded to the phenanthroline group with a substituted or unsubstituted arylene group having 6 to 60 carbon atoms, or a substituted or unsubstituted heteroarylene group having 5 to 60 ring-forming carbon atoms therebetween.

In an embodiment, in Formula 1, $L_1$ may be a group represented by Formula 2 below.

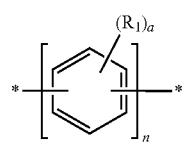

[Formula 2]

In Formula 2, n may be 1 or 2. For example, when n is 1, $L_1$ may be a substituted or unsubstituted divalent phenyl group, and when n is 2, $L_1$ may be a substituted or unsubstituted divalent biphenyl group.

In Formula 2, a may be an integer from 0 to 4. For example, when a is 0, $R_1$ may be unsubstituted in the arylene group of Formula 2. When a is 1, one $R_1$ group may be substituted in the arylene group of Formula 2. When a is 2, two $R_1$ groups may be substituted in the arylene group of Formula 2. In Formula 2, $R_1$ may be a substituted or unsubstituted aryl group having 6 to 60 ring-forming carbon atoms.

In an embodiment, the group represented by Formula 2 may be represented by any one of Formulas 2A-1 to 2A-4 below. In Formulas 2A-1 and 2A-2, n is 1, and in Formulas 2A-3 and 2A-4, n is 2. In Formula 2A-1, as a phenanthroline core and $Ar_1$ are at para-positions in a divalent phenyl group, and in Formula 2A-2, the phenanthroline core and $Ar_2$ are at meta-positions in the divalent phenyl group. In Formula 2A-3, the phenanthroline core is, in a divalent phenyl group to which the phenanthroline group is directly bonded, of the divalent biphenyl group, at the para-position with a divalent phenyl group to which the phenanthroline group is not directly bonded, and Ar₁ is, in the divalent phenyl group to which the phenanthroline group is not directly bonded, at the para-position with the divalent phenyl group to which the phenanthroline group is directly bonded. In Formula 2A-4, the phenanthroline core is, in the divalent phenyl group to which the phenanthroline group is directly bonded, of the divalent biphenyl group, at the meta-position with the divalent phenyl group to which the phenanthroline group is not directly bonded, and Ar₁ is, in the divalent phenyl group to which the phenanthroline group is not directly bonded, at the meta-position with the divalent phenyl group to which the phenanthroline group is directly bonded.

[Formula 2A-1]

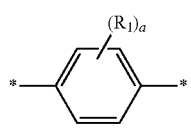

[Formula 2A-2]

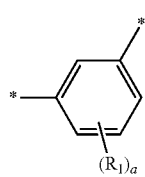

[Formula 2A-3]

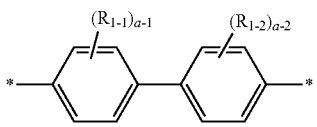

[Formula 2A-4]

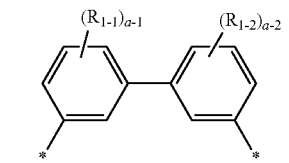

In Formulas 2A-1 and 2A-4, "*—" represents a binding site to which Ar₁ and the phenanthroline group are each bonded to.

In Formulas 2A-1 and 2A-2, R₁ and a may be the same as defined in connection with Formula 2 above.

In Formulas 2A-3 and 2A-4, a, a-1, and a-2 may be each independently an integer from 0 to 4. In Formulas 2A-3 and 2A-4, a-1 and a-2 may be the same as or different from each other. For example, in Formulas 2A-3 and 2A-4, a-1 and a-2 may be all 0, 1, 2, 3, or 4; a-1 may be 0 and a-2 may be an integer from 1 to 4; a-1 may be 1 and a-2 may be 0, or may be 2 to 4; a-1 may be 2 and a-2 may be 0, 1, 3, or 4; a-1 may be 3 and a-2 may be 0, 1, 2, or 4; or a-1 may be 4 and a-2 may be an integer from 0 to 3.

In Formulas 2A-3 and 2A-4, R₁₋₁ and R₁₋₂ may each independently be a substituted or unsubstituted aryl group having 6 to 60 ring-forming carbon atoms. R₁₋₁ and R₁₋₂ may be the same as or different from each other.

In the polycyclic compound of an embodiment, the phenanthroline group and the substituent Ar₁ are present at the meta-positions or at the para-positions around a linker group, and may thus have higher electron transporting properties than when the phenanthroline group and the substituent Ar₁ are present at ortho-positions around a linker group.

When the phenanthroline group and the substituent Ar₁ are present at the ortho-positions around the linker group, the phenanthroline group, L₁, and Ar₁ may not be present on a same plane due to steric hindrance between Ar₁ and the phenanthroline group. Accordingly, a plane type structure is not achievable, and thus, multiple resonance effect may be insufficient, resulting in reduced electron mobility.

In the polycyclic compound of an embodiment, the phenanthroline group and the substituent Ar₁ are present at the meta-positions or at the para-positions around the linker group, and thus, the steric hindrance between Ar₁ and the phenanthroline group is small. Accordingly, stability of the molecular structure is achieved, the plane type structure in which multiple resonance effect is sufficiently achieved, resulting in increased electron mobility of the polycyclic compound of an embodiment, which may lead to high luminous efficiency.

In an embodiment, in Formula 1, Ar₁ may be a group represented by one selected from Formulas S1 to S19.

S1

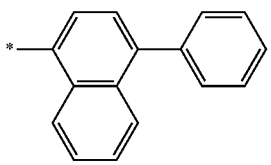

S2

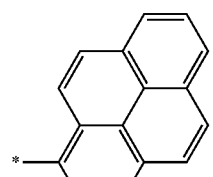

S3

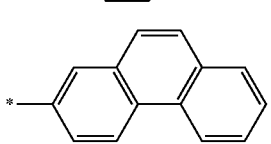

S4

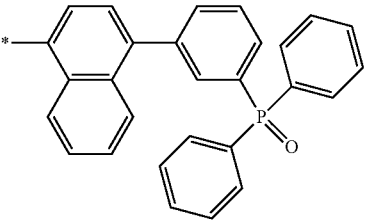

S5

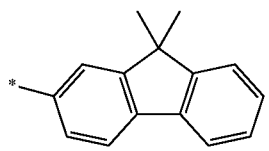

S6

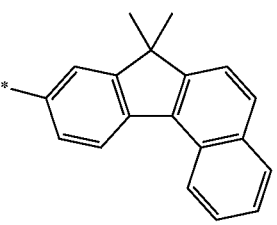

S7
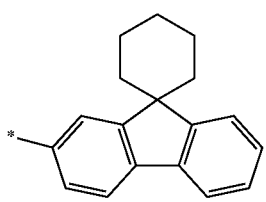
S8
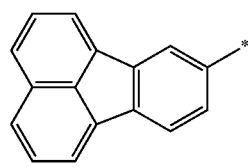
S9
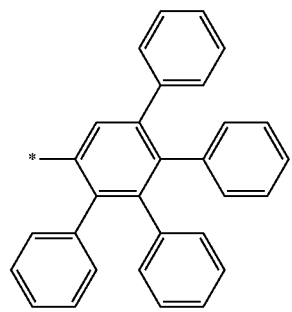
S10
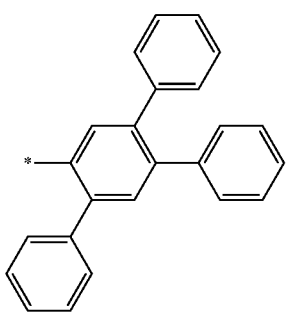
S11
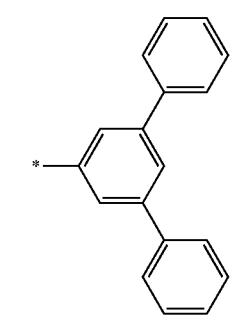
S12
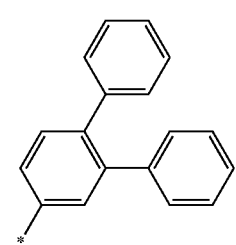
S13
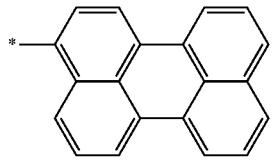
S14
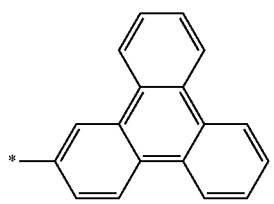
S15
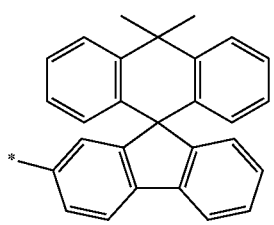
S16
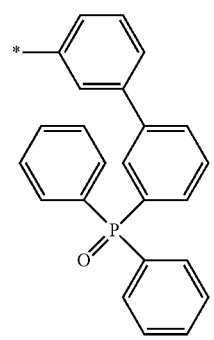
S17
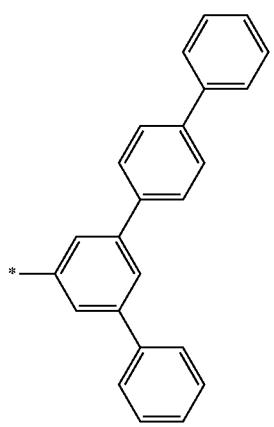

S18

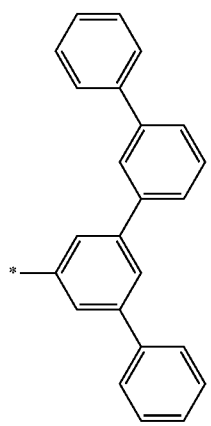

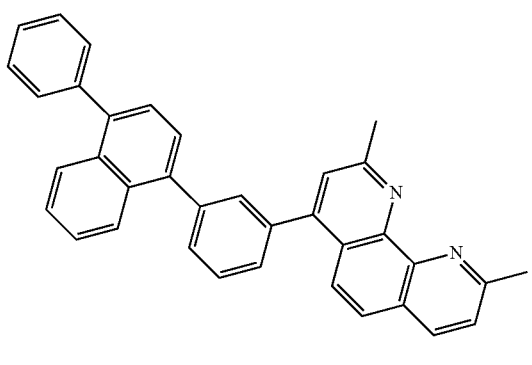

S19

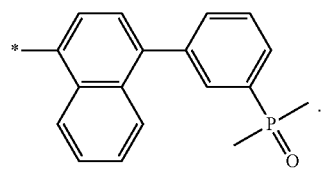

In Formulas S1 to S19, "*—" represents a site where Ar$_1$ is bonded to L$_1$.

In an embodiment, a charge generation layer may include at least one polycyclic compound selected from Compound Group 1 below. For example, the charge generation layer may include one polycyclic compound selected from the polycyclic compounds of Compound Group 1, or may include multiple polycyclic compounds.

[Compound Group 1]

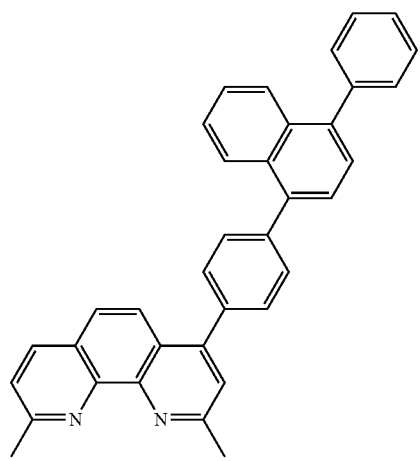

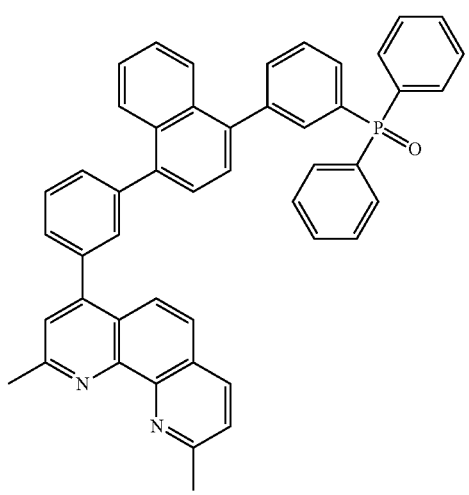

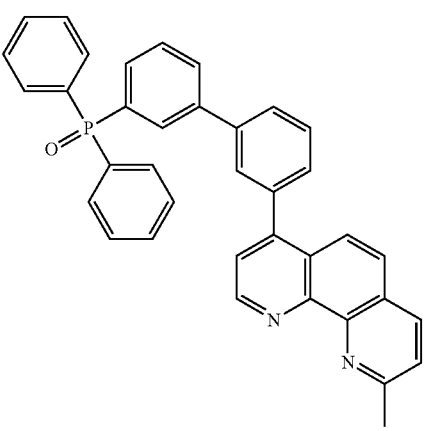

5
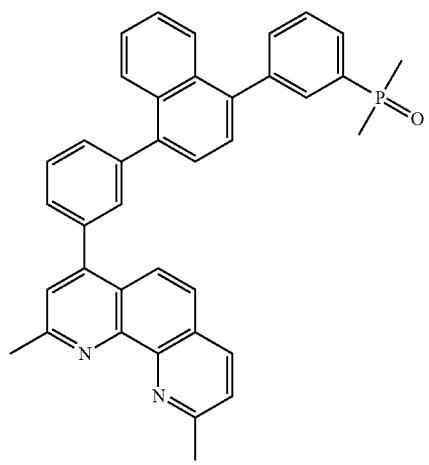
6
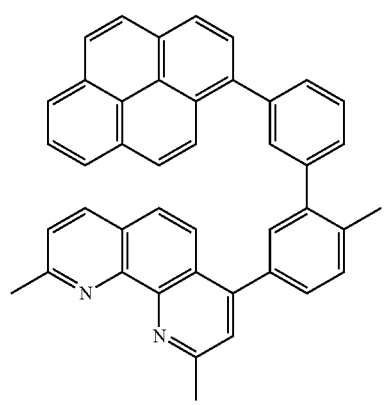
7
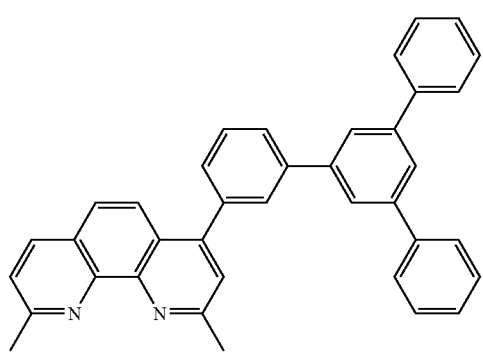
8
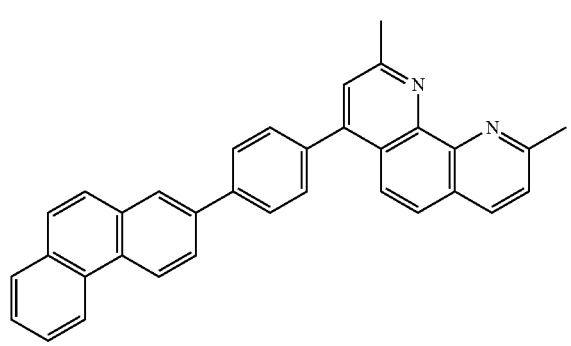
9
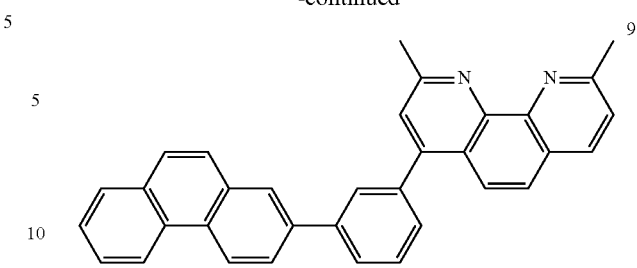
10
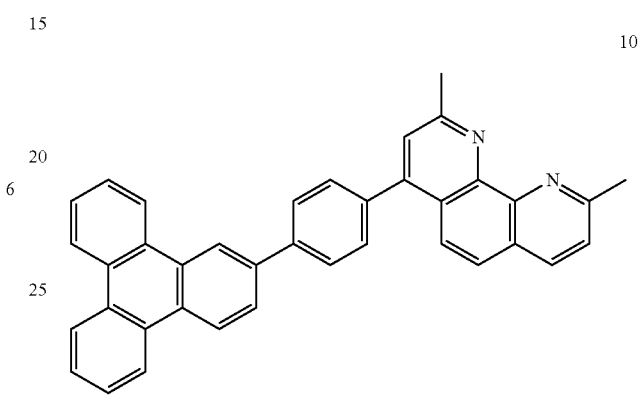
11
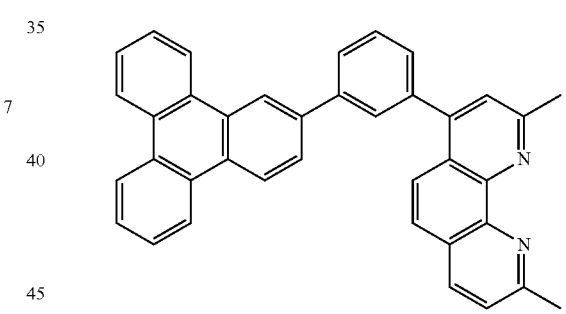
12
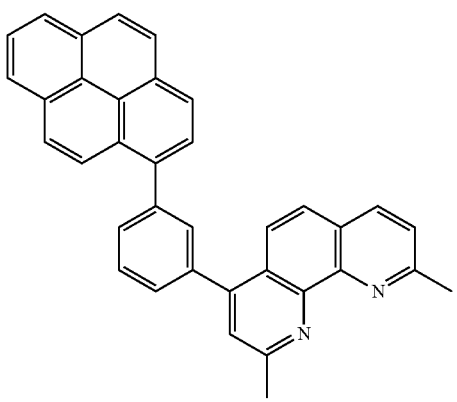

13
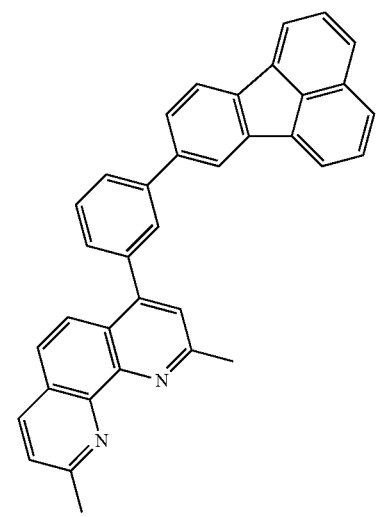
14
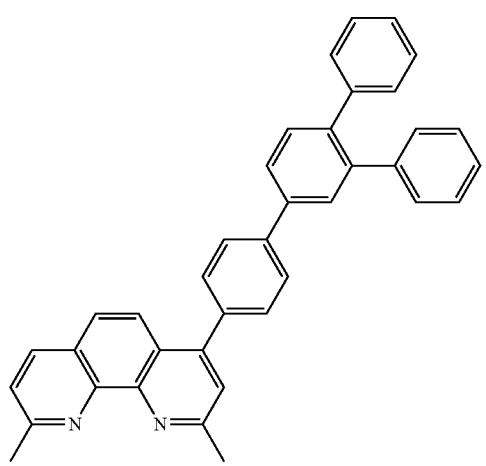
15
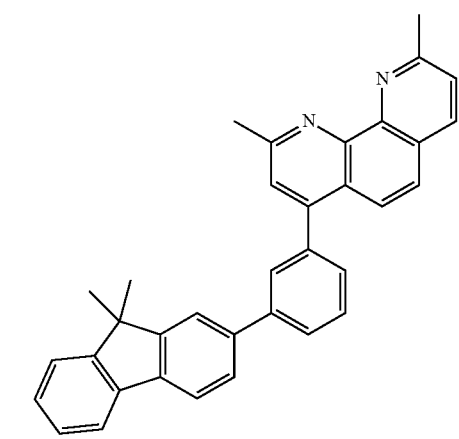
16
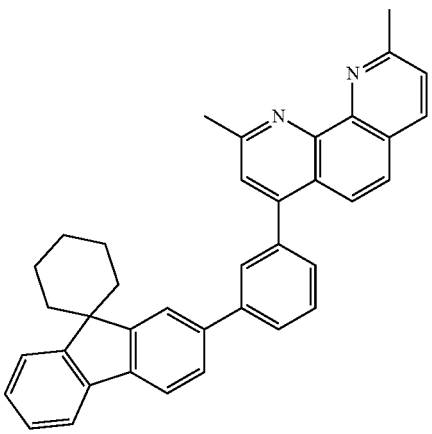
17
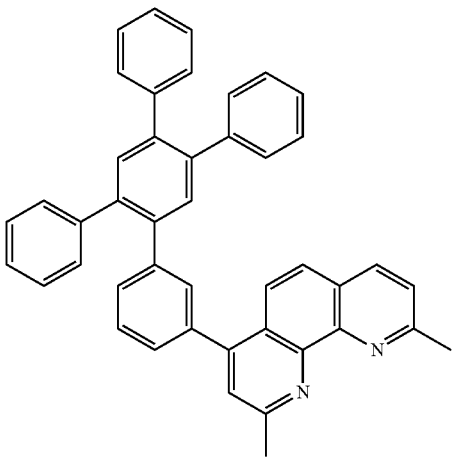
18

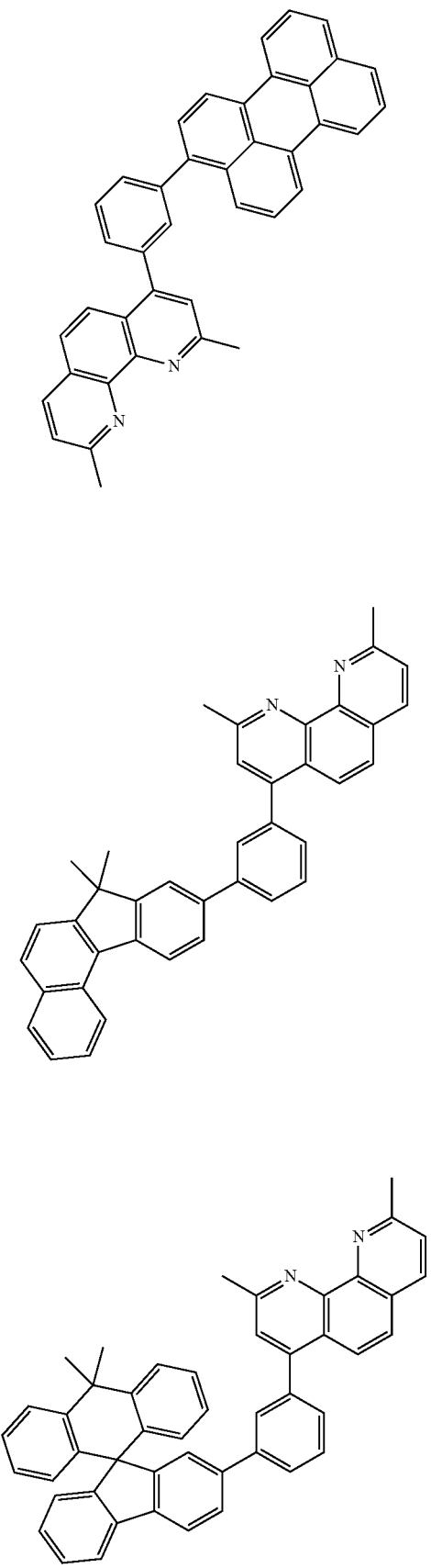

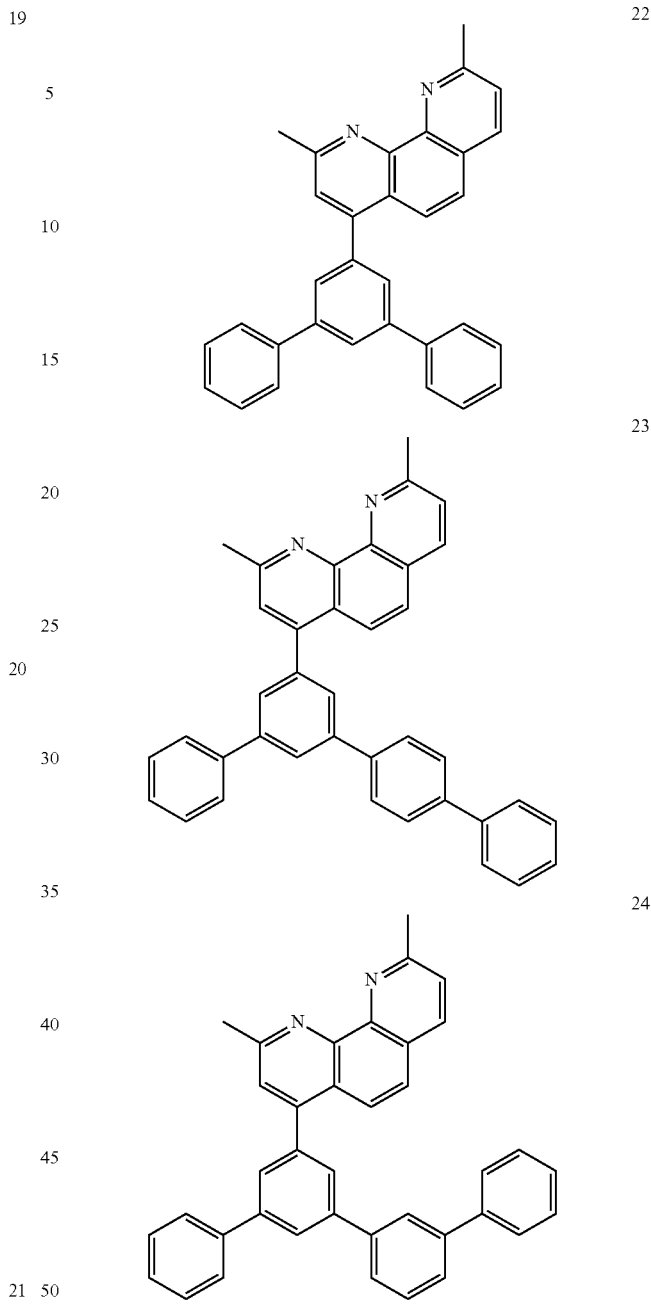

In an embodiment, the second light emitting structure OL-B2 may be disposed on the charge generation layer CGL. The second light emitting structure OL-B2 may include a second hole transport region HTR-2, a second emission layer EML-2 disposed on the second hole transport region HTR-2, and a second electron transport region ETR-2 disposed on the second emission layer EML-2. The descriptions of the first hole transport region HTR-1, the first emission layer EML-1, and the first electron transport region ETR-1 may be equally applied to the second hole transport region HTR-2, the second emission layer EML-2, and the second electron transport region ETR-2 included in the second light emitting structure OL-B2, respectively.

The second electrode EL2 is provided on the electron transport region ETR-2. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). For example, LiF/Ca may be a two-layer structure in which LiF is stacked on Ca, and LiF/Al may be a two-layer structure in which LiF is stacked on Al. In another embodiment, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to the auxiliary electrode, the resistance of the second electrode EL2 may decrease.

Figure 4:
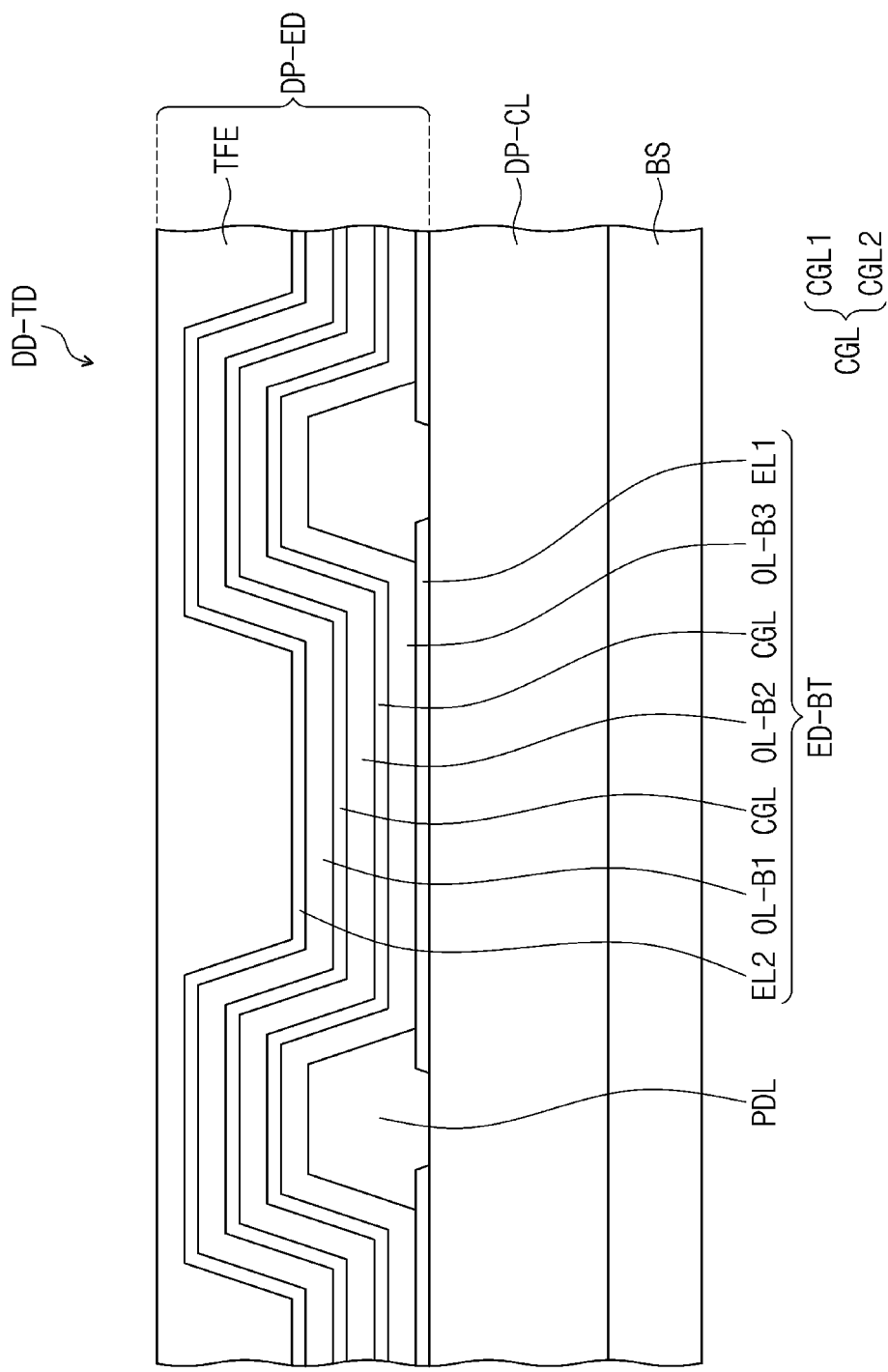
FIG. 4 is a schematic cross-sectional view of a display device according to an embodiment.

FIG. 4 is a schematic cross-sectional view showing a portion of a display device according to an embodiment. FIG. 4 shows a schematic cross-sectional view of a portion corresponding to the display panel DP of FIG. 2.

Referring to FIG. 4, in a display device DD-TD of an embodiment, a light emitting element ED-BT may include light emitting structures OL-B1, OL-B2, and OL-B3. The light emitting element ED-BT may include a first electrode EL1 and a second electrode EL2 facing each other, and light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include a first emission layer EML-1 (FIG. 3), and a hole transport region HTR and an electron transport region ETR disposed with the first emission layer EML-1 (FIG. 3) therebetween.

For example, the light emitting element ED-BT included in the display device DD-TD of an embodiment may be a light emitting element having a tandem structure including multiple emission layers.

In an embodiment shown in FIG. 4, light emitted from each of the light emitting structures OL-B1, OL-B2, and OL-B3 may all be blue light. However, embodiments are not limited thereto, and wavelength ranges of light emitted from each of the light emitting structures OL-B1, OL-B2, and OL-B3 may be different from each other. For example, the light emitting element ED-BT including the light emitting structures OL-B1, OL-B2, and OL-B3 emitting light in different wavelength ranges may emit white light.

The charge generation layer CGL may be disposed between neighboring light emitting structures OL-B1, OL-B2, and OL-B3. The charge generation layer CGL may include the N-type charge generation layer CGL1 (FIG. 3), and the P-type charge generation layer CGL2 (FIG. 3) disposed on the N-type charge generation layer CGL1 (FIG. 3).

FIG. 5 is a schematic cross-sectional view of a display device according to an embodiment. Hereinafter, in the description of the display device according to an embodiment with reference to FIG. 5, content overlapping with the descriptions of FIGS. 1 to 4 will not be described again, and the differences will be described.

Referring to FIG. 5, the display device DD according to an embodiment may include a display panel DP having a display element layer DP-ED, a light control layer CCL disposed on the display panel DP, and a color filter layer CFL.

In an embodiment shown in FIG. 5, the display panel DP may include a base layer BS, a circuit layer DP-CL provided on the base layer BS, and a display element layer DP-ED, and the element layer DP-ED may include a light emitting element ED.

The light emitting element ED may include a first electrode EL1, a light emitting unit OL-C, and a second electrode EL2 disposed on the light emitting unit OL-C. A structure of the light emitting element ED shown in FIG. 4 may be the same as the structure of the light emitting element of FIGS. 3 and 4 described above.

Referring to FIG. 5, the light emitting unit OL-C may be disposed in the openings OH defined in the pixel defining film PDL. For example, the light emitting unit OL-C separated by the pixel defining film PDL and provided corresponding to each of light emitting areas PXA-R, PXA-G, and PXA-B may emit light in a same wavelength range. In the display device DD of an embodiment, the light emitting unit OL-C may emit blue light. Although not shown in the drawings in an embodiment, the light emitting unit OL-C may be provided as a common layer throughout the light emitting areas PXA-R, PXA-G, and PXA-B.

The light control layer CCL may be disposed on the display panel DP. The light control layer CCL may include a photoconverter. The photoconverter may be a quantum dot or a phosphor. The photoconverter may convert the wavelength of received light, and emit the resulting light. For example, the light control layer CCL may be a layer including quantum dots or phosphors.

The light control layer CCL may include light control units CCP1, CCP2, and CCP3. The light control units CCP1, CCP2, and CCP3 may be spaced apart from each other.

Referring to FIG. 5, a division pattern BMP may be disposed between the light control units CCP1, CCP2, and CCP3, which are spaced apart from each other, but embodiments are not limited thereto. In FIG. 5, the division pattern BMP does not overlap the light control units CCP1, CCP2, and CCP3, but in an embodiment, edges of the light control units CCP1, CCP2, and CCP3 may overlap at least a portion of the division pattern BMP.

The light control layer CCL may include a first light control unit CCP1 including a first quantum dot QD1 for converting first color light provided from the light emitting element ED into second color light, a second light control unit CCP2 including a second quantum dot QD2 for converting the first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting element ED. For example, a first quantum dot QD1 may be a red quantum dot and a second quantum dot QD2 may be a green quantum dot. The same descriptions provided above with respect to quantum dots may be applied to quantum dots QD1 and QD2.

The light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be inorganic particles. For example, the scatterers SP may include at least one of $TiO_2$, ZnO, $Al_2O_3$, $SiO_2$, and hollow silica. The scatterers SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may each include base resins BR1, BR2, and BR3 for dispersing the quantum dots QD1 and QD2 and the scatterer SP. In an embodiment, the first light control unit CCP1 may include the first quantum dot QD1 and the scatterer SP dispersed in the first base resin BR1, the second light control unit CCP2 may include the second quantum dot QD2 and the scatterer SP dispersed in the second base resin BR2, and the third light control unit CCP3 may include the scatterer SP dispersed in the third base resin BR3. The base resins BR1, BR2, and BR3 are a medium in which the quantum dots QD1 and QD2 and the scatterer SP are dispersed, and may be formed of various resin compositions, which may be referred to as a binder. For example, the base resins BR1, BR2, and BR3 may be an acrylic resin, a urethane-based resin, a silicone-based resin, an epoxy-based resin, etc. The base resins BR1, BR2, and BR3 may be transparent resins. In an embodiment, the first base resin BR1, the second base resin BR2, and the third base resin BR3 may each be the same as or different from each other.

The light control layer CCL may include a barrier layer BFL1. The barrier layer BFL1 may prevent moisture and/or oxygen (hereinafter referred to as "moisture/oxygen") from being introduced. The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may each include at least one inorganic layer. For example, the barrier layers BFL1 and BFL2 may be formed of an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The barrier layers BFL1 and BFL2 may each further include an organic film. The barrier layers BFL1 and BFL2 may each be formed of a single layer or of multiple layers.

In the display device DD of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include a light blocking unit BM and filters CF1, CF2, and CF3. For example, the color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. The filters CF1, CF2, and CF3 may each include a polymer photosensitive resin, a pigment, or a dye. The first filter CF1 may include a red pigment or a red dye, the second filter CF2 may include a green pigment or a green dye, and the third filter CF3 may include a blue pigment or a blue dye. However, embodiments are not limited thereto, and the third filter CF3 may not include a pigment or a dye. The third filter CF3 may include a polymer photosensitive resin, but not include a pigment or a dye. The third filter CF3 may be transparent. The third filter CF3 may be formed of a transparent photosensitive resin.

In an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may include an organic light blocking material or an inorganic light blocking material, each including a black pigment or a black dye. The light blocking unit BM may prevent light leakage, and may separate boundaries between the adjacent filters CF1, CF2, and CF3. In an embodiment, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

The base substrate BL may be disposed on the color filter layer CFL. The base substrate BL may provide a base surface on which the color filter layer CFL and the light control layer CCL are disposed. The base substrate BL may be a glass substrate, a metal substrate, a plastic substrate, etc. However, embodiments are not limited thereto, and the base substrate BL may be an inorganic layer, an organic layer, or a composite material layer. Although not shown in the drawings, in an embodiment, the base substrate BL may be omitted.

Hereinafter, with reference to Examples and Comparative Examples, a polycyclic compound and a light emitting element according to an embodiment will be described. The Examples shown below are presented only for the understanding of the disclosure, and the scope thereof is not limited thereto.

EXAMPLES

1. Synthesis of Example Compounds

A process of synthesizing compounds according to an embodiment will be described in detail by presenting a process of synthesizing Compounds 1 to 24 as an example. A process of synthesizing polycyclic compounds, which will be described hereinafter, is provided as an example, but a process of synthesizing compounds according to an embodiment is not limited to the Examples below.

(1) Synthesis of Compound 1

Compound according to an embodiment may be synthesized by, for example, steps disclosed in Reaction Formula 1 below.

[Reaction Formula 1]

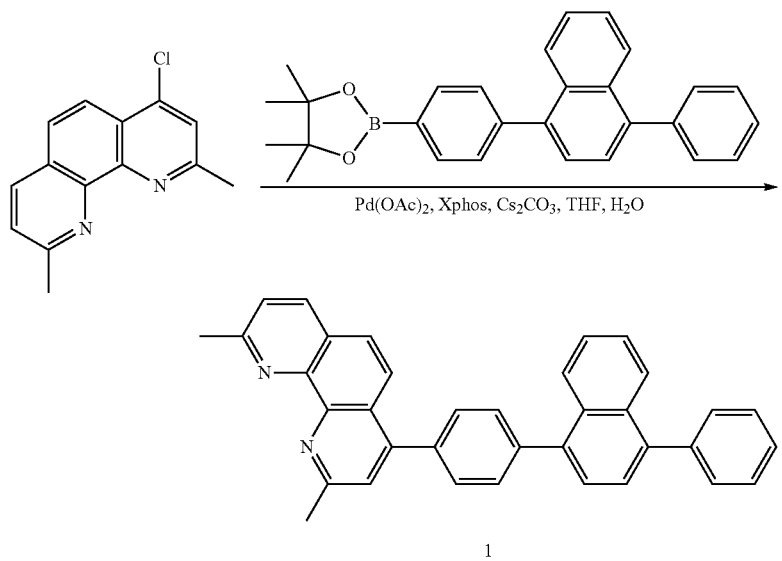

5 g of 4-Chloro-2,9-dimethyl-1,10-phenanthroline (20.6 mmol), 8.4 g of 4,4,5,5-tetramethyl-2-(4-(4-phenylnaphthalene-1-yl)phenyl)-1,3,2-dioxaborolane (20.6 mmol), 0.2 g of Pd(OAc)$_2$ (1.0 mmol), 1.0 g of Xphos (2.1 mmol), and 13.5 g of Cs$_2$CO$_3$ (41.3 mmol) were added to a mixed solvent of 50 ml of toluene, 10 ml of ethanol, and 10 ml of water, and the resultant mixture was heated to reflux for 12 hours. After the reaction was completed, an organic layer was extracted with methylene chloride, and filtered after magnesium sulfate was added thereto. After removing the solvent of the filtered organic layer, 7.0 g of Compound 1 (yield 70%) was obtained using column chromatography.

[LCMS]: 487

(2) Synthesis of Compound 2

Compound 2 according to an embodiment may be synthesized by, for example, steps disclosed in Reaction Formula 2 below.

-continued

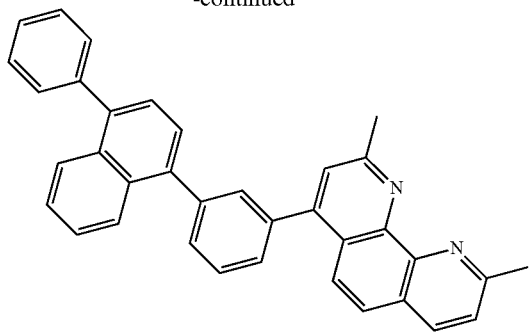

[Reaction Formula 2]

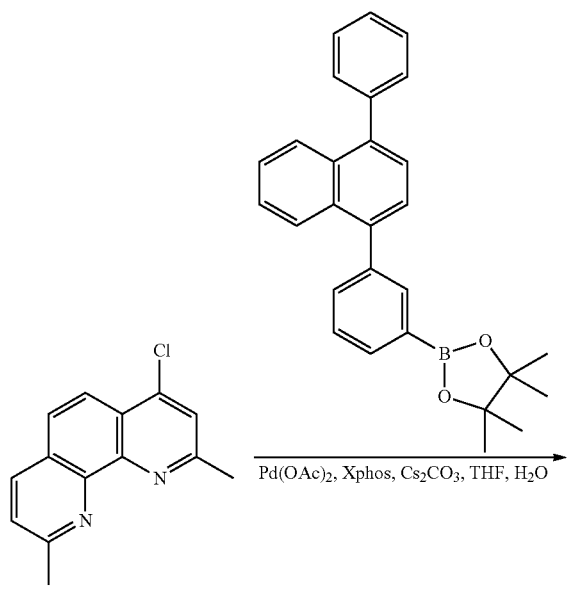

7.0 g of polycyclic compound 2 (yield 70%) was obtained in a same manner as in the synthesis of Compound 1, except that 4,4,5,5-tetramethyl-2-(3-(4-phenyltaphthalene-1-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 487

(3) Synthesis of Compound 3

Compound 3 according to an embodiment may be synthesized by, for example, steps disclosed in Reaction Formula 3 below.

[Reaction Formula 3]

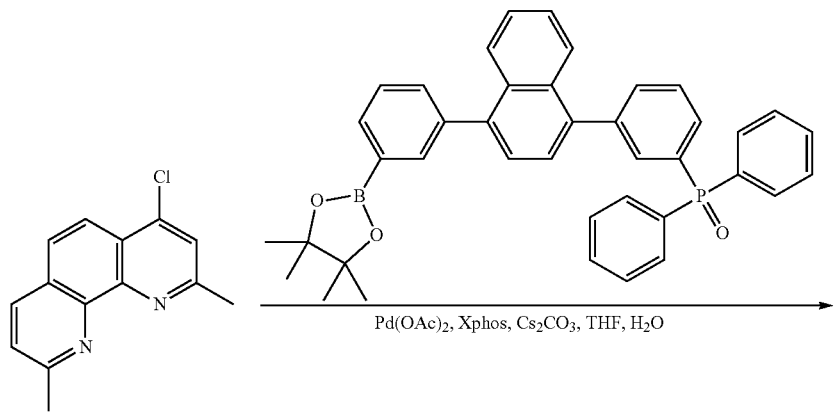

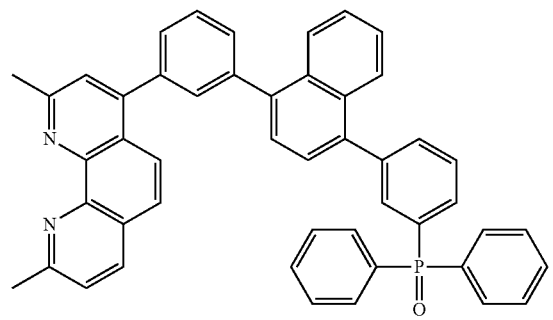

3

10.3 g of Compound 3 (yield 73%) was obtained in a same manner as in the synthesis of Compound 1, except that diphenyl(3-(4-(3-(4,4,5,5-tetramethyl-1,3,2-dioxaborolane-2-yl)phenyl) naphthalene-1-yl)phenyl)phosphine oxide was used instead of 4,4,5,5-tetramethyl-2-(4-(4-phenylnaphthalene-1-yl)phenyl)-1,3,2-dioxaborolane used in the synthesis of Compound 1.

[LCMS]: 687

(4) Synthesis of Compound 4

Compound 4 according to an embodiment may be synthesized by, for example, steps disclosed in Reaction Formula 4 below.

[Reaction Formula 4]

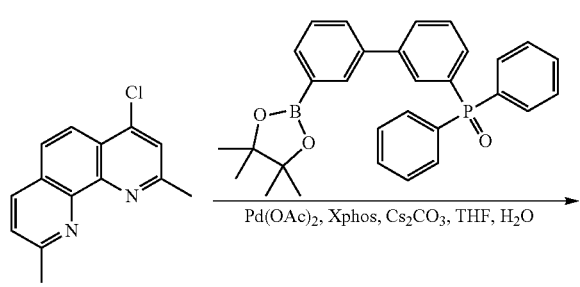

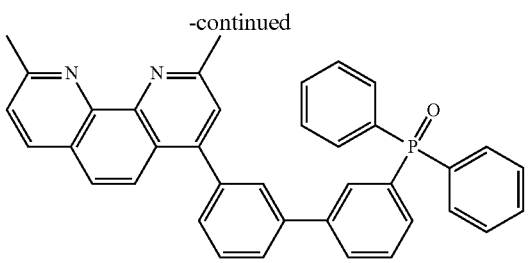

4

8.4 g of Compound 4 (yield 73%) was obtained in a same manner as in the synthesis of Compound 1, except that diphenyl(3-(4,4,5,5-tetramethyl-1,3,2-dioxaborolane-2-yl) (1,1-biphenyl) 3-yl)phosphine oxide was used instead of 4,4,5,5-tetramethyl-2-(4-(4-phenylnaphthalene-1-yl)phenyl)-1,3,2-dioxaborolane used in the synthesis of Compound 1.

[LCMS]: 561

(5) Synthesis of Compound 5

Compound according to an embodiment may be synthesized by, for example, steps disclosed in Reaction Formula 5 below.

[Reaction Formula 5]

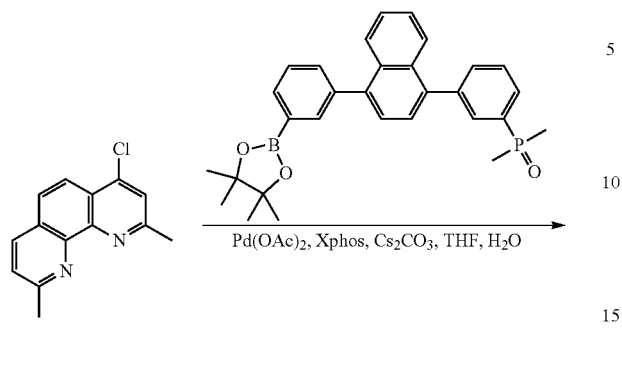

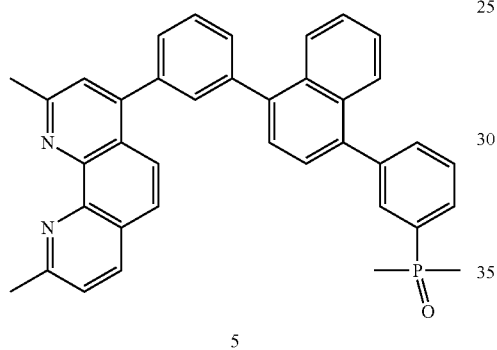

5

8.5 g of Compound 5 (yield 73%) was obtained in a same manner as in the synthesis of Compound 1, except that dimethyl (3-(4-(3-(4,4,5,5-tetramethyl-1,3,2-dioxaborolane-2-yl)phenyl) naphthalene-1-yl)phenyl)phosphine oxide was used instead of 4,4,5,5-tetramethyl-2-(4-(4-phenylnaphthalene-1-yl)phenyl)-1,3,2-dioxaborolane used in the synthesis of Compound 1.

[LCMS]: 563

(6) Synthesis of Compound 6

Compound 6 according to an embodiment may be synthesized by, for example, steps disclosed in Reaction Formula 6 below.

[Reaction Formula 6]

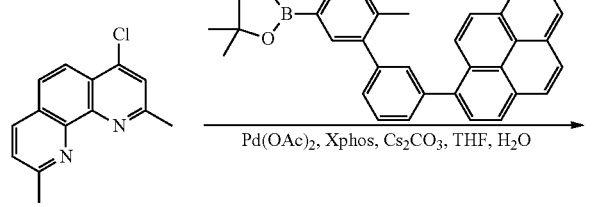

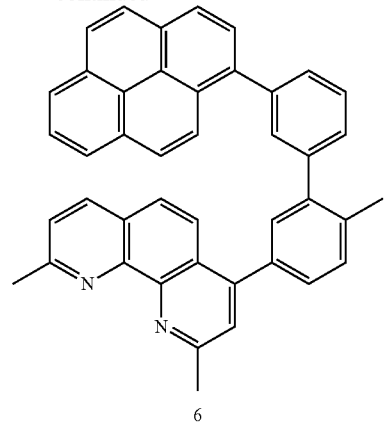

6

8.3 g of Compound 6 (yield 70%) was obtained in a same manner as in the synthesis of Compound 1, except that 4,4,5,5-tetramethyl-2-(6-methyl-3'-(pyrene-1-yl)-[1,1'-biphenyl]-3-yl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 575

(7) Synthesis of Compound 7

Compound 7 according to an embodiment may be synthesized by, for example, steps disclosed in Reaction Formula 7 below.

[Reaction Formula 7]

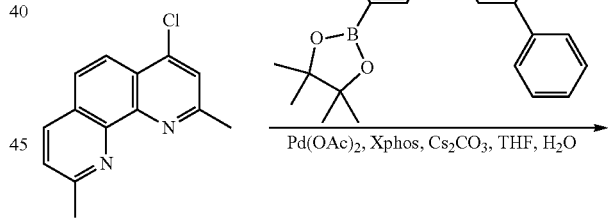

7

8.0 g of Compound 7 (yield 75%) was obtained in a same manner as in the synthesis of Compound 1, except that 4,4,5,5-tetramethyl-2-(5'-phenyl-[1,1':3',1''-terphenyl]-3-yl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 513

(8) Synthesis of Compound 8

Compound 8 according to an embodiment may be synthesized by, for example, steps disclosed in Reaction Formula 8 below.

[Reaction Formula 8]

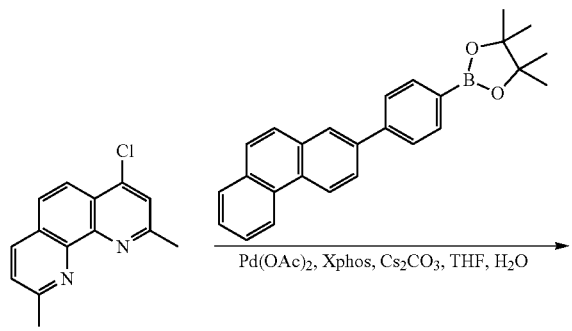

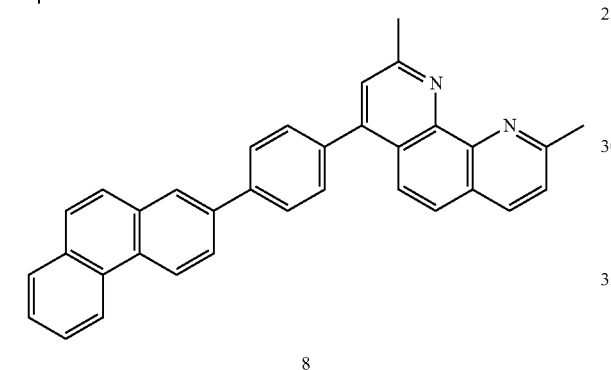

8

7.0 g of Compound 8 (yield 74%) was obtained in a same manner as in the synthesis of Compound 1, except that 4,4,5,5-tetramethyl-2-(4-(phenanthrene-2-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 460

(6) Synthesis of Compound 9

Compound 9 according to an embodiment may be synthesized by, for example, steps disclosed in Reaction Formula 9 below.

[Reaction Formula 9]

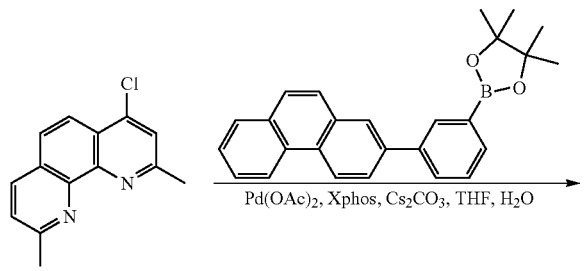

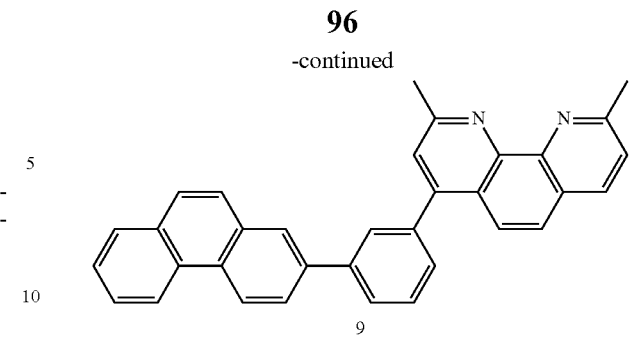

9

7.0 g of Compound 9 (yield 74%) was obtained in a same manner as in the synthesis of Compound 1, except that 4,4,5,5-tetramethyl-2-(3-(phenanthrene-2-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 460

(10) Synthesis of Compound 10

Compound 10 according to an embodiment may be synthesized by, for example, steps disclosed in Reaction Formula 10 below.

[Reaction Formula 10]

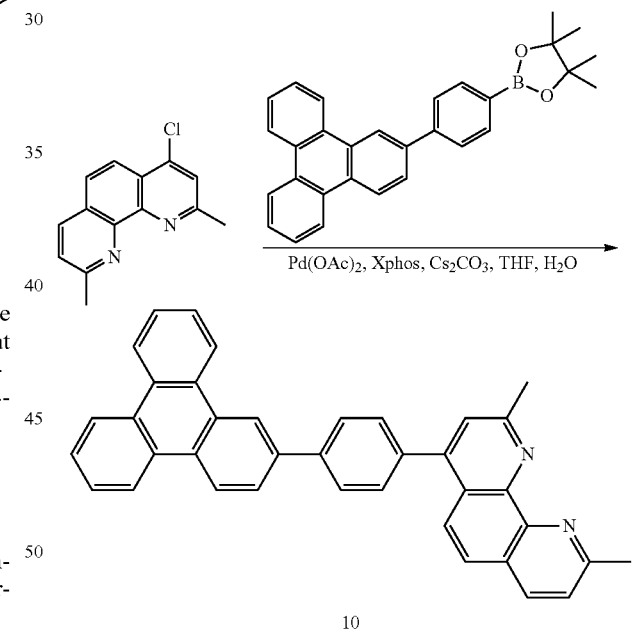

10

7.4 g of Compound 10 (yield 70%) was obtained in a same manner as in the synthesis of Compound 1, except that 4,4,5,5-tetramethyl-2-(3-(triphenylene-2-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 511

(11) Synthesis of Compound 11

Compound 11 according to an embodiment may be synthesized by, for example, steps disclosed in Reaction Formula 11 below.

[Reaction Formula 11]

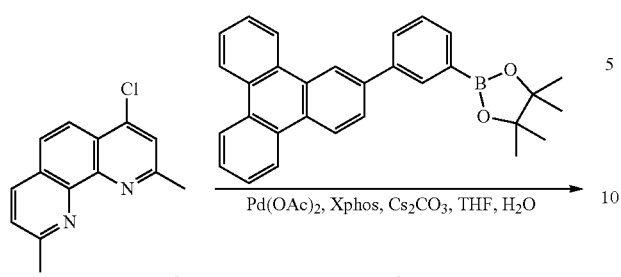

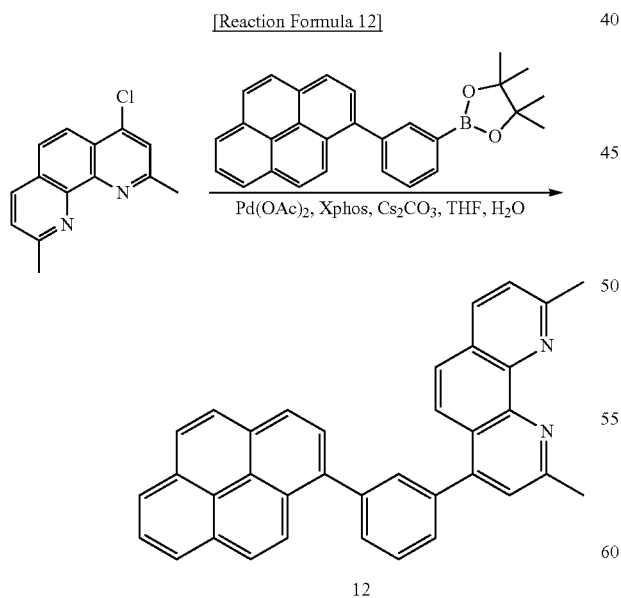

7.4 g of Compound 11 (yield 70%) was obtained in a same manner as in the synthesis of Compound 1, except that 4,4,5,5-tetramethyl-2-(4-(triphenylene-2-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 511

(12) Synthesis of Compound 12

Compound 12 according to an embodiment may be synthesized by, for example, steps disclosed in Reaction Formula 12 below.

[Reaction Formula 12]

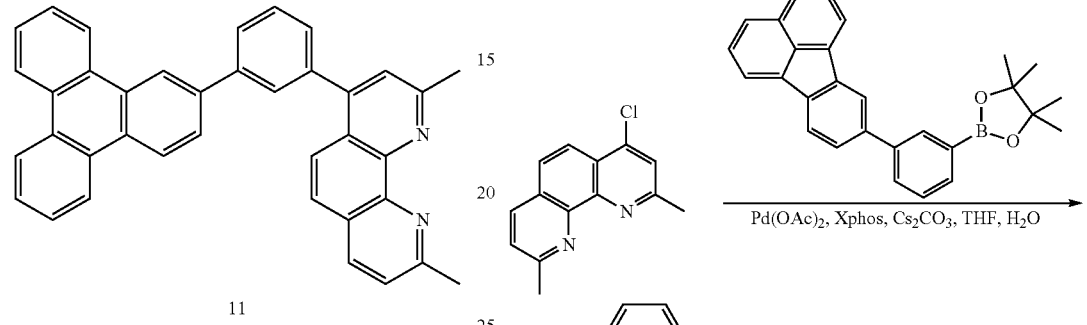

7.0 g of Compound 12 (yield 70%) was obtained in a same manner as in the synthesis of Compound 1, except that 4,4,5,5-tetramethyl-2-(3-(pyrene-1-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 485

(13) Synthesis of Compound 13

Compound 13 according to an embodiment may be synthesized by, for example, steps disclosed in Reaction Formula 13 below.

[Reaction Formula 13]

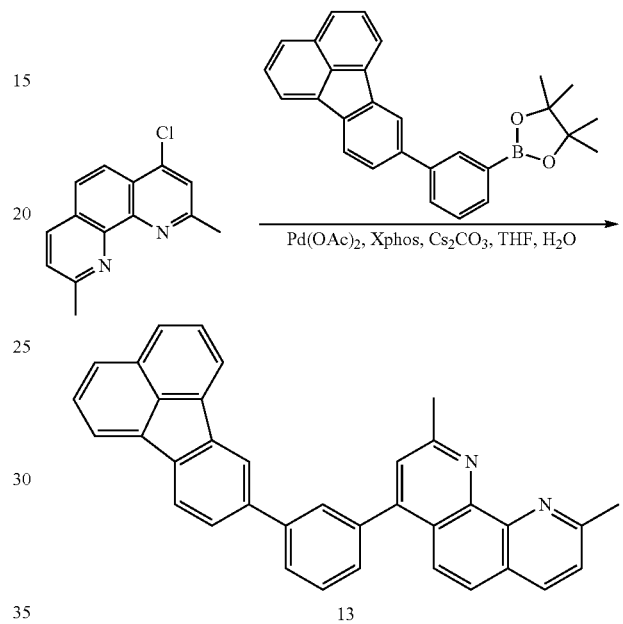

6.8 g of Compound 13 (yield 68%) was obtained in a same manner as in the synthesis of Compound 1, except that 2-(3-(fluoranthene-8-yl)phenyl)-4,4,5,5-tetramethyl-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 485

(14) Synthesis of Compound 14

Compound 14 according to an embodiment may be synthesized by, for example, steps disclosed in Reaction Formula 14 below.

[Reaction Formula 14]

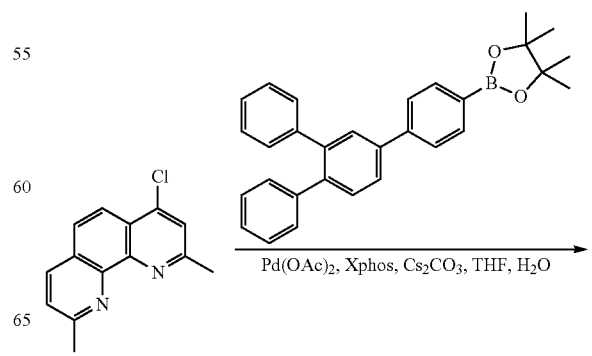

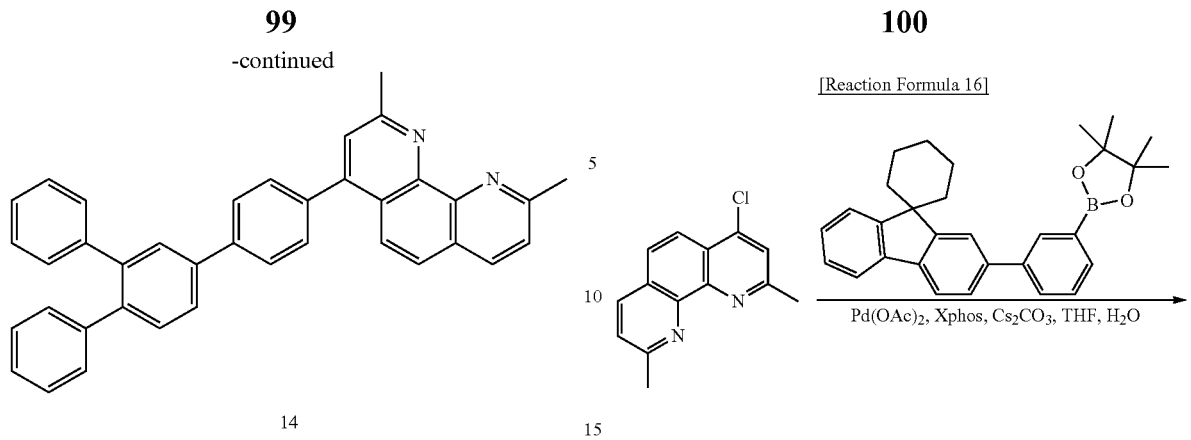

14

7.0 g of Compound 14 (yield 68%) was obtained in a same manner as in the synthesis of Compound 1, except that 4,4,5,5-tetramethyl-2-(4'-phenyl-[1,1': 3',1''-terphenyl]-4-yl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 513

(15) Synthesis of Compound 15

Compound 15 according to an embodiment may be synthesized by, for example, steps disclosed in Reaction Formula 15 below.

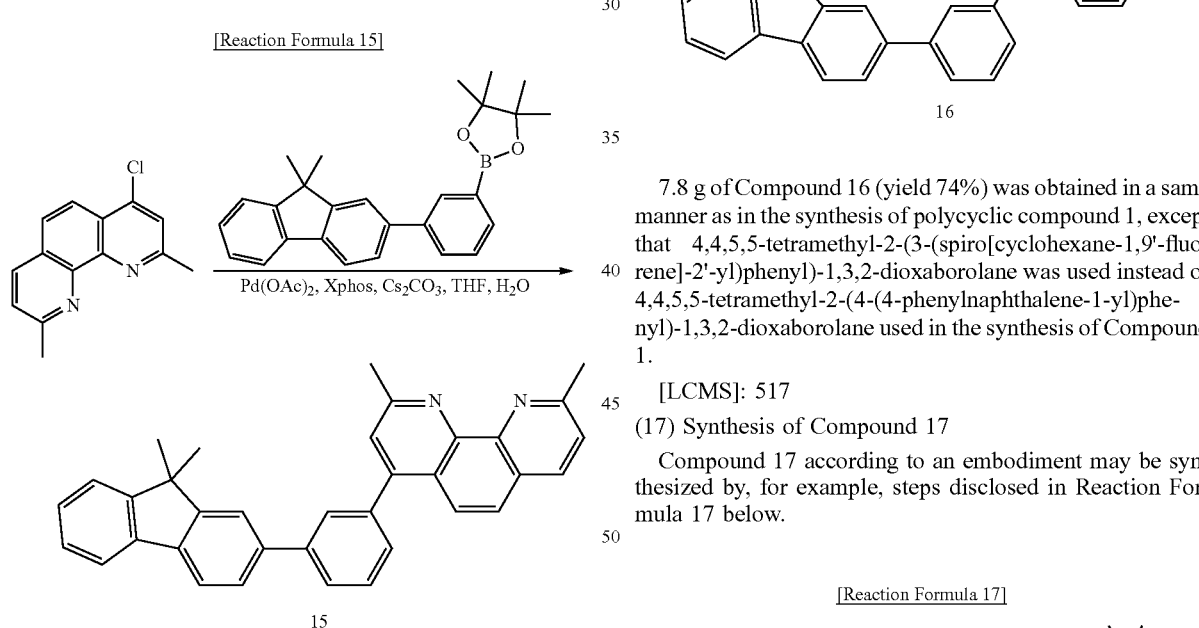

15

7.0 g of Compound 15 (yield 72%) was obtained in a same manner as in the synthesis of polycyclic compound 1, except that 2-(3-(9,9-dimethyl-9H-fluorene-2-yl)phenyl)-4,4,5,5-tetramethyl-1,3,2-dioxaborolane was used instead of 4,4,-tetramethyl-2-(4-(4-phenylnaphthalene-1-yl)phenyl) 5,5-1,3,2-dioxaborolane used in the synthesis of Compound 1.

[LCMS]: 477

(16) Synthesis of Compound 16

Compound 16 according to an embodiment may be synthesized by, for example, steps disclosed in Reaction Formula 16 below.

[Reaction Formula 16]

16

7.8 g of Compound 16 (yield 74%) was obtained in a same manner as in the synthesis of polycyclic compound 1, except that 4,4,5,5-tetramethyl-2-(3-(spiro[cyclohexane-1,9'-fluorene]-2'-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 517

(17) Synthesis of Compound 17

Compound 17 according to an embodiment may be synthesized by, for example, steps disclosed in Reaction Formula 17 below.

[Reaction Formula 17]

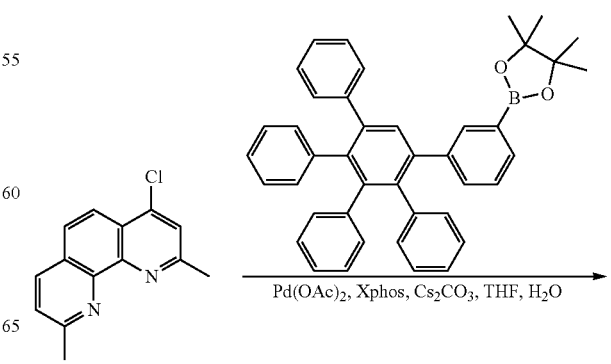

-continued

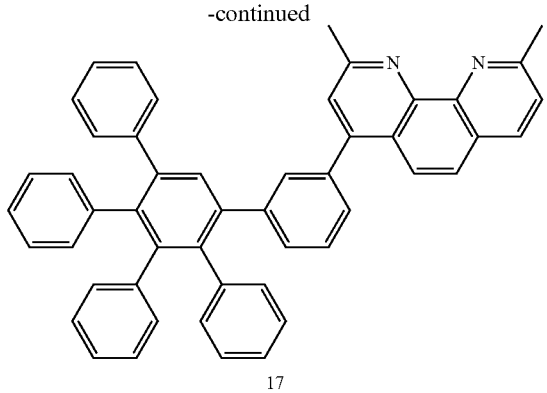

17

9.5 g of Compound 17 (yield 70%) was obtained in a same manner as in the synthesis of Compound 1, except that 4,4,5,5-tetramethyl-2-(3',4',5'-triphenyl-[1,1': 2',1''-terphenyl]-3-yl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 665

(18) Synthesis of Compound 18

Compound 18 according to an embodiment may be synthesized by, for example, steps disclosed in Reaction Formula 18 below.

[Reaction Formula 18]

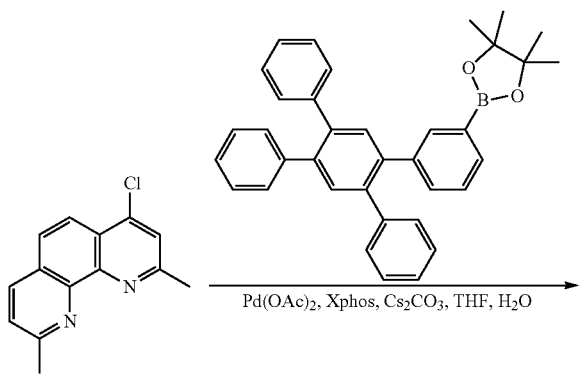

18

8.3 g of Compound 18 (yield 69%) was obtained in a same manner as in the synthesis of polycyclic compound 1, except that 2-(4',5'-diphenyl-[1,1':2',1''-terphenyl]-3-yl)-4,4,5,5-tetramethyl-1,3,2-dioxaborolane was used instead of 4,4,-tetramethyl-2-(4-(4-phenylnaphthalene-1-yl)phenyl) 5,5-1,3,2-dioxaborolane used in the synthesis of Compound 1.

[LCMS]: 589

(19) Synthesis of Compound 19

Compound 19 according to an embodiment may be synthesized by, for example, steps disclosed in Reaction Formula 19 below.

[Reaction Formula 19]

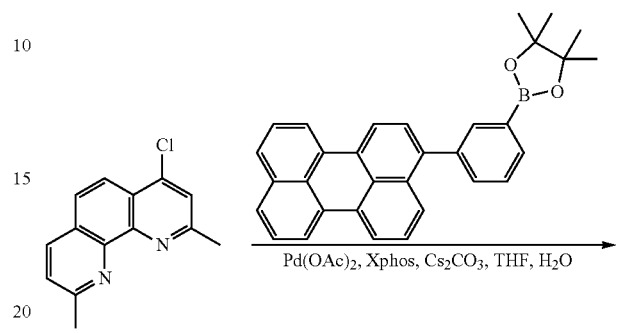

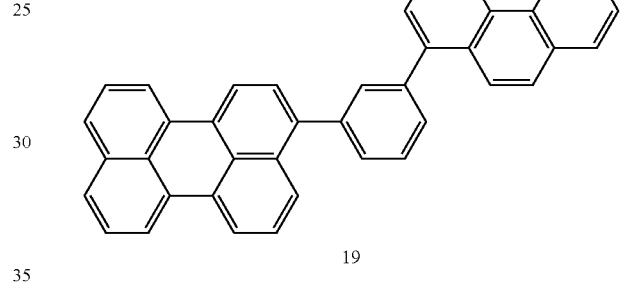

19

7.1 g of Compound 19 (yield 65%) was obtained in a same manner as in the synthesis of Compound 1, except that 4,4,5,5-tetramethyl-2-(3-(perylene-3-yl)phenyl)-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 535

(20) Synthesis of Compound 20

Compound 20 according to an embodiment may be synthesized by, for example, steps disclosed in Reaction Formula 20 below.

[Reaction Formula 20]

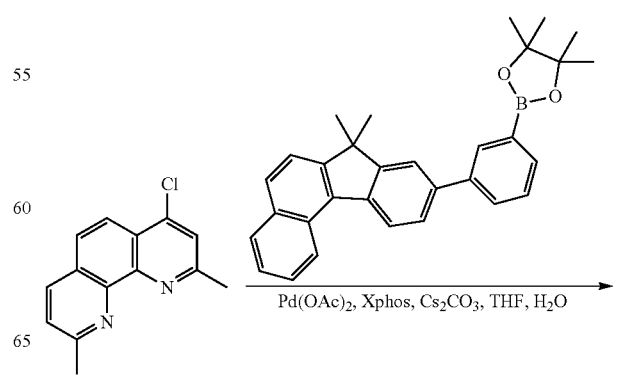

-continued

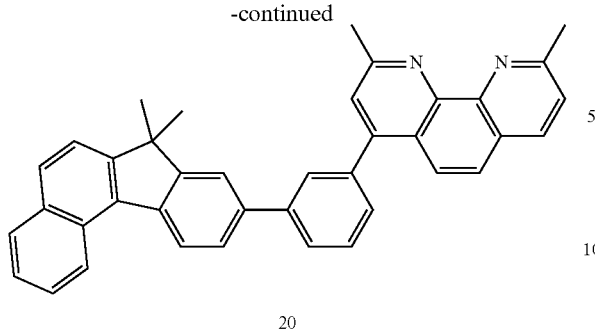

20

7.6 g of Compound 20 (yield 72%) was obtained in a same manner as in the synthesis of Compound 1, except that 2-(3-(7,7-dimethyl-7H-benzo[c]fluorene-9-yl)phenyl)-4,4,5,5-tetramethyl-1,3,2-dioxaborolane was used instead of 4,4,-tetramethyl-2-(4-(4-phenylnaphthalene-1-yl)phenyl) 5,5-1,3,2-dioxaborolane used in the synthesis of Compound 1.

[LCMS]: 527

(21) Synthesis of Compound 21

Compound 21 according to an embodiment may be synthesized by, for example, steps disclosed in Reaction Formula 21 below.

[Reaction Formula 21]

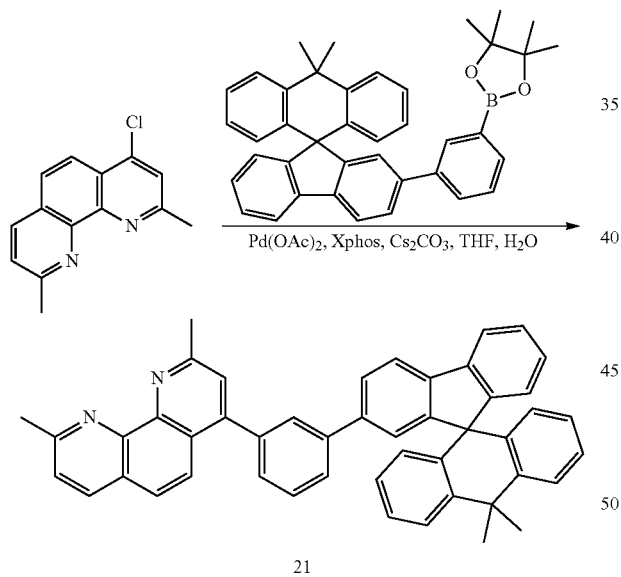

21

8.8 g of Compound 21 (yield 67%) was obtained in a same manner as in the synthesis of Compound 1, except that 2-(3-(7,7-dimethyl-7H-benzo[c]fluorene-9-yl)phenyl)-4,4,5,5-tetramethyl-1,3,2-dioxaborolane was used instead of 4,4,-tetramethyl-2-(4-(4-phenylnaphthalene-1-yl)phenyl) 5,5-1,3,2-dioxaborolane used in the synthesis of Compound 1.

[LCMS]: 641

(22) Synthesis of Compound 22

Compound 22 according to an embodiment may be synthesized by, for example, steps disclosed in Reaction Formula 22 below.

[Reaction Formula 22]

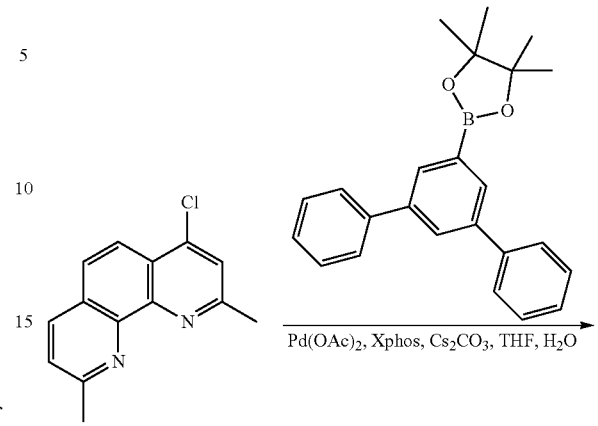

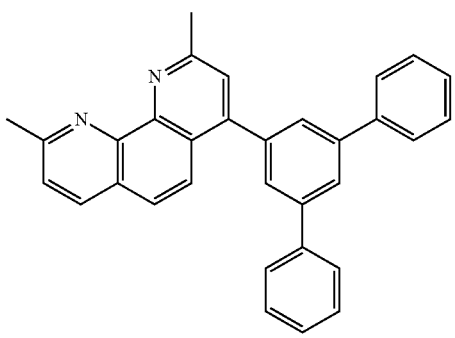

22

6.2 g of Compound 22 (yield 70%) was obtained in a same manner as in the synthesis of Compound 1, except that 2-([1,1':3',1''-terphenyl]-5'-yl)-4,4,5,5-tetramethyl-1,3,2-dioxaborolane was used instead of 4,4,-tetramethyl-2-(4-(-phenylnaphthalene-1-yl)phenyl) 5,5-1,3,2-dioxaborolane used in the synthesis of Compound 1:

[LCMS]: 437

(23) Synthesis of Compound 23

Compound 23 according to an embodiment may be synthesized by, for example, steps disclosed in Reaction Formula 23 below.

[Reaction Formula 23]

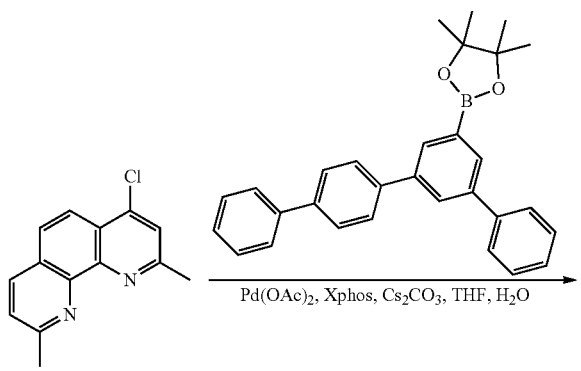

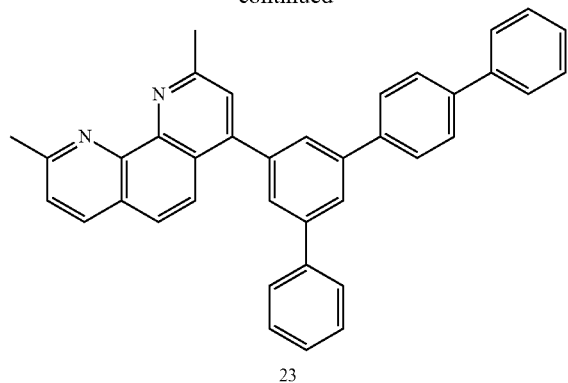

23

7.4 g of Compound 23 (yield 70%) was obtained in a same manner as in the synthesis of Compound 1, except that 2-([1,1': 3',1": 4",1'''-quaterphenyl]-5'-yl)-4,4,5,5-tetramethyl-1,3,2-dioxaborolane was used instead of 4,4,5,5-tetramethyl-2-(4-(4-phenylnaphthalene-1-yl)phenyl)-1,3,2-dioxaborolane used in the synthesis of Compound 1.

[LCMS]: 513

(24) Synthesis of Compound 24

Compound 24 according to an embodiment may be synthesized by, for example, steps disclosed in Reaction Formula 24 below.

2. Production and Evaluation of Light Emitting Elements
(Production of Light Emitting Elements)

A glass substrate thin-film-coated with 150 nm-thick ITO (indium tin oxide) was cleaned with distilled water ultrasonic waves. After the cleaning with distilled water was over, the glass substrate coated with the ITO thin film was ultrasonic wave-cleaned with a solvent such as isopropyl alcohol, acetone, or methanol, and dried to produce a first electrode. HAT-CN was deposited to be 80 nm thick on the first electrode to form a hole injection layer. NPB was deposited to be 15 nm thick on the hole injection layer to form a hole transport layer. ADN and 3% TBP were co-deposited to be 30 nm thick on the hole transport layer to form an emission layer. Alq$_3$ was deposited to be 30 nm thick on the emission layer to form an electron transport region. Any one of Compound 1 to 24 of Examples and Compound A to H of Comparative Examples was deposited to be 15 nm thick on the electron transport region to form a charge generation layer. NPD was deposited to be 15 nm thick on the charge generation layer to form a hole injection layer. NPB was deposited to be 15 nm thick on the hole injection layer to form a hole transport layer. CBP (4,4'-bis (N-carbazolyl)-1,1'-biphenyl) and 10% (piq)$_2$Ir(acac) were co-deposited to be 40 nm thick on the hole transport layer to form an emission layer. Alq$_3$ was deposited to be 30 nm thick on the emission layer to form an electron transport region. LiF was deposited to be 1 nm thick on the electron transport region and aluminum (Al) was deposited to be 200 nm thick to form a second electrode, thereby obtaining a light emitting element.

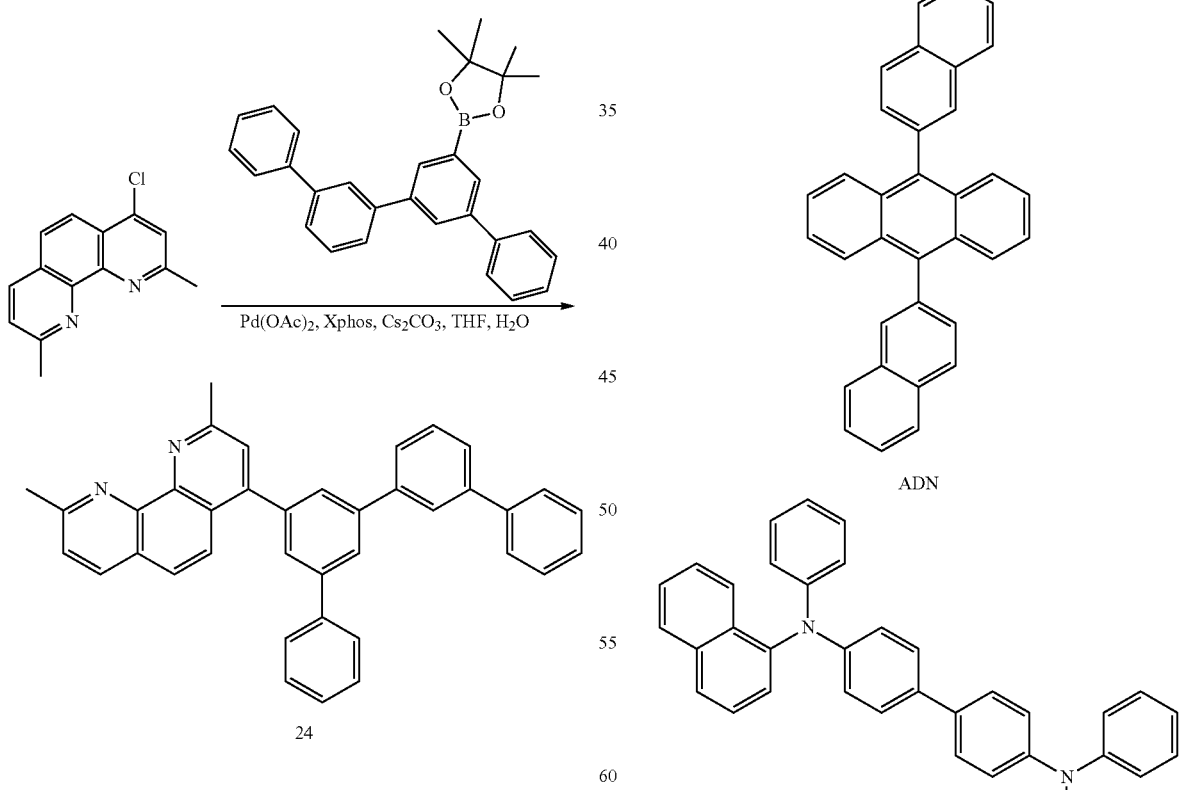

24

6.2 g of Compound 24 (yield 70%) was obtained in a same manner as in the synthesis of Compound 1, except that 2-([1,1': 3',1": 3",1'''-quaterphenyl]-5'-yl)-4,4,5,5-tetramethyl-1,3,2-dioxaborolane was used instead of 4,4,-tetramethyl-2-(4-(4-phenylnaphthalene-1-yl)phenyl) 5,5-1,3,2-dioxaborolane used in the synthesis of Compound 1.

[LCMS]: 513

-continued
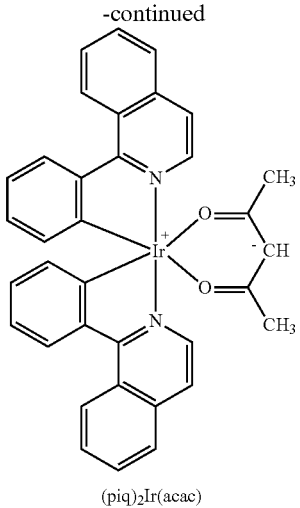
(piq)₂Ir(acac)
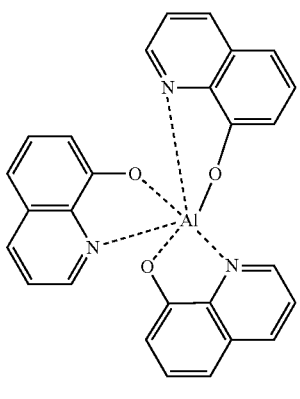
Alq₃
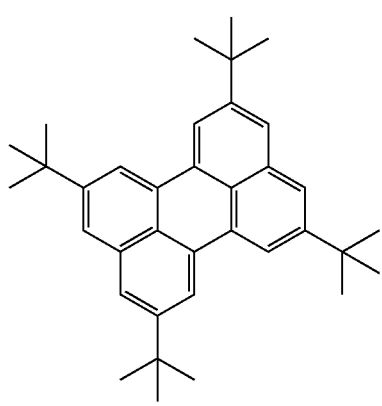
TBP
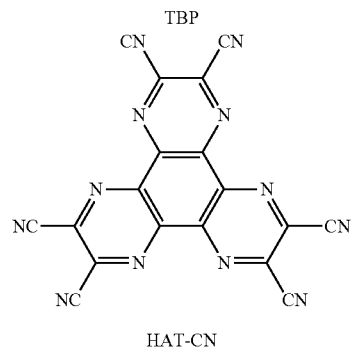
HAT-CN
-continued
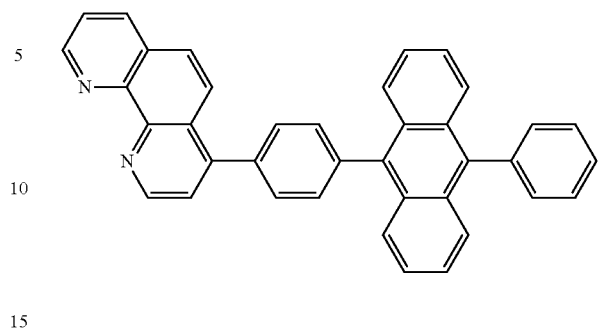
A
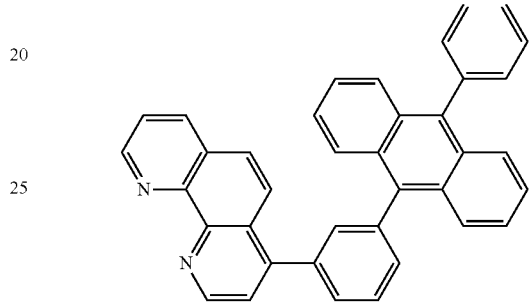
B
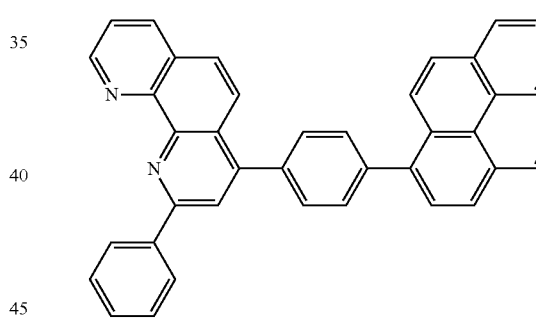
C
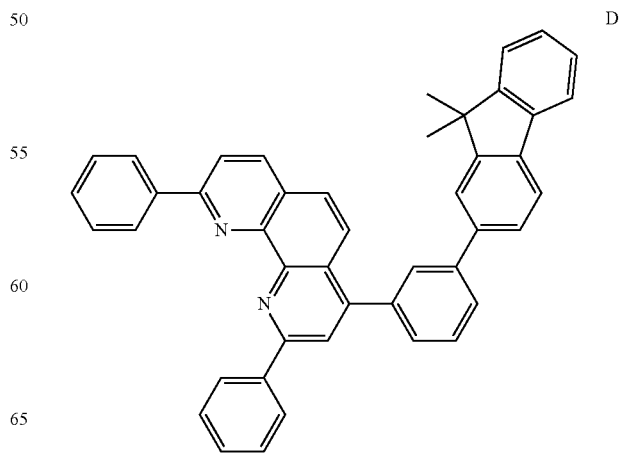
D -continued E
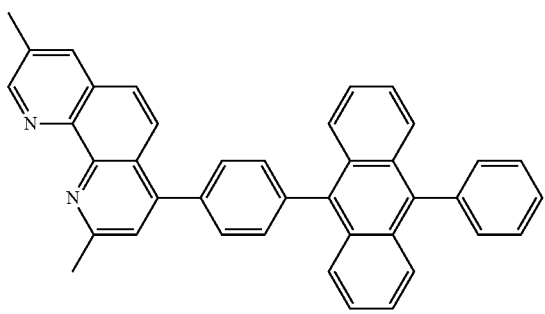

F
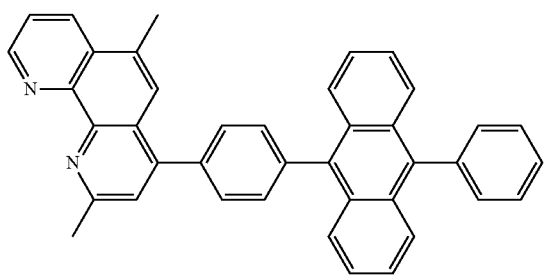

G
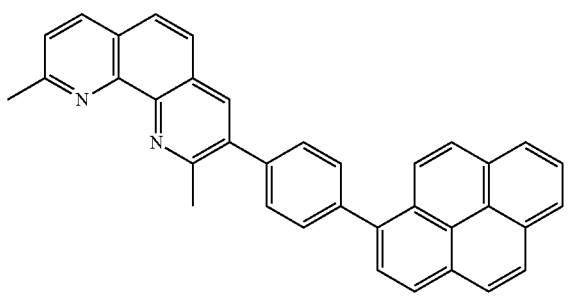

H
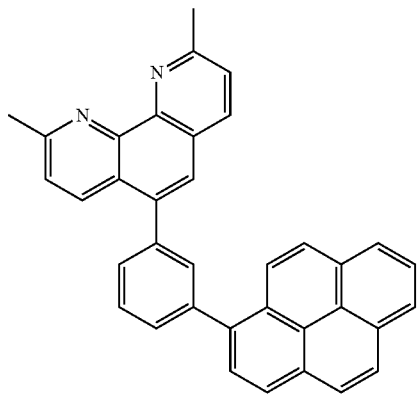

(Evaluation of Light Emitting Element Properties)

For the light emitting elements each including a charge generation layer containing any one of Examples 1 to 24 and Comparative Examples 1 to 8, driving voltage and luminous efficiency at a current density of 10 mA/cm$^2$ were measured, and the results are shown in Table 1 below.

TABLE 1

| Sample | N-type charge generation layer | Driving voltage (V) | Luminous efficiency (cd/A) |
| --- | --- | --- | --- |
| Example 1 | Compound 1 | 8.3 | 15.9 |
| Example 2 | Compound 2 | 8.3 | 15.7 |
| Example 3 | Compound 3 | 8.2 | 15.5 |
| Example 4 | Compound 4 | 8.3 | 15.9 |
| Example 5 | Compound 5 | 8.5 | 15.3 |
| Example 6 | Compound 6 | 8.3 | 15.3 |
| Example 7 | Compound 7 | 8.2 | 15.7 |
| Example 8 | Compound 8 | 8.3 | 15.8 |
| Example 9 | Compound 9 | 8.2 | 15.5 |
| Example 10 | Compound 10 | 8.5 | 15.3 |
| Example 11 | Compound 11 | 8.4 | 15.4 |
| Example 12 | Compound 12 | 8.2 | 15.9 |
| Example 13 | Compound 13 | 8.4 | 15.7 |
| Example 14 | Compound 14 | 8.3 | 15.7 |
| Example 15 | Compound 15 | 8.2 | 15.8 |
| Example 16 | Compound 16 | 8.4 | 15.5 |
| Example 17 | Compound 17 | 8.3 | 15.9 |
| Example 18 | Compound 18 | 8.4 | 15.6 |
| Example 19 | Compound 19 | 8.4 | 15.8 |
| Example 20 | Compound 20 | 8.4 | 15.6 |
| Example 21 | Compound 21 | 8.3 | 15.7 |
| Example 22 | Compound 22 | 8.3 | 15.5 |
| Example 23 | Compound 23 | 8.2 | 15.7 |
| Example 24 | Compound 24 | 8.3 | 15.7 |
| Comparative Example 1 | Compound A | 8.9 | 13.2 |
| Comparative Example 2 | Compound B | 8.9 | 13.3 |
| Comparative Example 3 | Compound C | 8.7 | 13.7 |
| Comparative Example 4 | Compound D | 8.8 | 13.5 |
| Comparative Example 5 | Compound E | 8.6 | 13.9 |
| Comparative Example 6 | Compound F | 8.6 | 13.9 |
| Comparative Example 7 | Compound G | 8.5 | 14.8 |
| Comparative Example 8 | Compound H | 8.5 | 14.7 |

As shown in Table 1 above, it is seen that the light emitting elements using compounds each containing a methyl group-substituted phenanthroline moiety (Examples 1 to 24) in the N-type charge generation layer had improvement in driving voltage and luminous efficiency, as compared to light emitting elements using compounds each containing an unsubstituted phenanthroline moiety (Comparative Examples 1 and 2) in the charge generation layer, and compounds each containing an aryl group-substituted phenanthroline moiety (Comparative Examples 3 and 4) in the charge generation layer. It is seen that the elements of Examples 1 to 24 each including an Example compound containing a phenanthroline moiety in which a methyl group is substituted at positions 2 and 9 of phenanthroline in the charge generation layer had lower driving voltage and higher luminous efficiency than the elements of Comparative Examples 5 to 8 each including a compound containing a phenanthroline moiety in which a methyl group is substituted at another position as a material for the charge generation layer. The element of Comparative Example 5 using a compound containing a phenanthroline moiety in which a methyl group is substituted at positions 2 and 8, and the element of Comparative Example 6 using a compound containing a phenanthroline moiety in which a methyl group is substituted at positions 2 and 6 had slightly increased efficiency as compared to the elements of Comparative Examples 1 to 2 each using a compound containing a phenanthroline moiety in which a methyl group is substituted and the elements of Comparative Examples 3 and 4 each using a compound containing a phenanthroline moiety in which an aryl group is substituted at positions 2 and/or 9, but had less improvement in driving voltage and luminous efficiency than the elements of Examples. Accordingly, it was confirmed that even the compound containing a phenanthroline derivative into which a methyl group was introduced had low driving voltage and high luminous efficiency only when the methyl group was substituted at positions 2 and 9, which are active sites.

With the introduction of the methyl group at positions 2 and 9, the elements of Examples 1 to 24 each using the polycyclic compound of an embodiment containing a phenanthroline moiety in which an aryl group was introduced at position 4 had lower driving voltage and higher luminous efficiency than the elements of Comparative Examples 7 and 8 each using a compound containing phenanthroline in which a methyl group was introduced at positions 2 and 9 and an aryl group was introduced at a position other than position 4 (e.g., position 3 or position 5). Accordingly, it is seen that even with the compound containing a phenanthroline moiety in which a methyl group is substituted at both positions 2 and 9, the driving voltage and luminous efficiency may be further improved when the aryl group is substituted at position 4.

An embodiment includes a charge generation layer disposed between light emitting structures and including a polycyclic compound having a phenanthroline moiety structure in which a substituent having small steric hindrance is substituted, thereby providing a light emitting element with increased luminous efficiency.

A polycyclic compound of an embodiment has a phenanthroline moiety structure in which a substituent having small steric hindrance is substituted, and thus has a high electron density in the core and high electron mobility, thereby increasing the luminous efficiency of a light emitting element including the same in a charge generation layer.

A light emitting element of an embodiment includes a polycyclic compound of an embodiment in a charge generation layer, and may thus exhibit high luminous efficiency.

A polycyclic compound of an embodiment may increase luminous efficiency of a light emitting element including the same.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. A light emitting element comprising:
  a first electrode;
  a second electrode facing the first electrode;
  light emitting structures disposed between the first electrode and the second electrode; and
  a charge generation layer disposed between adjacent ones of the light emitting structures and including a polycyclic compound represented by Formula 1:

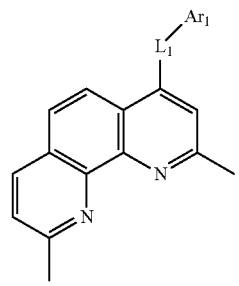

[Formula 1]

wherein in Formula 1,
$L_1$ is a
wherein in Formula 1, $L_1$ is a group represented by Formula 2:

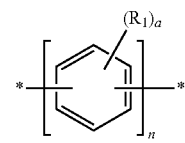

[Formula 2]

wherein in Formula 2,
n is 1 or 2,
a is an integer from 0 to 4,
$R_1$ is a substituted or unsubstituted aryl group having 6 to 60 ring-forming carbon atoms, and
*— represents a binding site to a neighboring atom, and
$Ar_1$ is a substituted or unsubstituted aryl group having 6 to 60 ring-forming carbon atoms, excluding anthracene.

2. The light emitting element of claim 1, wherein in Formula 1, $L_1$ is a substituted or unsubstituted divalent phenyl group, or a substituted or unsubstituted divalent biphenyl group.

3. The light emitting element of claim 1, wherein the group represented by Formula 2 is represented by one of Formulas 2A-1 to 2A-4:

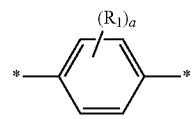

[Formula 2A-1]

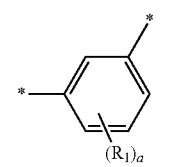

[Formula 2A-2]

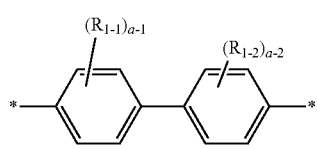

[Formula 2A-3]

[Formula 2A-4]

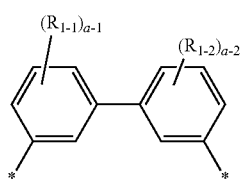

wherein in Formulas 2A-3 and 2A-4, a-1 and a-2 are each independently an integer from 0 to 4, and $R_{1-1}$ and $R_{1-2}$ are each independently a substituted or unsubstituted aryl group having 6 to 60 ring-forming carbon atoms, wherein in Formulas 2A-1 and 2A-2, $R_1$ and a are each the same as defined in connection with Formula 2, and wherein in Formulas 2A-1 to 2A-4,

*— is the same as defined in connection with Formula 2.

4. The light emitting element of claim 1, wherein in Formula 1, $Ar_1$ is a substituted or unsubstituted phenyl group, a substituted or unsubstituted naphthyl group, a substituted or unsubstituted perylene group, a substituted or unsubstituted triphenylene group, a substituted or unsubstituted fluoranthene group, a substituted or unsubstituted benzo[C]fluorene group, or a substituted or unsubstituted pyrene group.

5. The light emitting element of claim 1, wherein in Formula 1, $Ar_1$ is a group represented by Formula 3:

[Formula 3]

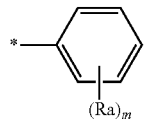

wherein in Formula 3, m is an integer from 0 to 5,

Ra is a substituted or unsubstituted alkyl group having 1 to 20 carbon atoms, a substituted or unsubstituted alkenyl group having 2 to 20 carbon atoms, a substituted or unsubstituted phosphine oxide group, a substituted or unsubstituted aryl group having 6 to 16 carbon atoms, or is bonded to an adjacent group to form a ring,

*— represents a binding site to a neighboring atom, and the group represented by Formula 3 is not anthracene.

6. The light emitting element of claim 1, wherein in Formula 1, $Ar_1$ is a group represented by one selected from Formulas S1 to S19:

S1

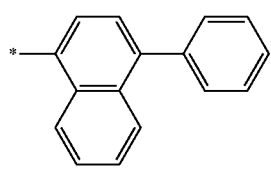

S2

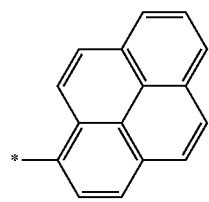

S3

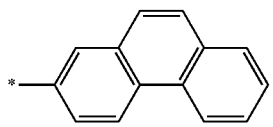

S4

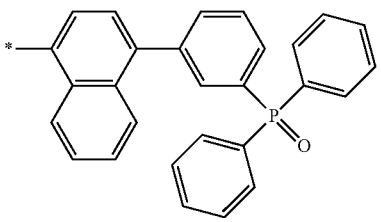

S5

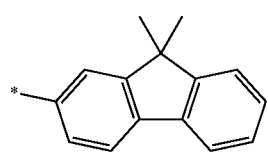

S6

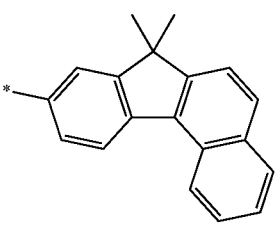

S7

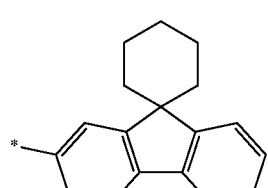

S8

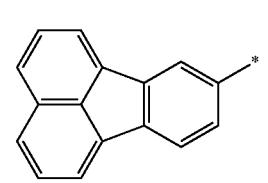

S9

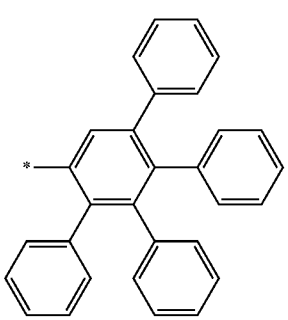

S10 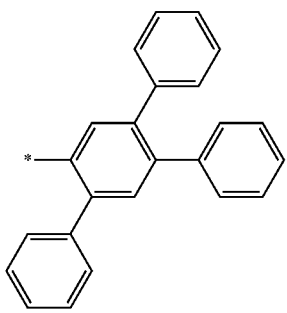

S11 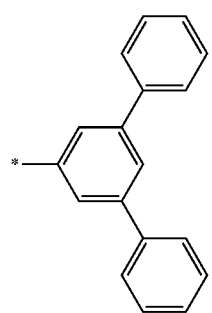

S12 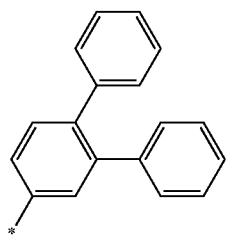

S13 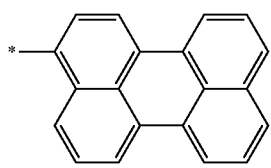

S14 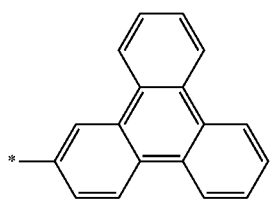

S15 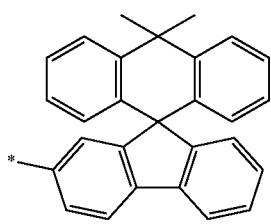

S16 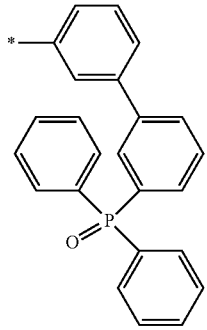

S17 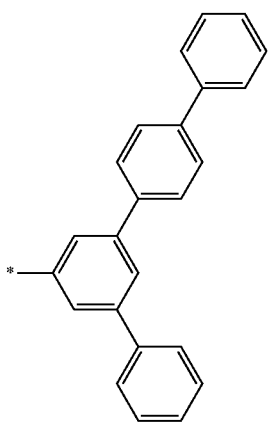

S18 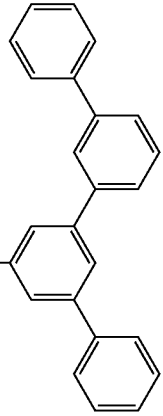

S19 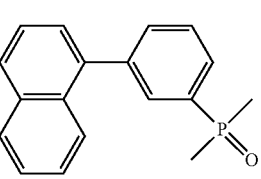

wherein in Formulas SI to S19,
*— represents a binding site to a neighboring atom.

7. The light emitting element of claim 1, wherein the charge generation layer comprises:
   an n-type charge generation layer; and
   a p-type charge generation layer disposed on the n-type charge generation layer, and
   the n-type charge generation layer includes the polycyclic compound.

8. The light emitting element of claim 7, wherein the n-type charge generation layer comprises a dopant and a host, and
   the host includes the polycyclic compound.

9. The light emitting element of claim 1, wherein each of the light emitting structures comprises:
   a hole transport region;
   an emission layer disposed on the hole transport region; and
   an electron transport region disposed on the emission layer.

10. The light emitting element of claim 1, wherein at least one of the light emitting structures comprises an emission layer emitting blue light.

11. The light emitting element of claim 10, wherein the emission layer emitting blue light includes 4,4'-bis(N-carbazolyl)-1,1-biphenyl.

12. The light emitting element of claim 1, wherein the charge generation layer comprises at least one polycyclic compound selected from Compound Group 1:

[Compound Group 1]

1

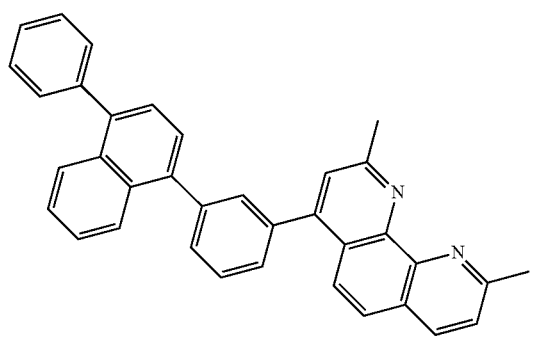

2

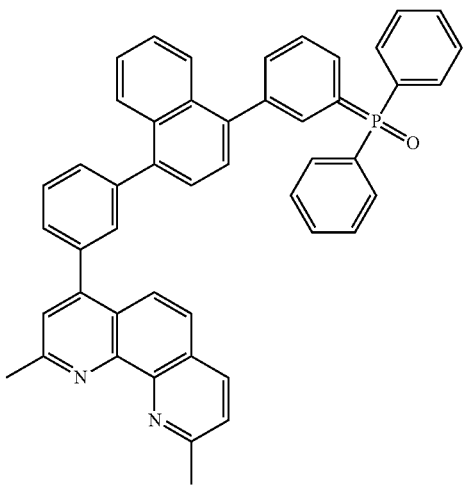

3

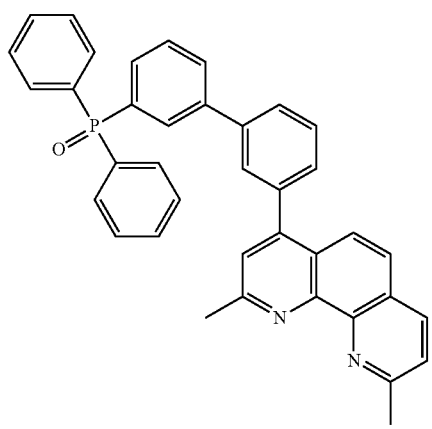

4

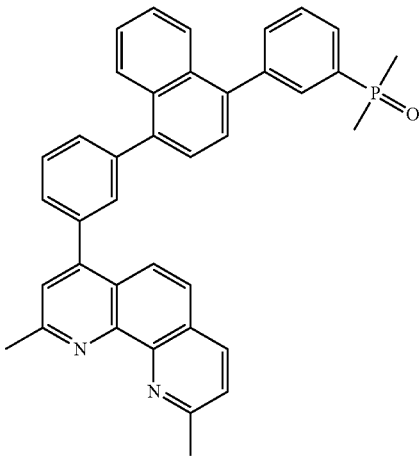

5

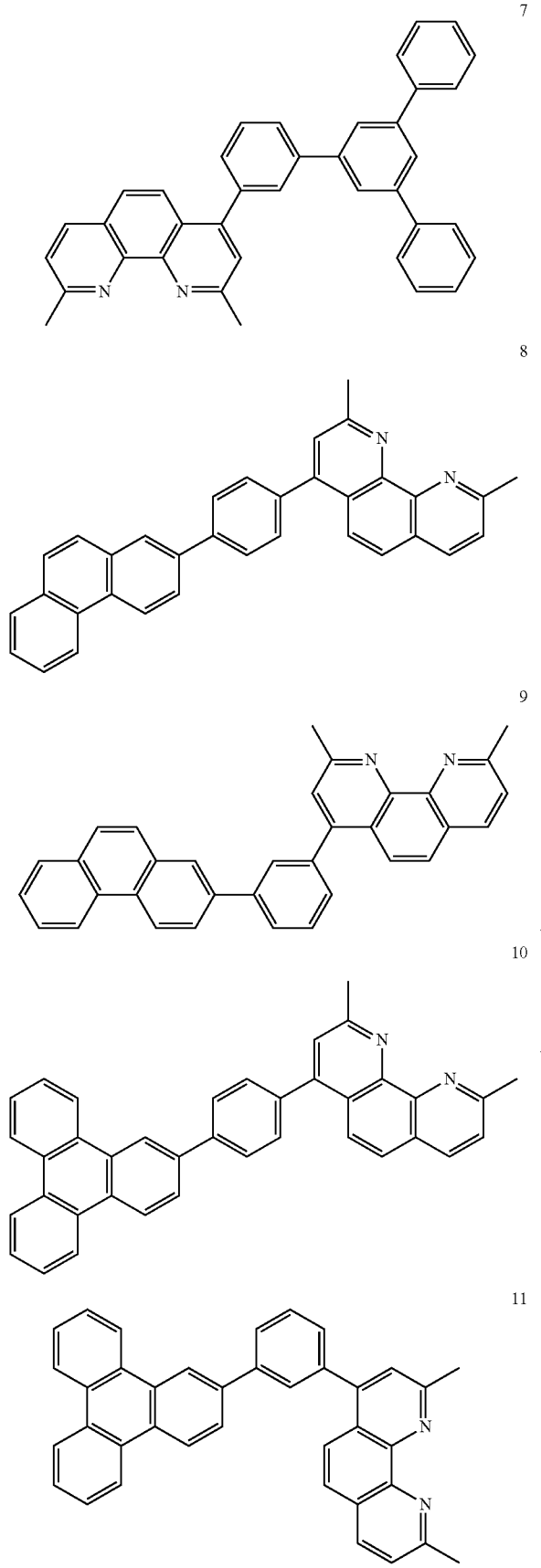

121
-continued
15
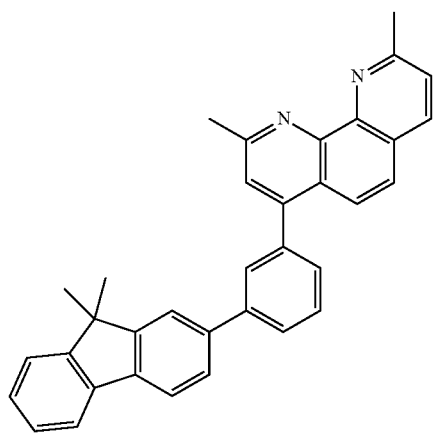
16
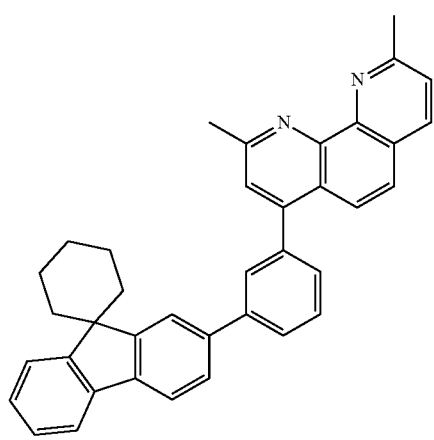
17
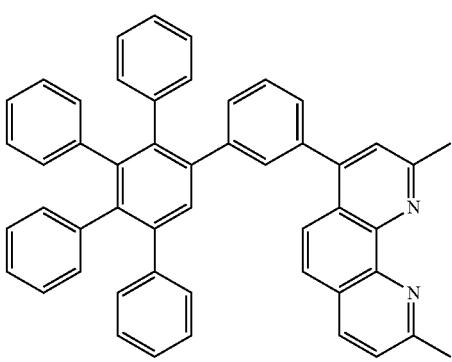
122
-continued
18
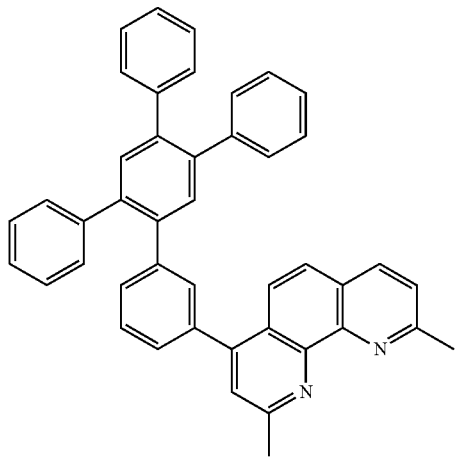
19
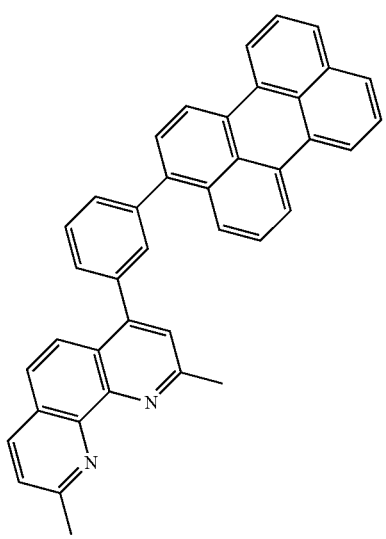
20
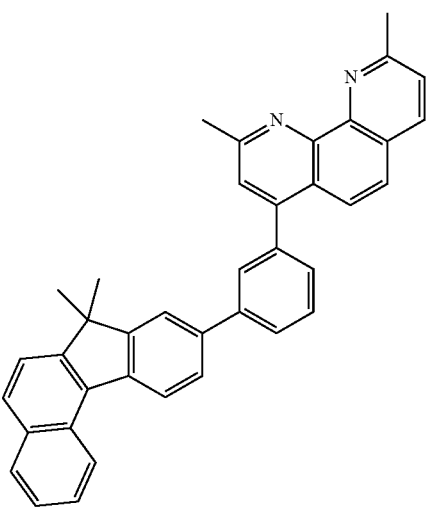

21

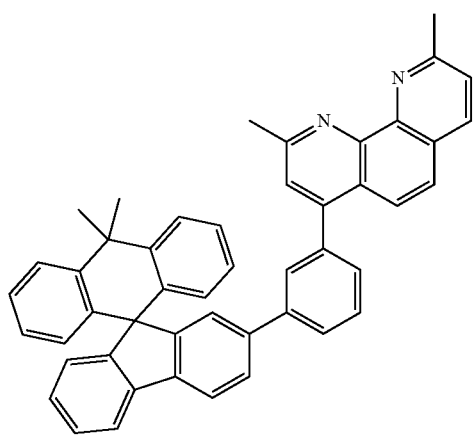

22

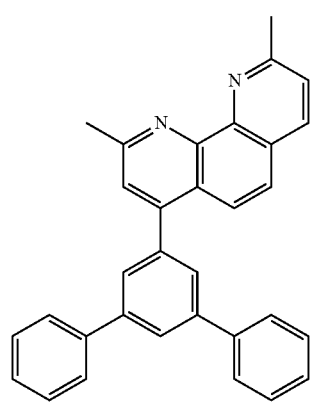

23

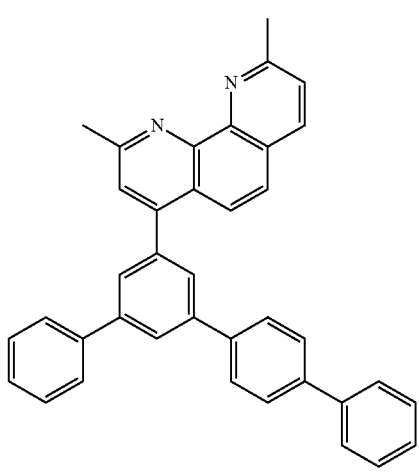

24

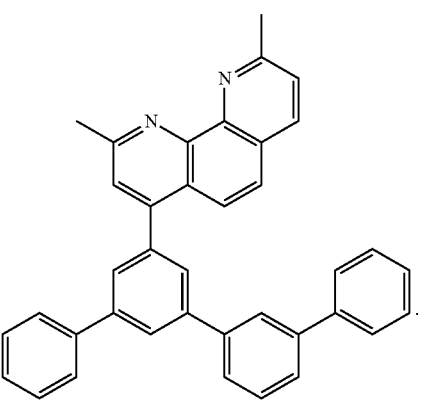

13. A polycyclic compound represented by Formula 1:

[Formula 1]

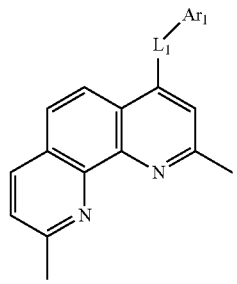

wherein in Formula 1, wherein in Formula 1, $L_1$ is a group represented by Formula 2;

[Formula 2]

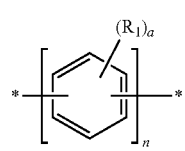

wherein in Formula 2, n is 1 or 2, a is an integer from 0 to 4, $R_1$ is a substituted or unsubstituted aryl group having 6 to 60 ring-forming carbon atoms, and

*— represents a binding site to a neighboring atom, and $Ar_1$ is a substituted or unsubstituted aryl group having 6 to 60 ring-forming carbon atoms, excluding anthracene.

14. The polycyclic compound of claim 13, wherein in Formula 1, $L_1$ is a substituted or unsubstituted divalent phenyl group, or a substituted or unsubstituted divalent biphenyl group.

15. The polycyclic compound of claim 13, wherein the group represented by Formula 2 is represented by one of Formulas 2A-1 to 2A-4:

[Formula 2A-1]

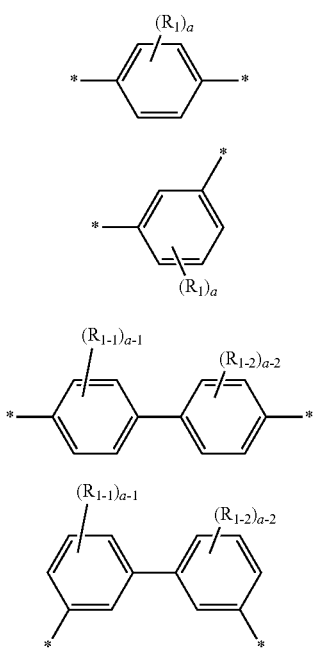

[Formula 2A-2]

[Formula 2A-3]

[Formula 2A-4]

wherein in Formulas 2A-3 and 2A-4,
a-1 and a-2 are each independently an integer from 0 to 4, and
$R_{1-1}$ and $R_{1-2}$ are each independently a substituted or unsubstituted aryl group having 6 to 60 ring-forming carbon atoms,
wherein in Formulas 2A-1 and 2A-2,
$R_1$ and a are each the same as defined in connection with Formula 2, and
wherein in Formulas 2A-1 to 2A-4,
*— is the same as defined in connection with Formula 2.

16. The polycyclic compound of claim 13, wherein in Formula 1, $Ar_1$ is a substituted or unsubstituted phenyl group, a substituted or unsubstituted naphthyl group, a substituted or unsubstituted perylene group, a substituted or unsubstituted triphenylene group, a substituted or unsubstituted fluoranthene group, a substituted or unsubstituted benzo[C]fluorene group, or a substituted or unsubstituted pyrene group.

17. The polycyclic compound of claim 13, wherein in Formula 1, $Ar_1$ is a group represented by Formula 3:

[Formula 3]

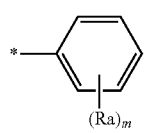

wherein in Formula 3,
m is an integer from 0 to 5,
Ra is a substituted or unsubstituted alkyl group having 1 to 20 carbon atoms, an alkylene group having 2 to 20 carbon atoms, a substituted or unsubstituted phosphine oxide group, a substituted or unsubstituted aryl group having 6 to 16 carbon atoms, or is bonded to an adjacent group to form a ring,
*— represents a binding site to a neighboring atom, and
the group represented by Formula 3 is not anthracene.

18. The polycyclic compound of claim 13, wherein in Formula 1, $Ar_1$ is a group represented by one selected from Formulas S1 to S19:

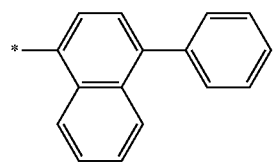
S1

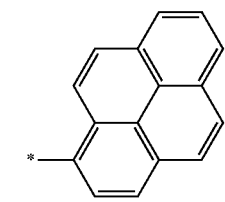
S2

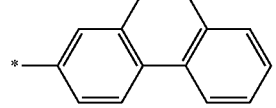
S3

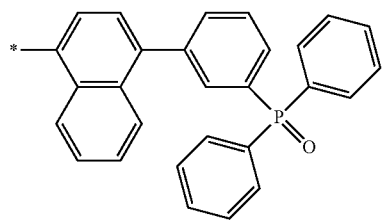
S4

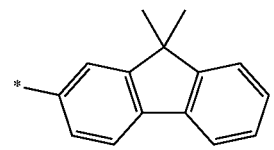
S5

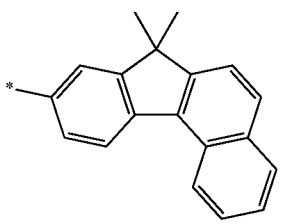
S6

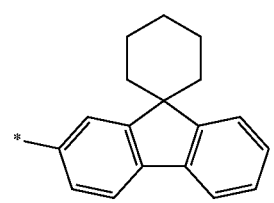
S7

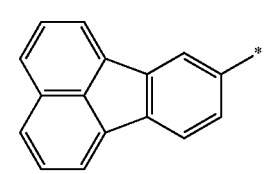
S8

-continued
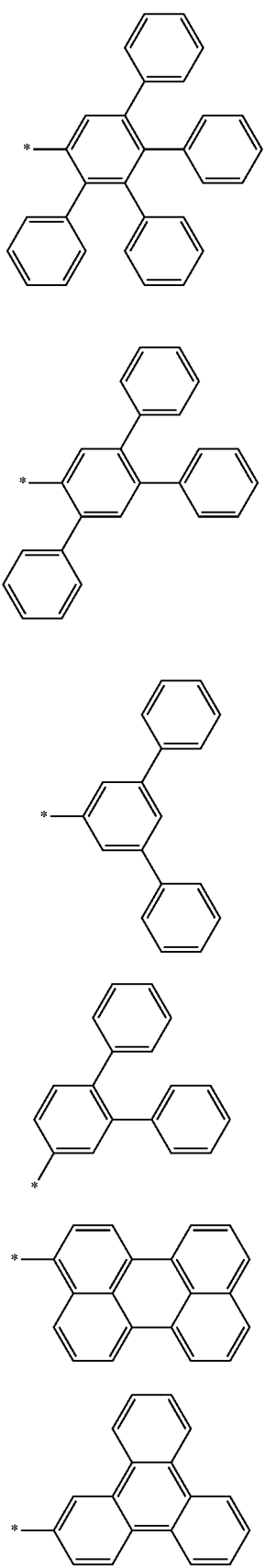
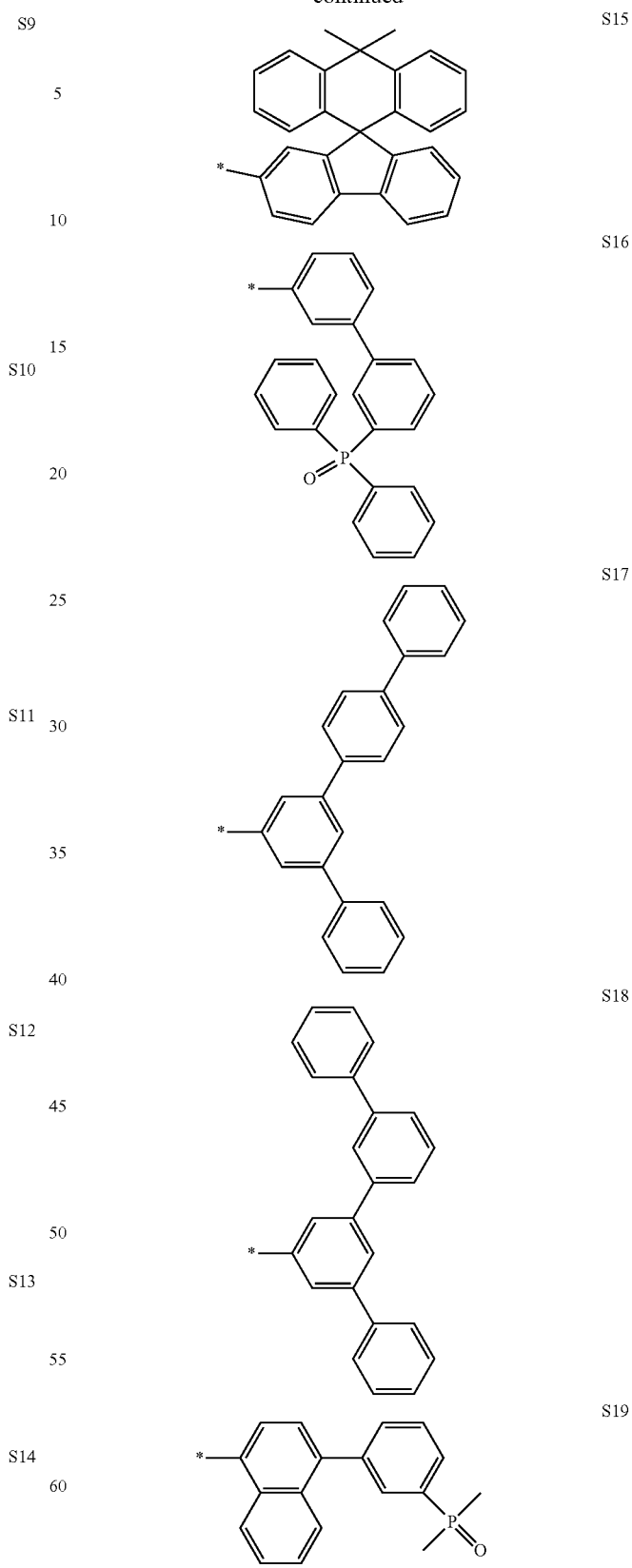
wherein in Formulas SI to S19,
*— represents a binding site to a neighboring atom.

19. The polycyclic compound of claim 13, wherein the polycyclic compound represented by Formula 1 is one selected from Compound Group 1:
[Compound Group 1]
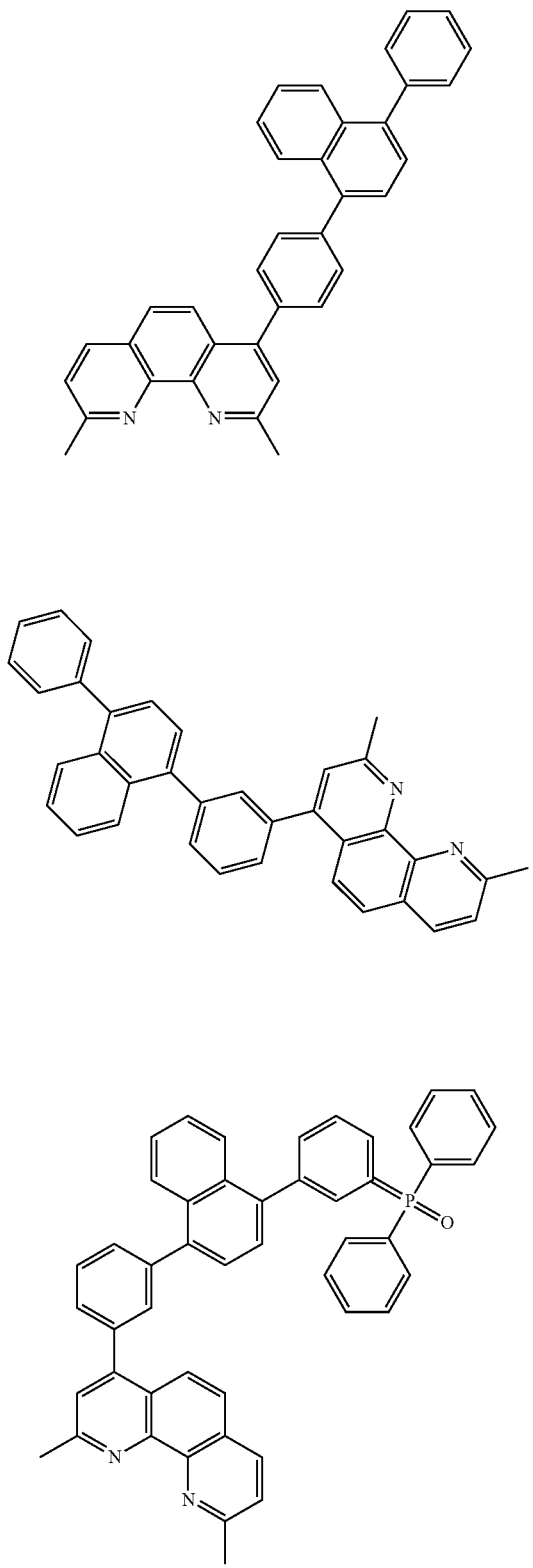

-continued
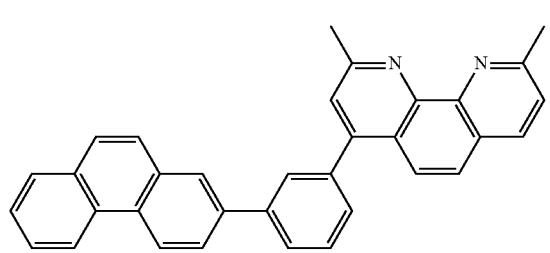
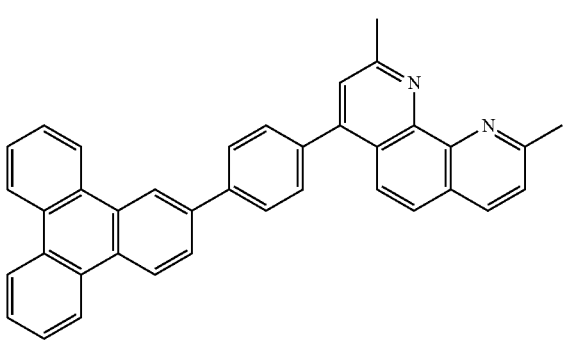
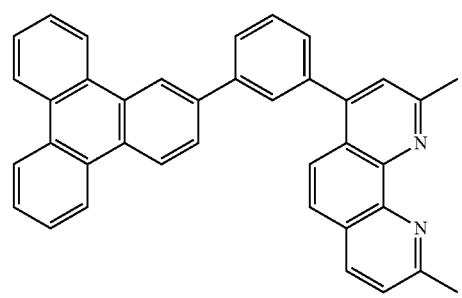
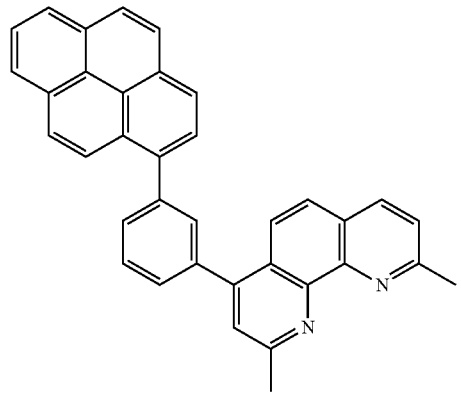
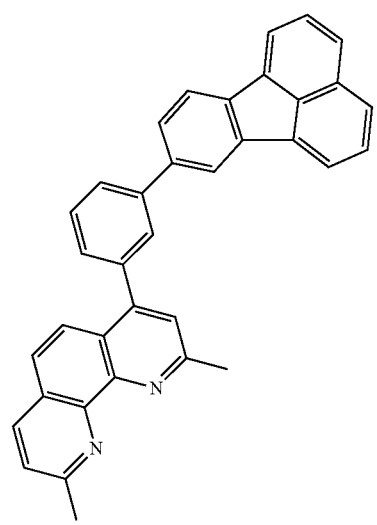
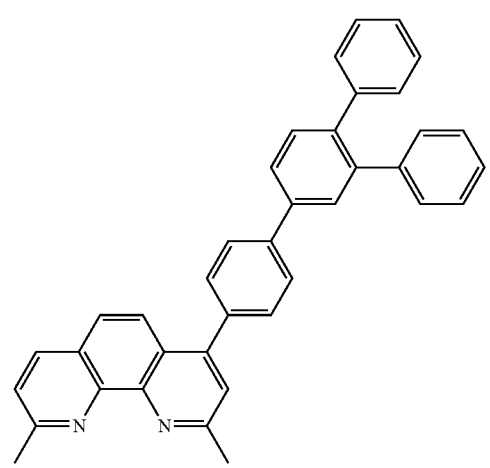

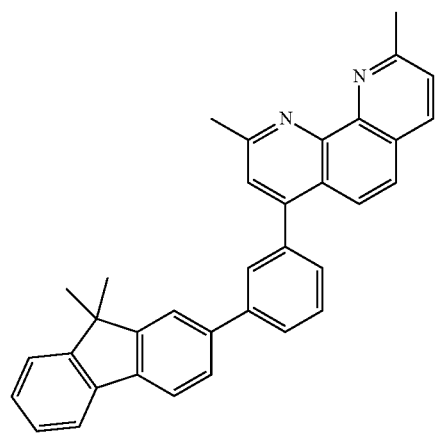
15
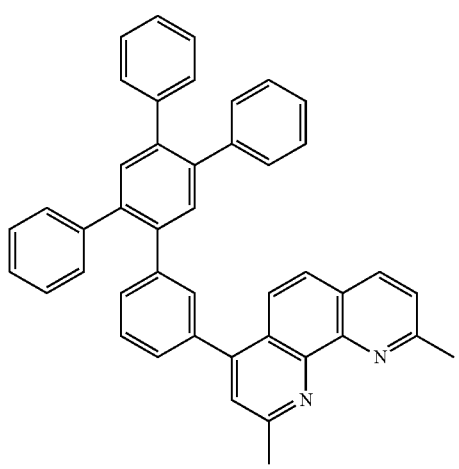
18
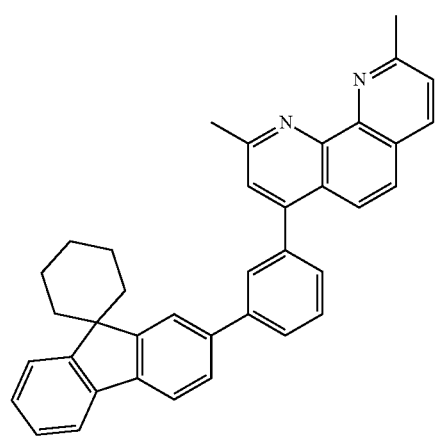
16
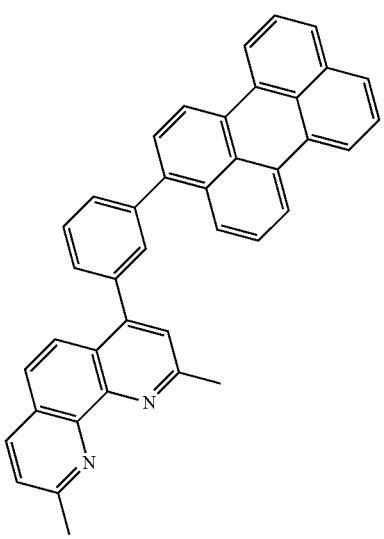
19
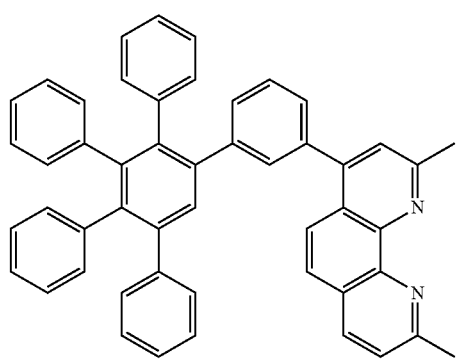
17
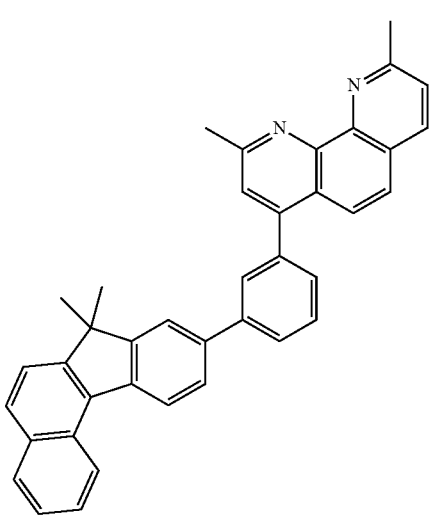
20

-continued
21
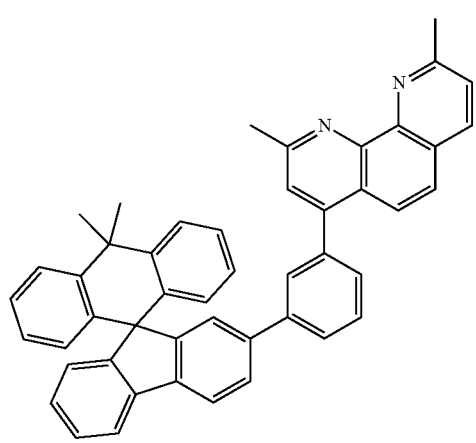
23
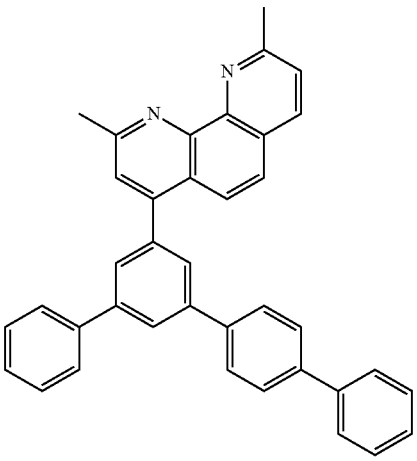
22
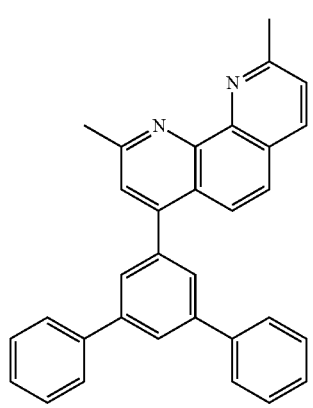
24
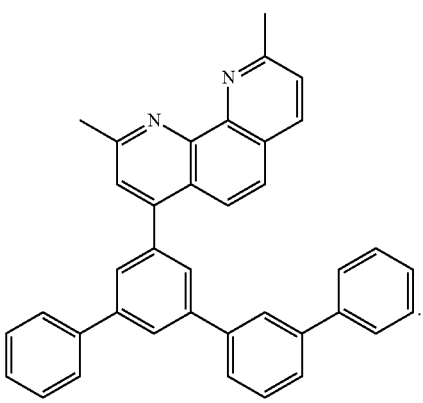
* * * * *